(12) United States Patent
Cheng et al.

(10) Patent No.: US 12,142,533 B2
(45) Date of Patent: Nov. 12, 2024

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Chao-Ching Cheng, Hsinchu (TW); I-Sheng Chen, Hsinchu (TW); Hung-Li Chiang, Hsinchu (TW); Tzu-Chiang Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/230,975

(22) Filed: Aug. 7, 2023

(65) Prior Publication Data
US 2023/0377984 A1     Nov. 23, 2023

Related U.S. Application Data

(60) Continuation of application No. 17/141,117, filed on Jan. 4, 2021, now Pat. No. 11,823,957, which is a
(Continued)

(51) Int. Cl.
*H01L 21/8238*     (2006.01)
*H01L 21/02*     (2006.01)
(Continued)

(52) U.S. Cl.
CPC ........ *H01L 21/823807* (2013.01); *H01L 21/02236* (2013.01); *H01L 21/02255* (2013.01);
(Continued)

(58) Field of Classification Search
CPC .............. H01L 27/092; H01L 29/0673; H01L 29/42392; H01L 29/66545; H01L 29/78684; H01L 29/78696
See application file for complete search history.

(56) References Cited

U.S. PATENT DOCUMENTS 9,236,267 B2     1/2016     De et al.
9,502,265 B1     11/2016     Jiang et al.
(Continued)

FOREIGN PATENT DOCUMENTS

TW     201743452 A     12/2017
TW     201803028 A     1/2018

OTHER PUBLICATIONS

Non-final Office Action issued in U.S. Appl. No. 16/427,802, dated May 6, 2020.
(Continued)

*Primary Examiner* — Peniel M Gumedzoe
(74) *Attorney, Agent, or Firm* — STUDEBAKER & BRACKETT PC

(57) ABSTRACT

In a method of manufacturing a semiconductor device, a fin structure, in which first semiconductor layers containing Ge and second semiconductor layers are alternately stacked, is formed over a bottom fin structure. A Ge concentration in the first semiconductor layers is increased. A sacrificial gate structure is formed over the fin structure. A source/drain epitaxial layer is formed over a source/drain region of the fin structure. The sacrificial gate structure is removed. The second semiconductor layers in a channel region are removed, thereby releasing the first semiconductor layers in which the Ge concentration is increased. A gate structure is formed around the first semiconductor layers in which the Ge concentration is increased.

20 Claims, 57 Drawing Sheets

Related U.S. Application Data division of application No. 16/427,802, filed on May 31, 2019, now Pat. No. 10,886,182.

(60) Provisional application No. 62/712,898, filed on Jul. 31, 2018.

(51) Int. Cl.
| | |
|---|---|
| *H01L 21/311* | (2006.01) |
| *H01L 27/092* | (2006.01) |
| *H01L 29/06* | (2006.01) |
| *H01L 29/423* | (2006.01) |
| *H01L 29/66* | (2006.01) |
| *H01L 29/786* | (2006.01) |

(52) U.S. Cl.
CPC .. *H01L 21/02532* (2013.01); *H01L 21/02603* (2013.01); *H01L 21/31111* (2013.01); *H01L 27/092* (2013.01); *H01L 29/0673* (2013.01); *H01L 29/42392* (2013.01); *H01L 29/66545* (2013.01); *H01L 29/78684* (2013.01); *H01L 29/78696* (2013.01)

(56) References Cited

U.S. PATENT DOCUMENTS

| | | | |
|---|---|---|---|
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,627,540 | B1 | 4/2017 | Chen et al. |
| 9,786,774 | B2 | 10/2017 | Colinge et al. |
| 9,853,101 | B2 | 12/2017 | Peng et al. |
| 9,881,993 | B2 | 1/2018 | Ching et al. |
| 2011/0070734 | A1 | 3/2011 | Saracco et al. |
| 2014/0209855 | A1 | 7/2014 | Cea et al. |
| 2015/0034899 | A1 | 2/2015 | Ching et al. |
| 2015/0053928 | A1 | 2/2015 | Ching et al. |
| 2017/0077232 | A1 | 3/2017 | Balakrishnan et al. |
| 2017/0104061 | A1 | 4/2017 | Peng et al. |
| 2017/0155001 | A1* | 6/2017 | Chen ................ H01L 29/78618 |
| 2017/0200738 | A1* | 7/2017 | Kim ................ H01L 29/66439 |

OTHER PUBLICATIONS

Notice of Allowance issued in U.S. Appl. No. 16/427,802, dated Aug. 21, 2020.

Notice of Allowance issued in U.S. Appl. No. 17/141,117, dated Jul. 12, 2023.

Non-Final Office Action issued in U.S. Appl. No. 17/141,117, dated Mar. 16, 2023.

* cited by examiner

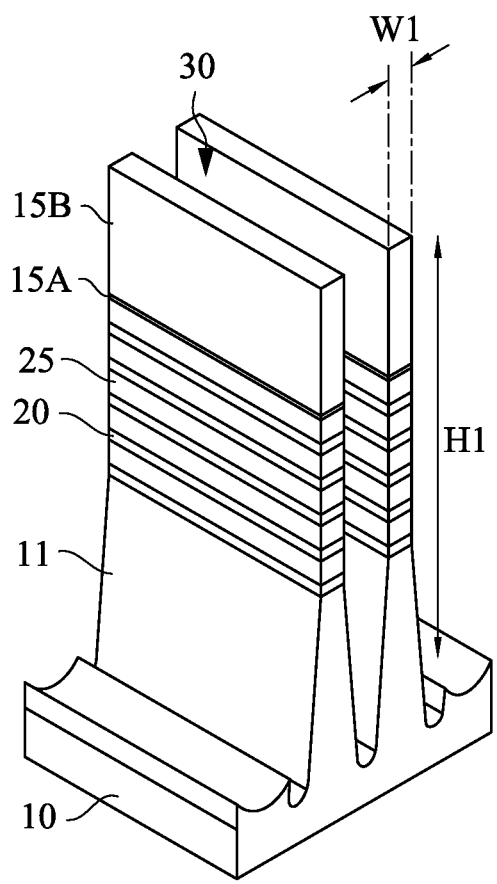
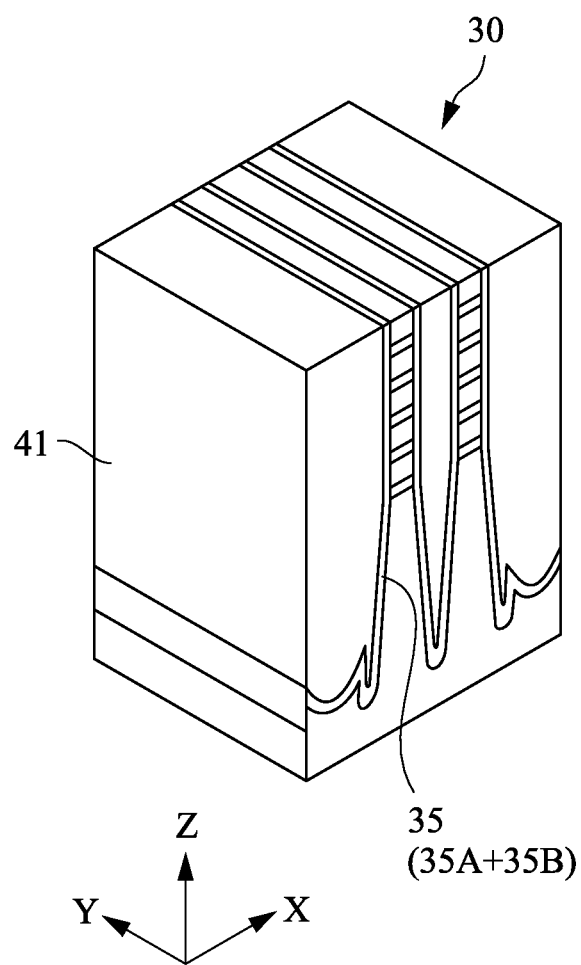
FIG. 3
FIG. 4

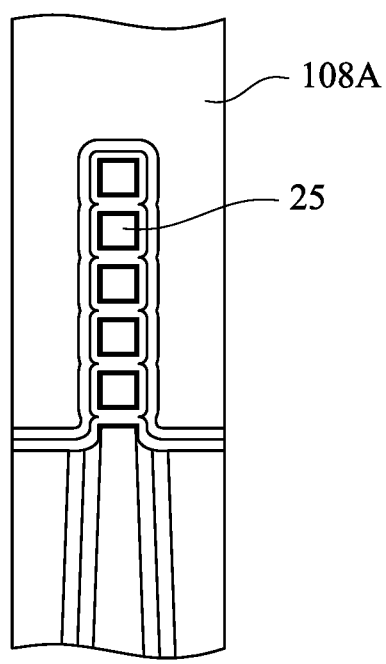
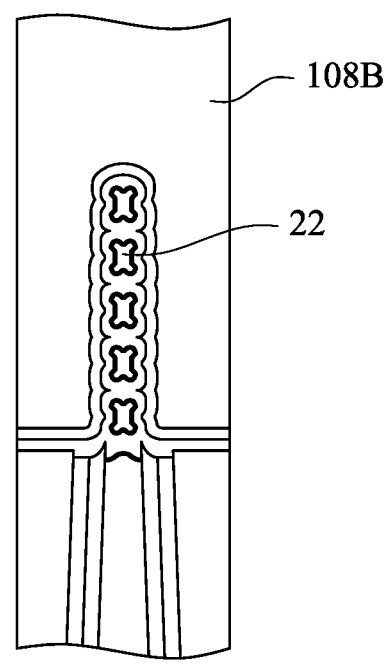
FIG. 34A
FIG. 34B
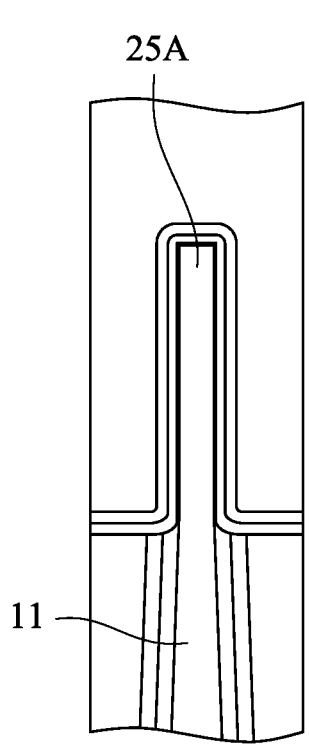
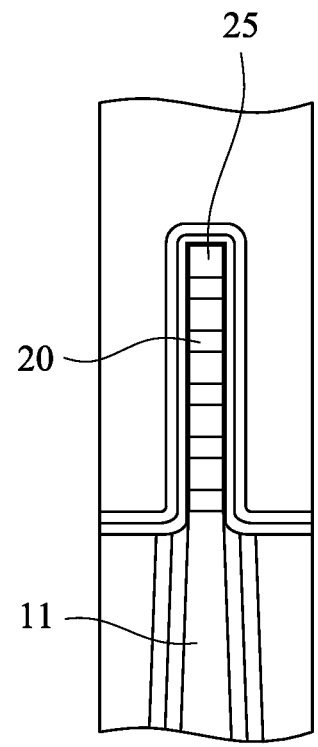
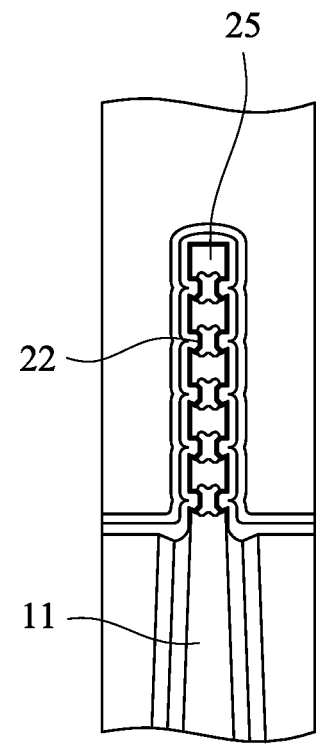
FIG. 34C
FIG. 34D
FIG. 34E

METHOD OF MANUFACTURING A SEMICONDUCTOR DEVICE AND A SEMICONDUCTOR DEVICE

RELATED APPLICATIONS

This application is a continuation of U.S. patent application Ser. No. 17/141,117 filed on Jan. 4, 2021, which is a divisional of U.S. patent application Ser. No. 16/427,802 filed on May 31, 2019, now U.S. Pat. No. 10,886,182, which claims priority of U.S. Provisional Patent Application No. 62/712,898 filed on Jul. 31, 2018, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 shows a view of one of the various stages of a sequential manufacturing process for a GAA FET device according to an embodiment of the present disclosure.

FIG. 4 shows a view of one of the various stages of a sequential manufacturing process for a GAA FET device according to an embodiment of the present disclosure.

FIGS. 34A, 34B, 34C, 34D and 34E show various views of a GAA FET device according to embodiments of the present disclosure.

DETAILED DESCRIPTION

Figure 1:
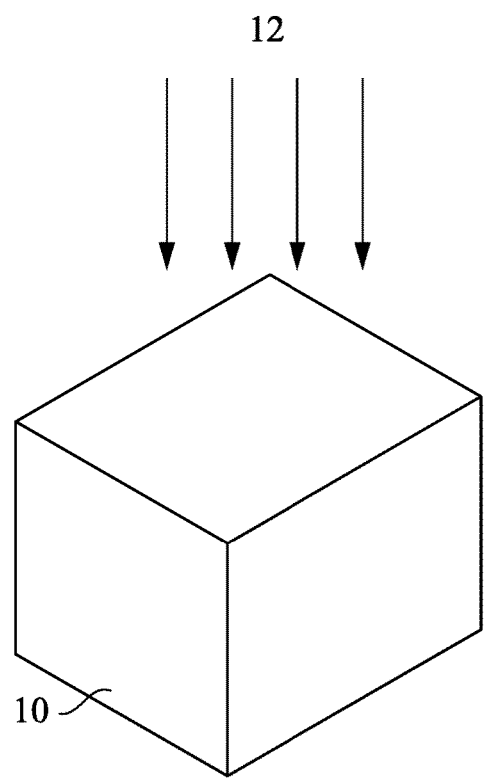
FIG. 1 shows a view of one of the various stages of a sequential manufacturing process for a GAA FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In the following embodiments, material, configurations, dimensions, operations and/or processes of one embodiment may be employed in another embodiment, unless otherwise described, and detailed explanation thereof may be omitted.

High mobility channel materials and device architectures have been studied to extend the life of Moore's law in recent 10 years. Pure Ge and SiGe having a high Ge concentration are promising candidates for such materials due to their material property of higher intrinsic hole and electron mobility. For well-tempered device scaling of Lg<12 nm, nanowire or nanosheet structures will be employed to provide better short channel controlling. Therefore, Ge or SiGe nanowire devices are considered as promising and potential candidates for further scaled-down logic device application.

In order to manufacture a GAA FET having Si, SiGe or Ge based channels (semiconductor wires), a stacked layer of Si and SiGe or SiGe and Ge is formed over a substrate, the stacked layer is patterned into a fin structure, and one of the layers are removed during a gate replacement process to release the channels. Generally, Si is used for an n-channel GAA FET and SiGe or Ge is used for a p-channel GAA FET. In the case of a SiGe p-channel GA FET, a higher Ge concentration can increase transistor performance.

However, when forming a stacked layer of Si and SiGe to manufacture both n-channel and p-channel GAA FETs, the SiGe layer having a higher Ge concentration may cause some issues. For example, when the Ge concentration is about 50 atomic % in the SiGe layer, lattice mismatch between Si and SiGe becomes large, and a critical thickness of a Si layer epitaxially formed on the SiGe layer would be small, which may reduce performance of the n-channel GAA FET with Si channels. In contrast, when the Ge concentration is only about 30-40 atomic % in the SiGe layer, performance of the p-channel GAA FET with SiGe channels may be insufficient. Although it is possible to form different stacked layers for an n-channel GAA FET and a p-channel FET, process cost would increase.

In the present disclosure, a device structure and a method of manufacturing thereof to solve the issues as set forth above are presented.

FIGS. 1-32E show a sequential process for manufacturing a GAA FET device according to an embodiment of the present disclosure. It is understood that additional operations can be provided before, during, and after the operations shown by FIGS. 1-32E, and some of the operations described below can be replaced or eliminated, for additional embodiments of the method. The order of the operations/processes may be interchangeable.

As shown in FIG. 1, impurity ions (dopants) 12 are implanted into a silicon substrate 10 to form a well region. The ion implantation is performed to prevent a punch-through effect. In some embodiments, the substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In one embodiment, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The Ge concentration of the SiGe buffer layers may increase from 30 atomic % germanium for the bottom-most buffer layer to 70 atomic % germanium for the topmost buffer layer. The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

Figure 2:
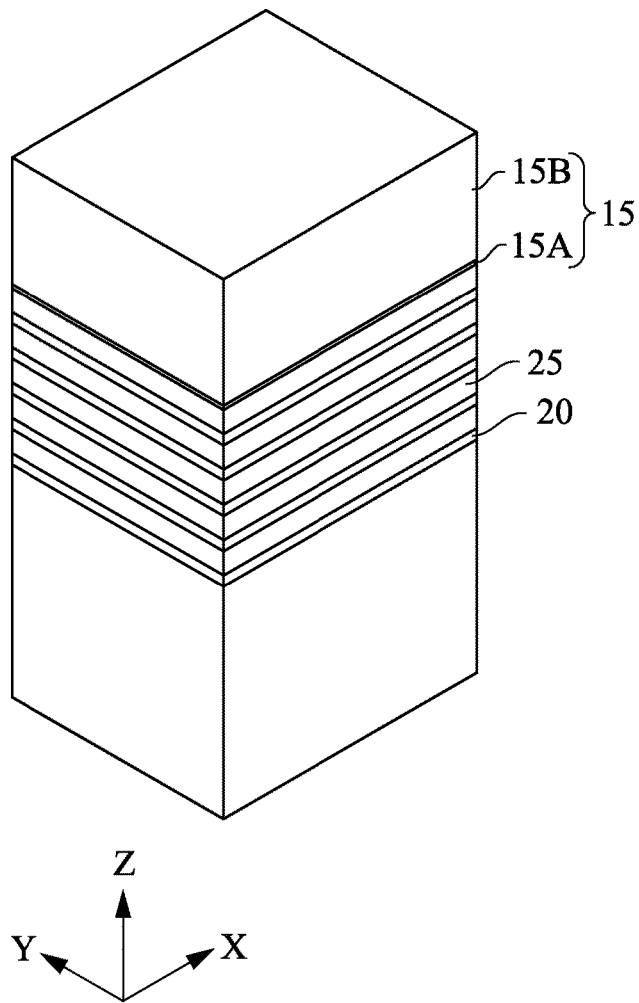
FIG. 2 shows a view of one of the various stages of a sequential manufacturing process for a GAA FET device according to an embodiment of the present disclosure.

As shown in FIG. 2, stacked semiconductor layers are formed over the substrate 10. The stacked semiconductor layers include first semiconductor layers 20 and second semiconductor layers 25. Further, a mask layer 15 is formed over the stacked layers. The first semiconductor layers 20 and the second semiconductor layers 25 are made of materials having different lattice constants, and may include one or more layers of Si, Ge, SiGe, GeSn, SiGeSn, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In certain embodiments, the first semiconductor layers 20 are $Si_{1-x}Ge_x$, where $0.35 \leq x \leq 0.45$, and the second semiconductor layers 25 are Si. In other embodiments, the second semiconductor layers 25 are made of $Si_{1-y}Ge_y$, where y is equal to or less than about 0.2 and x>y.

In FIG. 2, five layers of the first semiconductor layer 20 and five layers of the second semiconductor layer 25 are disposed. However, the number of the layers are not limited to five, and may be as small as 1 (each layer) and in some embodiments, 2-20 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or smaller than that of the second semiconductor layers 25, and is in a range from about 2 nm to about 10 nm in some embodiments, and is in a range from about 3 nm to about 5 nm in other embodiments. The thickness of the second semiconductor layers 25 is in a range from about 5 nm to about 20 nm in some embodiments, and is in a range from about 7.5 nm to about 12.5 nm in other embodiments. The thickness of each of the first and second semiconductor layers may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 15 includes a first mask layer 15A and a second mask layer 15B. The first mask layer 15A is a pad oxide layer made of a silicon oxide, which can be formed by a thermal oxidation. The second mask layer 15B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Next, as shown in FIG. 3, the stacked layers of the first and second semiconductor layers 20, 25 are patterned by using the patterned mask layer, thereby the stacked layers are formed into fin structures 30 extending in the Y direction and arranged along the X direction.

The fin structures 30 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

In FIG. 3, two fin structures 30 are arranged in the X direction. But the number of the fin structures is not limited to, and may be as small as one and three or more. In some embodiments, one or more dummy fin structures are formed on both sides of the fin structures 30 to improve pattern fidelity in the patterning operations. As shown in FIG. 3, the fin structures 30 have upper portions constituted by the stacked semiconductor layers 20, 25 and well portions 11, which correspond to the bottom fin structure.

The width W1 of the upper portion of the fin structure 30 along the X direction is in a range from about 5 nm to about 30 nm in some embodiments, and is in a range from about 7.5 nm to about 15 nm in other embodiments. The height H1 along the Z direction of the fin structure 30 is in a range from about 50 nm to about 200 nm.

After the fin structure is formed, an insulating material layer 41 including one or more layers of insulating material is formed over the substrate so that the fin structures are fully embedded in the insulating layer 41. The insulating material for the insulating layer 41 may include silicon oxide, silicon nitride, silicon oxynitride (SiON), SiOCN, SiCN, fluorinedoped silicate glass (FSG), or a low-K dielectric material, formed by LPCVD (low pressure chemical vapor deposition), plasma-CVD or flowable CVD. An anneal operation may be performed after the formation of the insulating layer 41. Then, a planarization operation, such as a chemical mechanical polishing (CMP) method and/or an etch-back method, is performed such that the upper surface of the uppermost second semiconductor layer 25 is exposed from the insulating material layer 41 as shown in FIG. 4.

In some embodiments, one or more fin liner layers 35 are formed over the structure of FIG. 3 before forming the insulating material layer 41, as shown FIG. 4. The liner layer 35 is made of SiN or a silicon nitride-based material (e.g., SiON, SiCN or SiOCN). In some embodiments, the fin liner layers 35 include a first fin liner layer 35A formed over the substrate 10 and side faces of the bottom fin structures 11, and a second fin liner layer 35B formed on the first fin liner layer 35A. Each of the liner layers has a thickness between about 1 nm and about 20 nm in some embodiments. In some embodiments, the first fin liner layer 35A includes silicon oxide and has a thickness between about 0.5 nm and about 5 nm, and the second fin liner layer 35B includes silicon nitride and has a thickness between about 0.5 nm and about 5 nm. The fin liner layers 35 may be deposited through one or more processes such as physical vapor deposition (PVD), chemical vapor deposition (CVD), or atomic layer deposition (ALD), although any acceptable process may be utilized.

Figure 5:
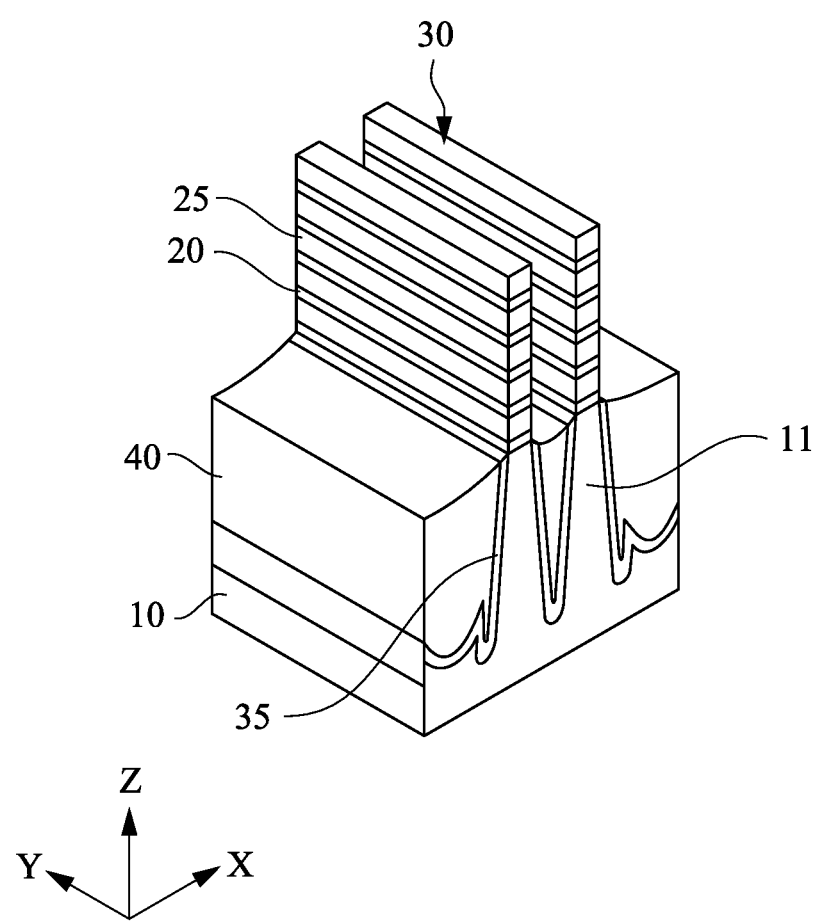
FIG. 5 shows a view of one of the various stages of a sequential manufacturing process for a GAA FET device according to an embodiment of the present disclosure.

Then, as shown in FIG. 5, the insulating material layer 41 is recessed to form an isolation insulating layer 40 so that the upper portions of the fin structures 30 are exposed. With this operation, the fin structures 30 are electrically separated from each other by the isolation insulating layer 40, which is also called a shallow trench isolation (STI). In the embodiment shown in FIG. 5, the insulating material layer 41 is recessed until the bottommost first semiconductor layer 20 is exposed. In other embodiments, the upper portion of the well layer 11 is also partially exposed. The first semiconductor layers 20 are sacrificial layers which are subsequently partially removed, and the second semiconductor layers 25 are subsequently formed into channel layers of a GAA FET.

Figure 6A:
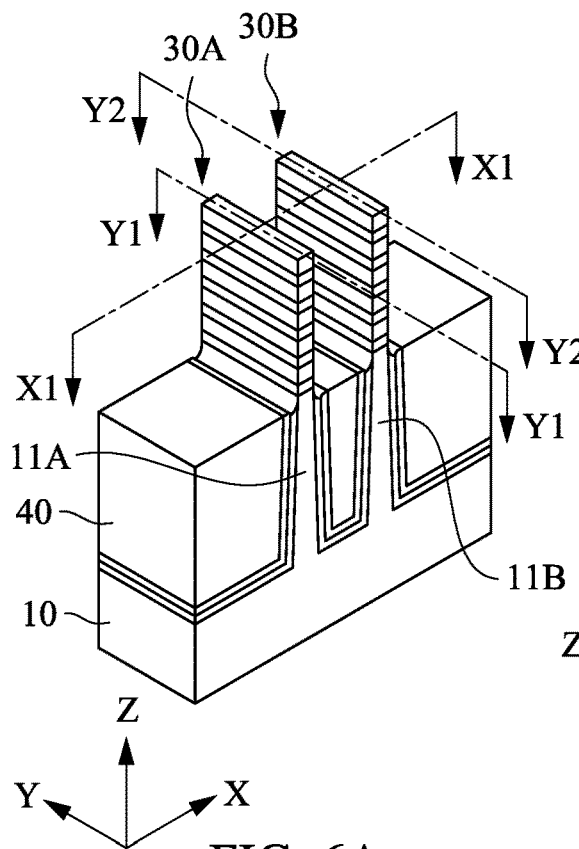
FIGS. 6A, 6B, 6C and 6D show various views of one of the various stages of a sequential manufacturing process for a GAA FET device according to an embodiment of the present disclosure.
Figure 6B:
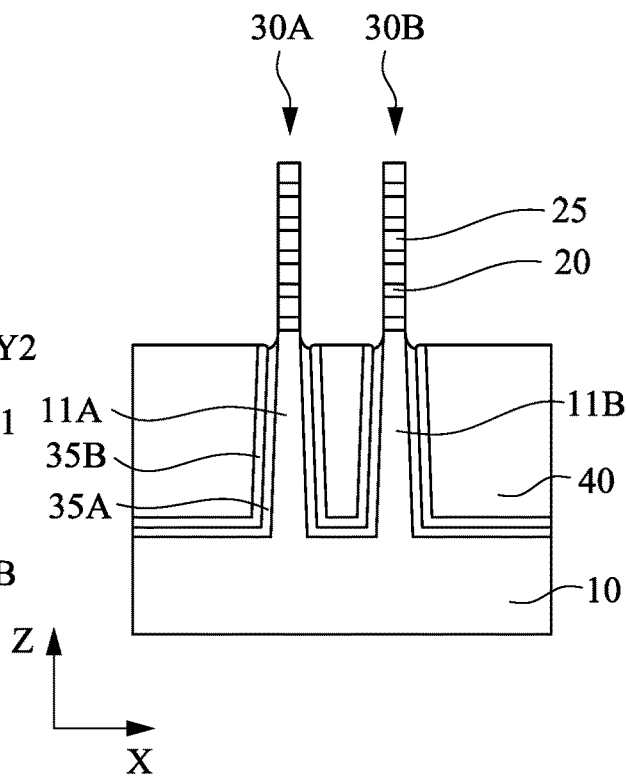
Figure 6C:
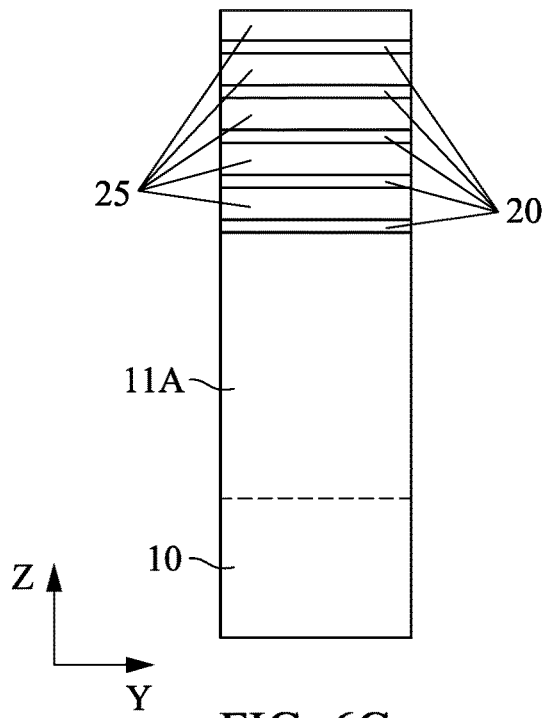
Figure 6D:
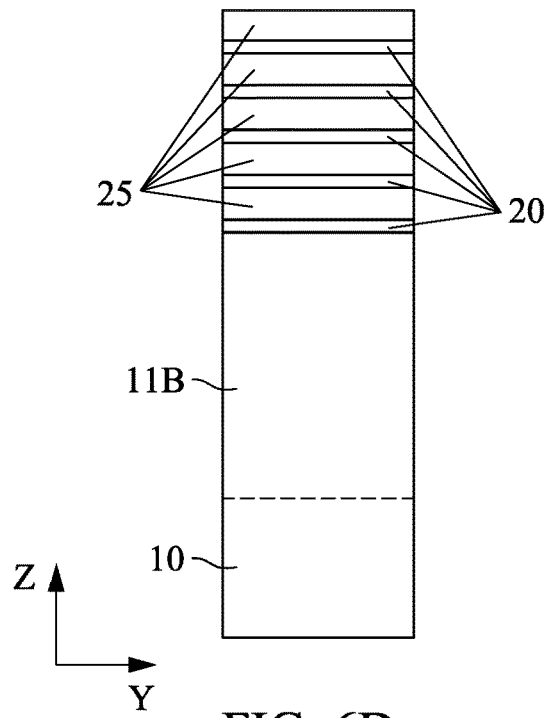

In FIGS. 6A-13D as explained below, the "A" figures (e.g., FIGS. 6A, 7A, . . . 13A) are perspective views, the "B" figures (e.g., FIGS. 6B, 7B, . . . 13B) are cross sectional views along the X direction corresponding to line X1-X1 of FIG. 6A, the "C" figures (e.g., FIGS. 6C, 7C, . . . 13C) are cross sectional views along the Y direction corresponding to line Y1-Y1 of FIG. 6A (cutting fin structure 30A), and the "D" figures (e.g., FIGS. 6D, 7D, . . . 13D) are cross sectional views along the Y direction corresponding to line Y2-Y2 of FIG. 6A (cutting fin structure 30B).

FIG. 6A-6D shows the structure after the upper portions of the fin structures 30 are exposed. FIG. 6A is substantially the same as FIG. 5. As shown in FIGS. 6A-6D, a first fin structure 30A and a second fin structure 30B are disposed over bottom fin structures 11A and 11B, respectively. In some embodiments, the first fin structure 30A is for an n-channel FET and the second fin structure 30B is for a p-channel FET. In other embodiments, the first and second fin structures are for the same type FET.

Figure 7A:
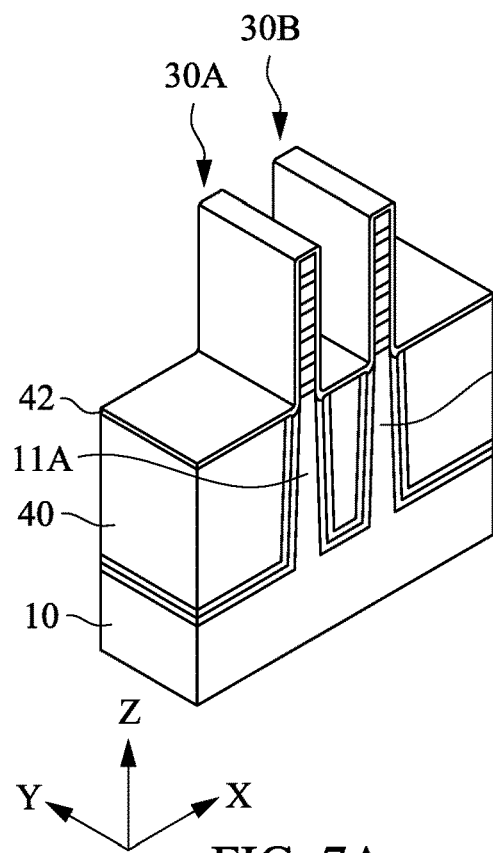
FIGS. 7A, 7B, 7C and 7D show various views of one of the various stages of a sequential manufacturing process for a GAA FET device according to an embodiment of the present disclosure.
Figure 7B:
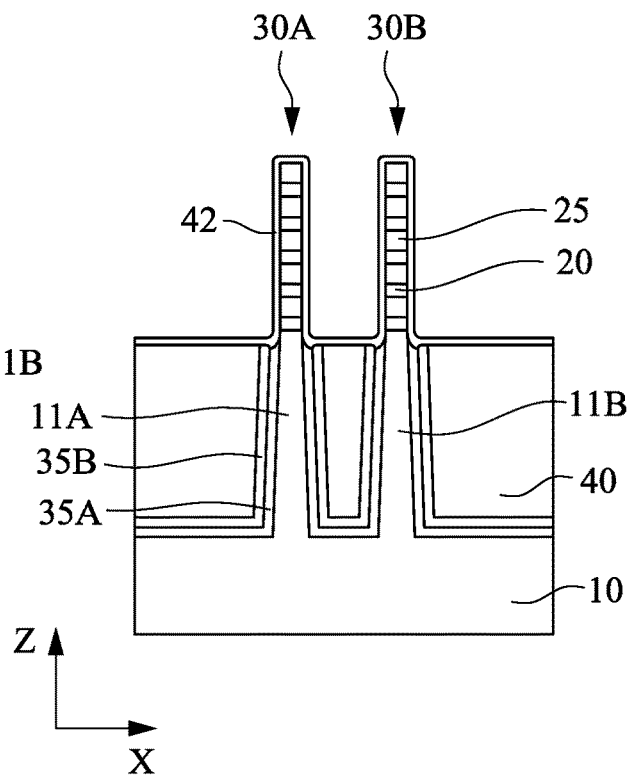
Figure 7C:
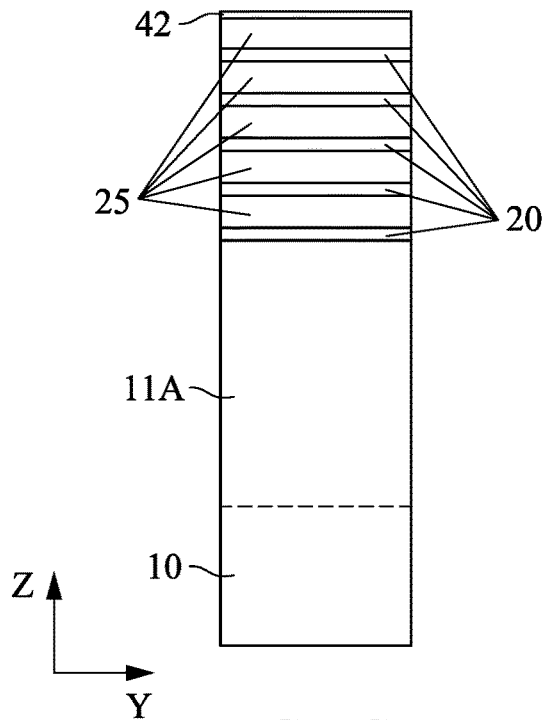
Figure 7D:
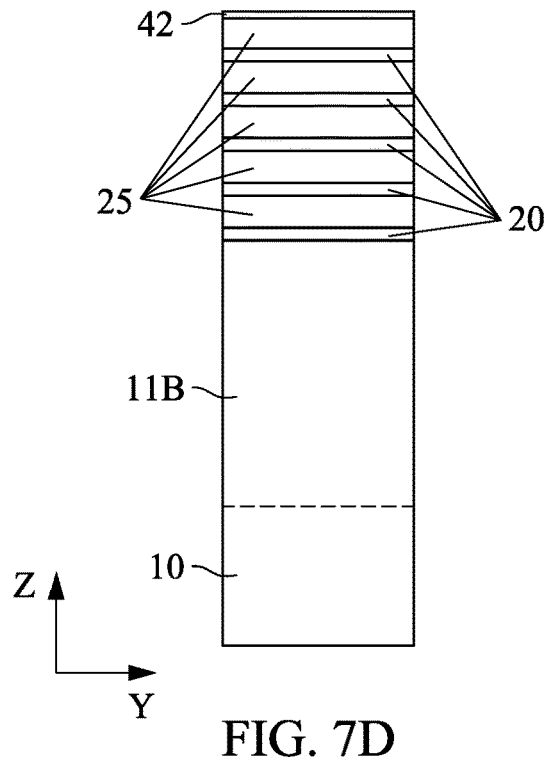
Figure 8A:
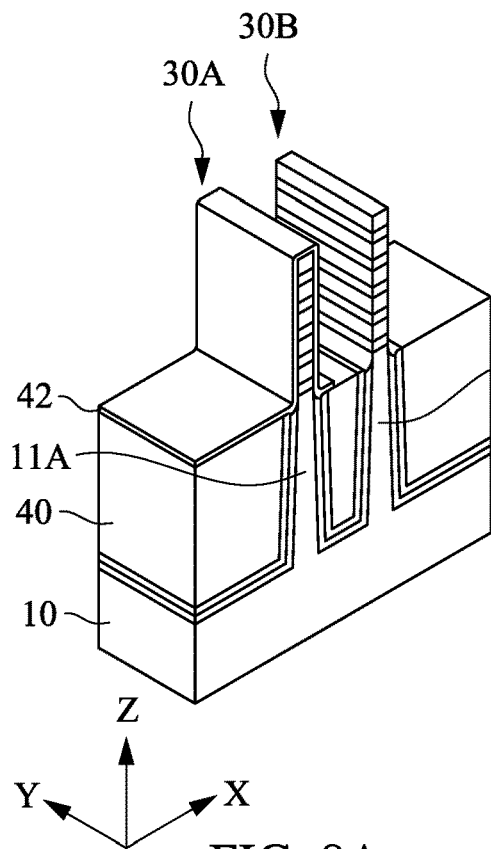
FIGS. 8A, 8B, 8C and 8D show various views of one of the various stages of a sequential manufacturing process for a GAA FET device according to an embodiment of the present disclosure.
Figure 8B:
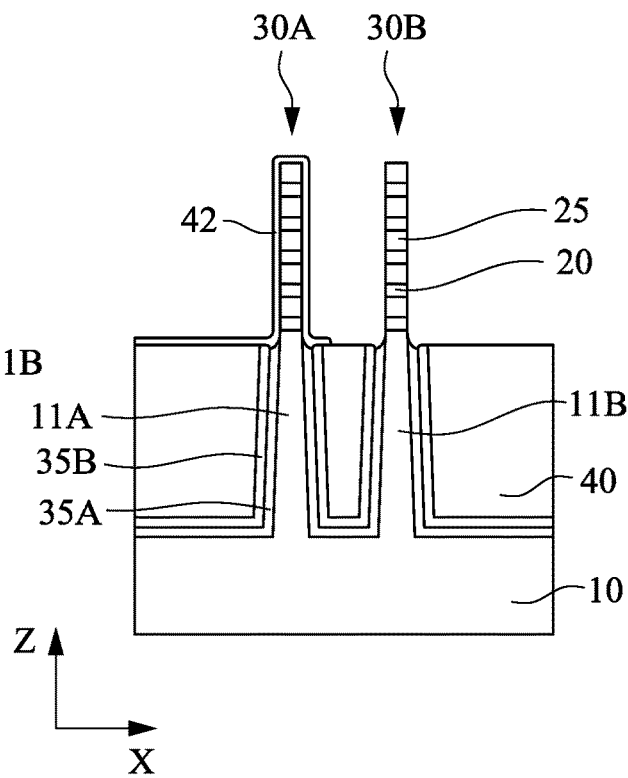
Figure 8C:
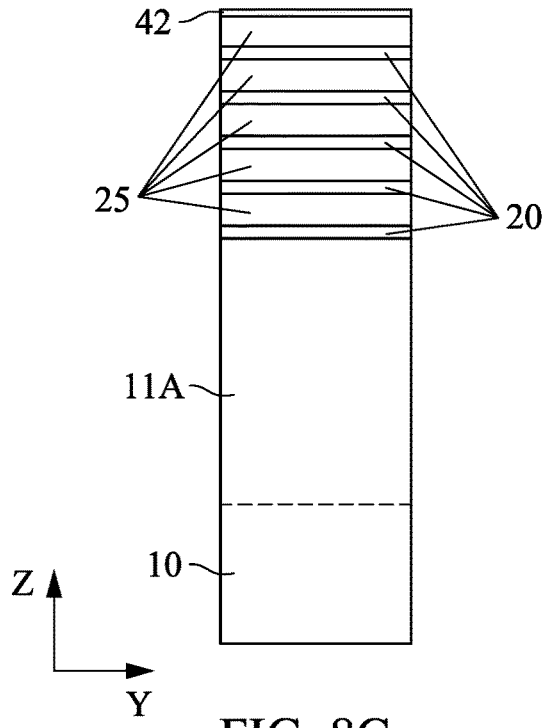
Figure 8D:
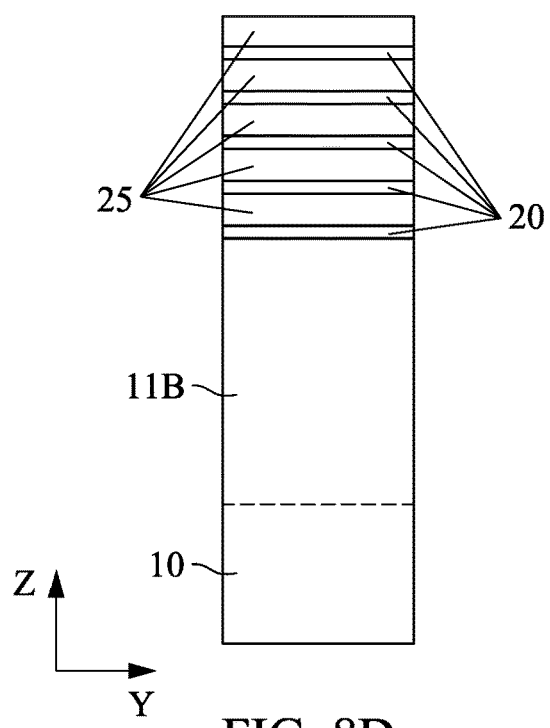
Figure 9A:
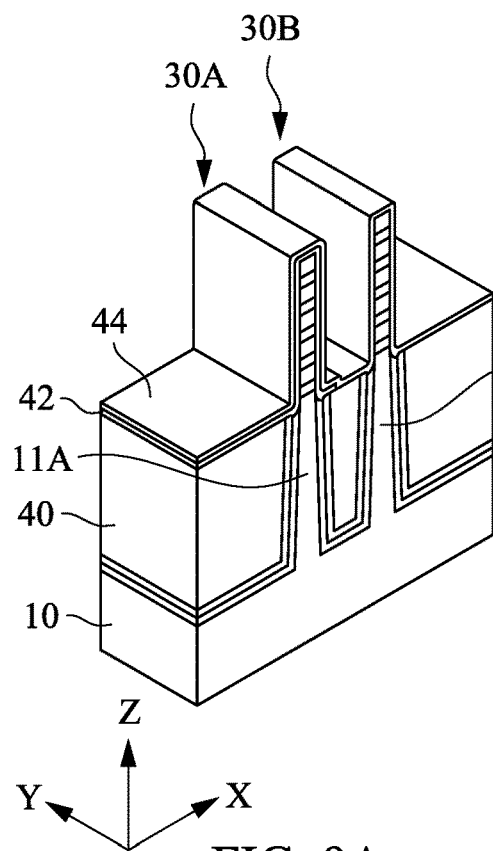
FIGS. 9A, 9B, 9C and 9D show various views of one of the various stages of a sequential manufacturing process for a GAA FET device according to an embodiment of the present disclosure.
Figure 9B:
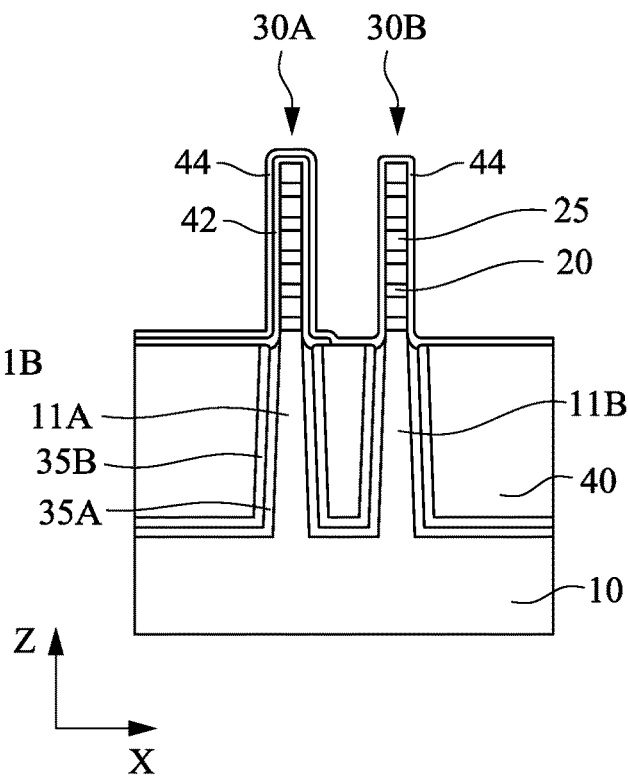
Figure 9C:
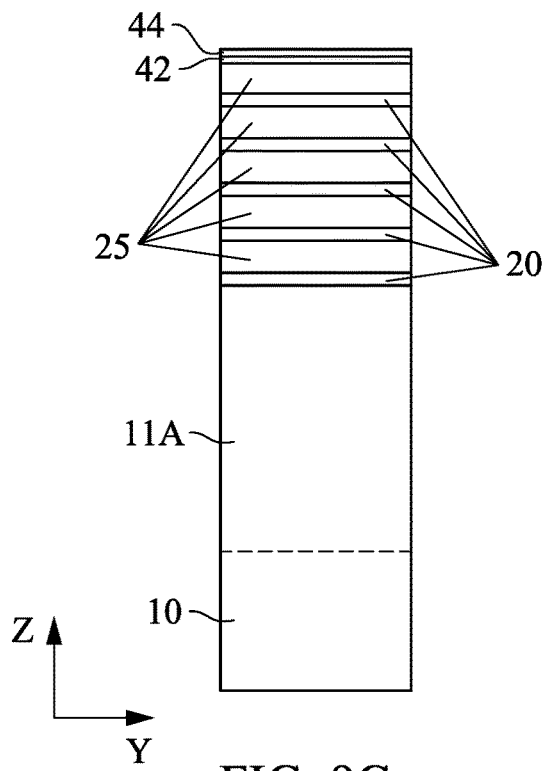
Figure 9D:
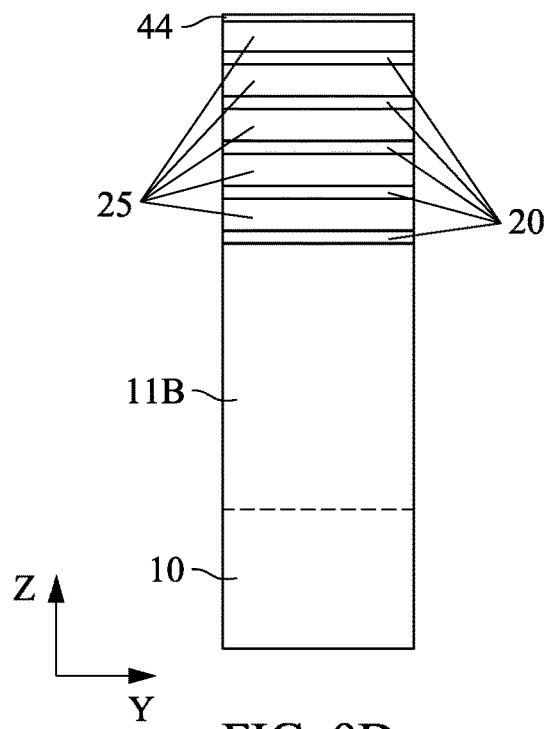
Figure 10A:
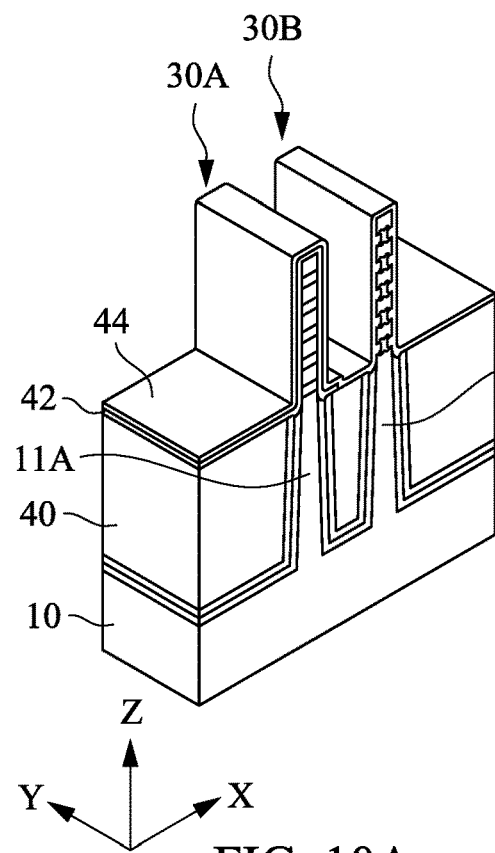
FIGS. 10A, 10B, 10C and 10D show various views of one of the various stages of a sequential manufacturing process for a GAA FET device according to an embodiment of the present disclosure.
Figure 10B:
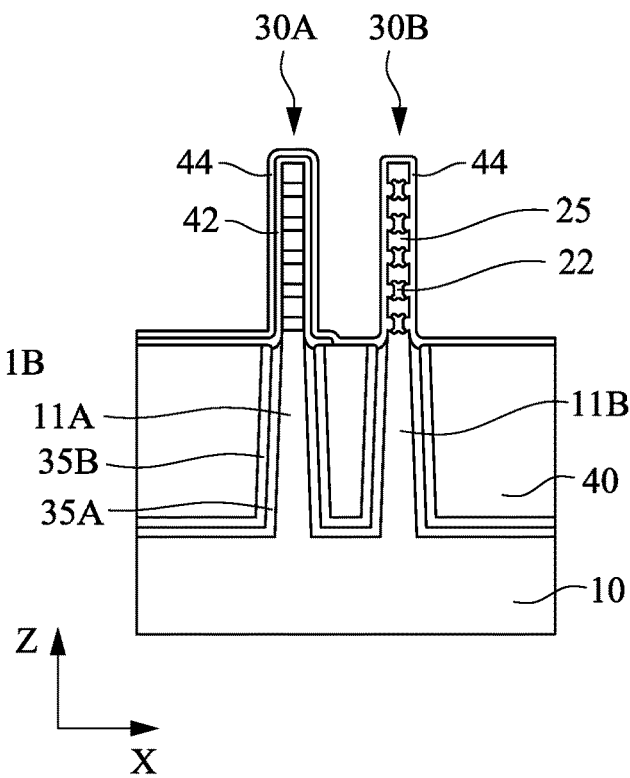
Figure 10C:
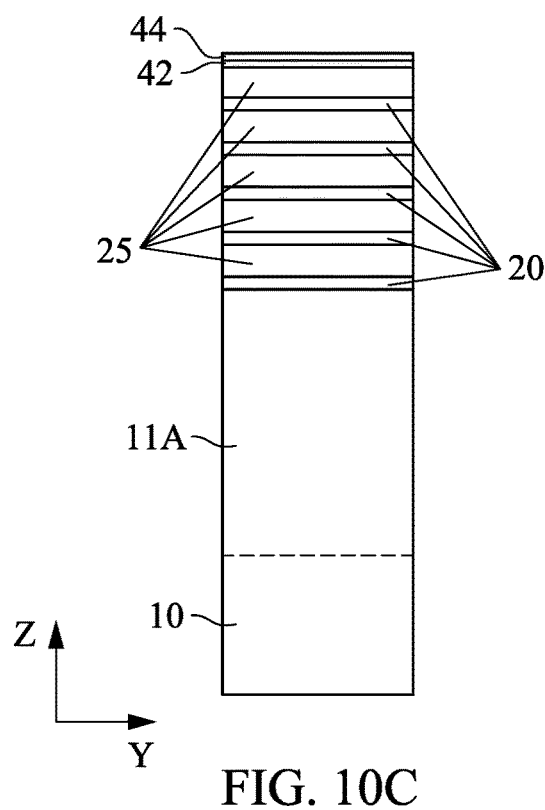
Figure 10D:
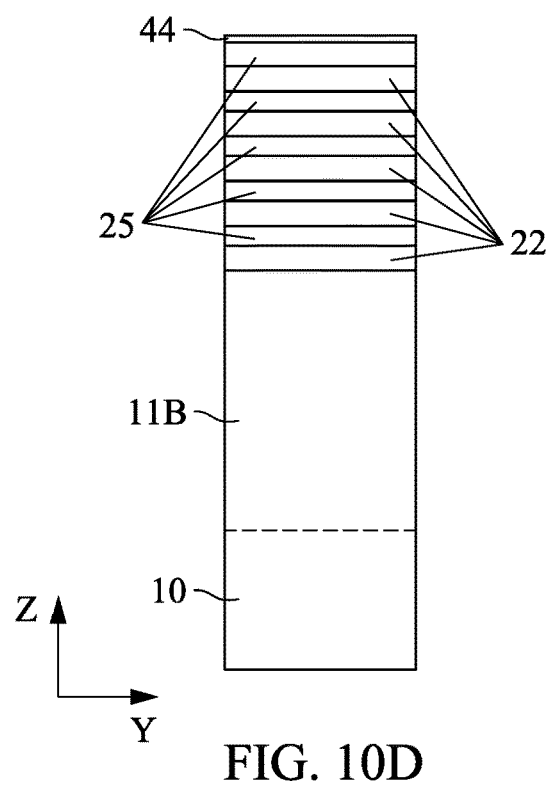
Figure 11A:
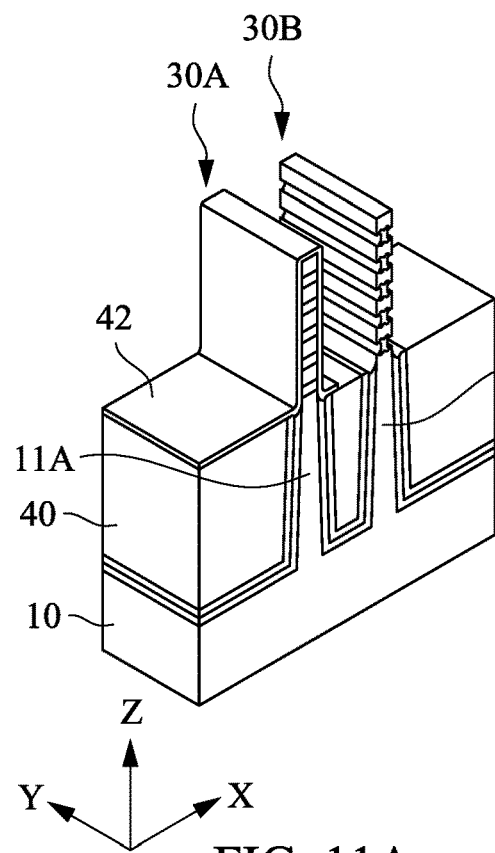
FIGS. 11A, 11B, 11C and 11D show various views of one of the various stages of a sequential manufacturing process for a GAA FET device according to an embodiment of the present disclosure.
Figure 11B:
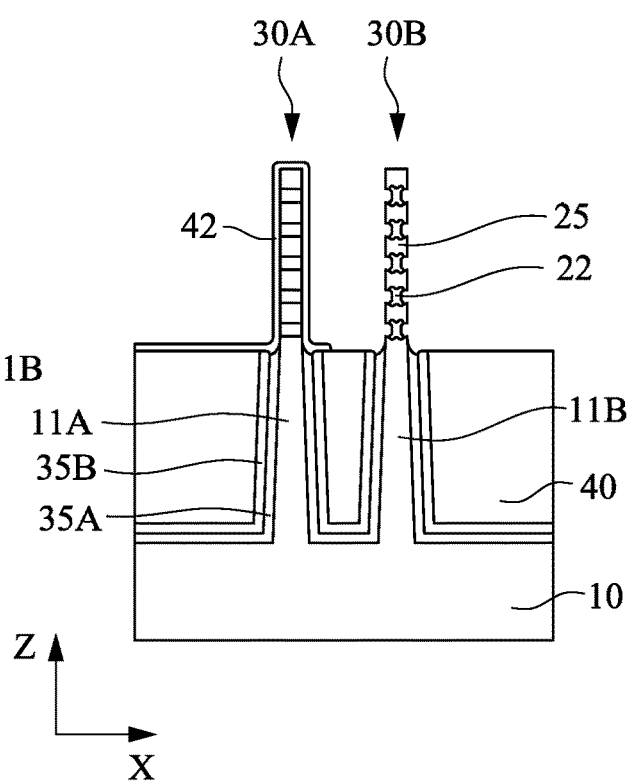
Figure 11C:
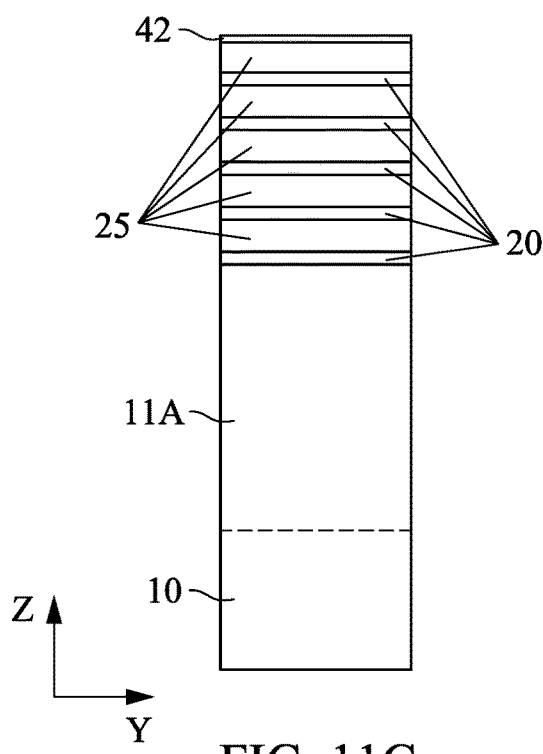
Figure 11D:
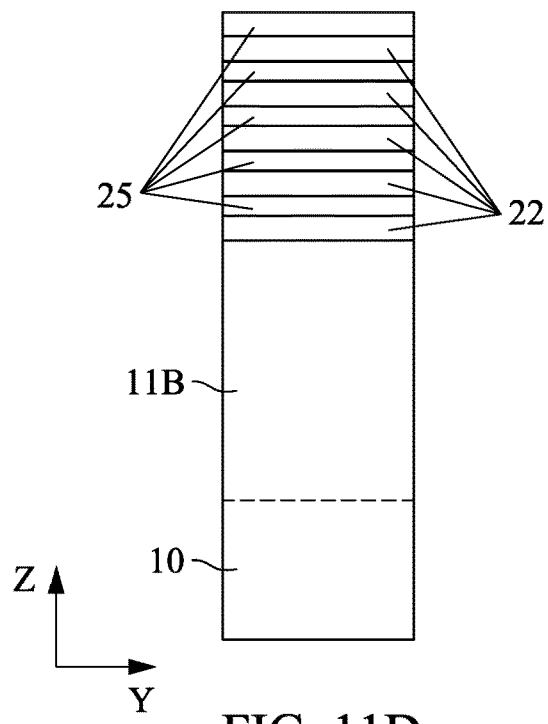
Figure 12A:
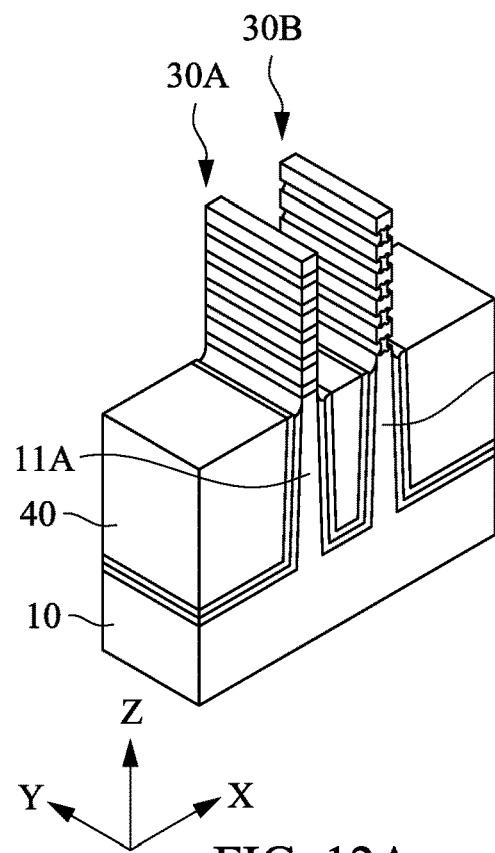
FIGS. 12A, 12B, 12C and 12D show various views of one of the various stages of a sequential manufacturing process for a GAA FET device according to an embodiment of the present disclosure.
Figure 12B:
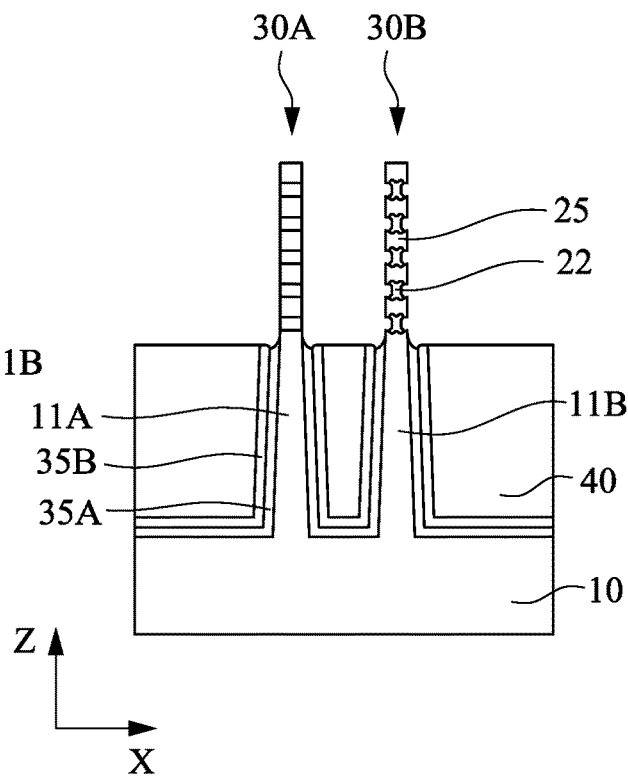
Figure 12C:
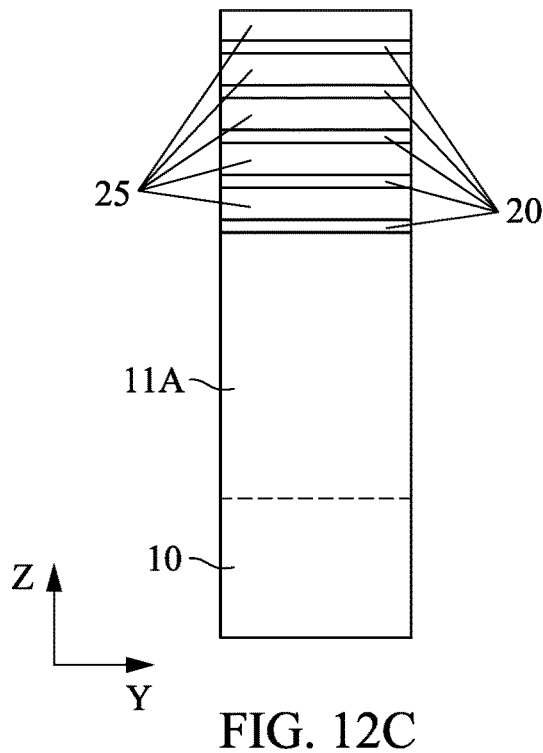
Figure 12D:
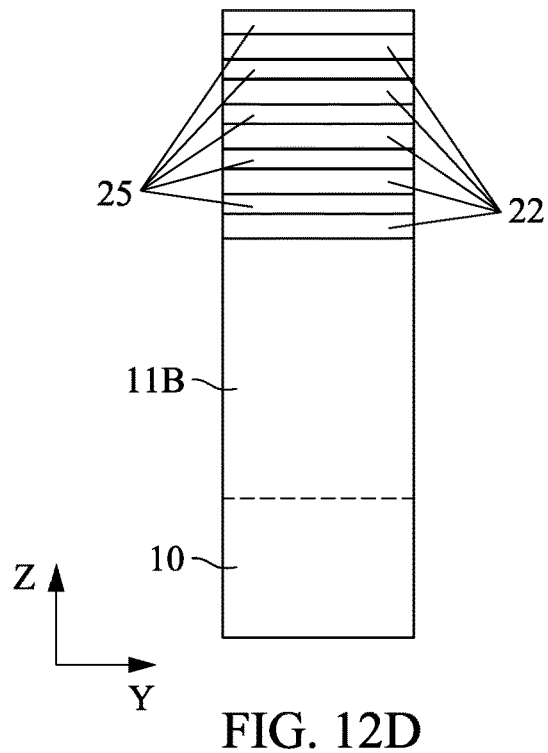
Figure 13A:
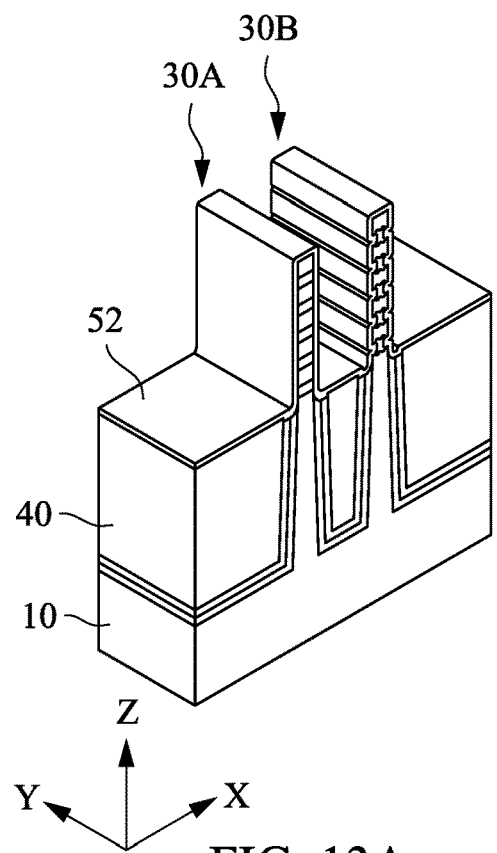
FIGS. 13A, 13B, 13C and 13D show various views of one of the various stages of a sequential manufacturing process for a GAA FET device according to an embodiment of the present disclosure.
Figure 13B:
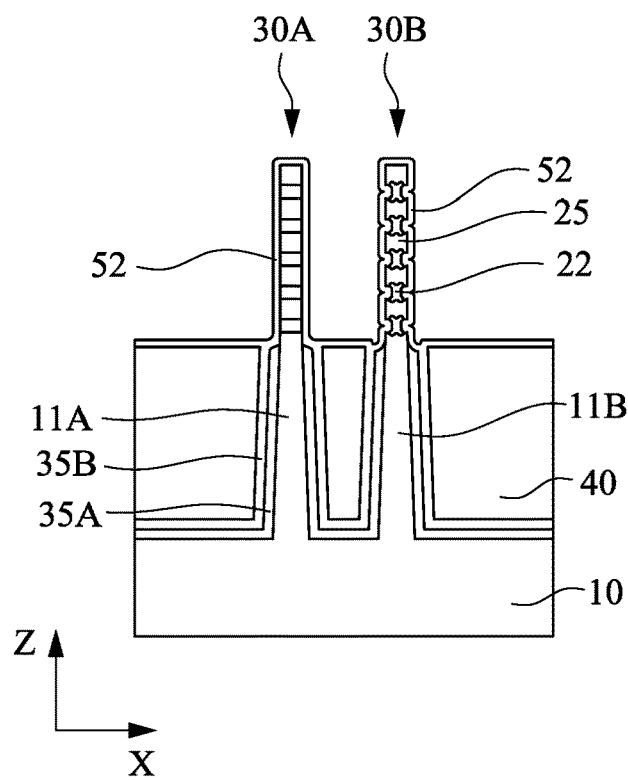
Figure 13C:
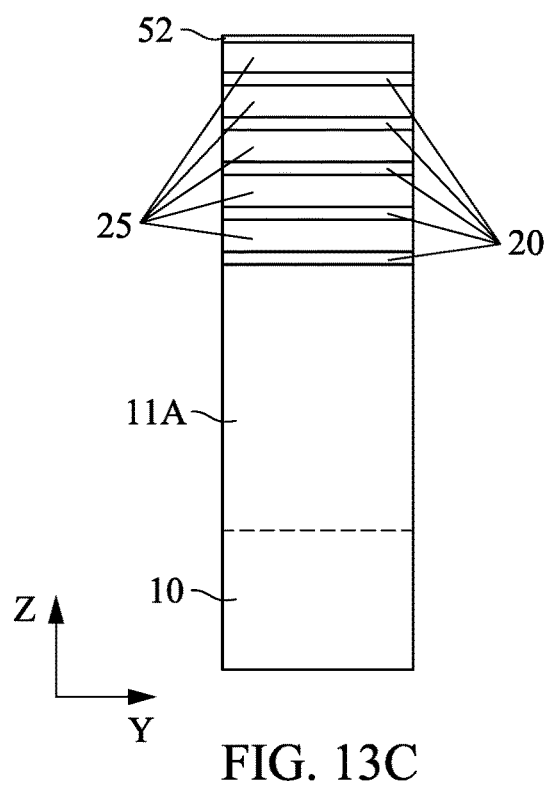
Figure 13D:
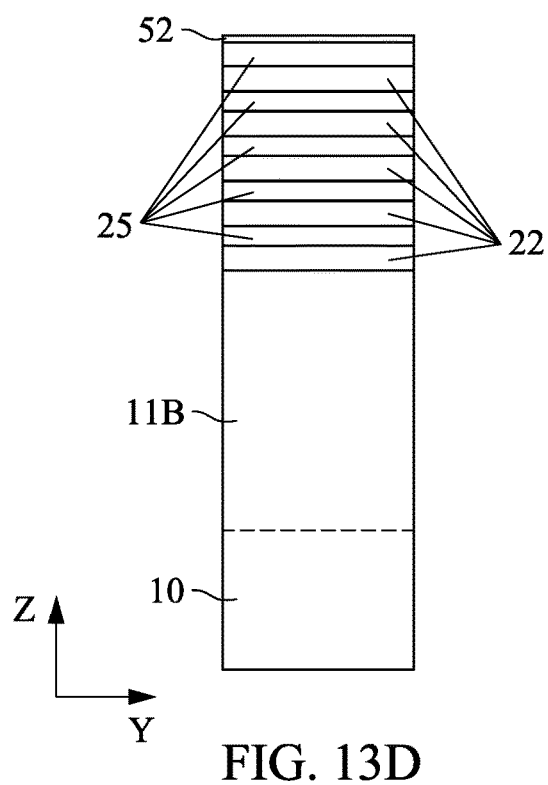

Then, as shown in FIGS. 7A-7A, a first protective layer 42 is formed over the structure shown in FIGS. 6A-6D. In some embodiments, the first protective layer 42 includes silicon nitride-based material, such as silicon nitride, SiON, SiOCN or SiCN and combinations thereof, formed by CVD, including LPCVD and PECVD, PVD, ALD, or other suitable process. In certain embodiments, the first protective layer 42 is made of silicon nitride.

Next, as shown in FIGS. 8A-8D, the first protective layer 42 is patterned by using one or more lithography and etching operations, to expose the second fin structure 30B and its surrounding area.

Then, as shown in FIGS. 9A-9D, an oxidation film 44 is formed over the structure shown in FIGS. 7A-7D. In some embodiments, the oxidation film 44 includes silicon oxide formed by CVD, including LPCVD and PECVD, PVD, ALD, or other suitable process.

Subsequently, a thermal process is performed to oxidize the first semiconductor layers 20. In some embodiments, the thermal process is performed in an oxidizing ambient including $O_2$ and/or $O_3$. In certain embodiments, the thermal process is performed at a temperature in a range from about 800° C. to about 1000° C. During the thermal process to oxidize the first semiconductor layer 20 made of SiGe, Si atoms in SiGe are captured more in the oxide layer, while Ge atoms in SiGe are condensed in non-oxidized portions of the first semiconductor layers 20 (a SiGe condensation process). More specifically, preferential oxidation of surface Si atoms results in a $SiO_2$-rich oxide layer during the SiGe condensation process. Meanwhile, surface Ge atoms are not only pushed inside the SiGe layer, but also out-diffuse into the upper and lower Si layers due to a high thermal budget. The combined SiGe condensation and out-diffusion processes cause redistribution of a Ge concentration within a SiGe bulk layer and a Ge-diffused Si layer. The resultant Ge distributed profile after the condensation determines the SiGe-wire shape, as described below (e.g., dog-bone shape).

Thus, the non-oxidized portions 22 of the first semiconductor layers have a higher Ge concentration than the first semiconductor layers 20 before the SiGe condensation process. In some embodiments, after the SiGe condensation process, the Ge concentration in the condensed first semiconductor layer 22 is in a range from about 45 atomic % to about 55 atomic % ($Si_{1-z}Ge_z$, where $0.45 \leq z \leq 0.55$). Further, during the condensation process, the thickness of the first semiconductor layers 20 increases. During the condensation process, the second semiconductor layers 25 made of Si are also slightly oxidized. The amount of oxidation of the first semiconductor layers 20 is greater than the amount of oxidation of the second semiconductor layers 25.

In other embodiments, the condensation process is performed without forming the oxidation film 44.

After the condensation process, the oxidation film 44 and the oxidized portions of the second fin structures 30B are removed by appropriate etching operation, such as wet etching, as show in FIGS. 11A-11D. In some embodiments, the condensation process is repeated twice or more to obtain a desired Ge concentration in the condensed first semiconductor layer 22.

After the condensation process, a width of the condensed first semiconductor layers 22 is smaller than a thickness of the condensed first semiconductor layers 22, in some embodiments. In other embodiments, the width of the condensed first semiconductor layers 22 is greater than a thickness of the condensed first semiconductor layers 22.

Subsequently, the first protective layer 42 is removed by using one or more etching operations, as shown in FIGS. 12A-12D.

After the first protective layer 42 is removed, a sacrificial gate dielectric layer 52 is formed, as shown in FIGS. 13A-13D. The sacrificial gate dielectric layer 52 includes one or more layers of insulating material, such as a silicon oxide-based material. In one embodiment, silicon oxide formed by CVD is used. The thickness of the sacrificial gate dielectric layer 52 is in a range from about 1 nm to about 5 nm in some embodiments.

Figure 14A:
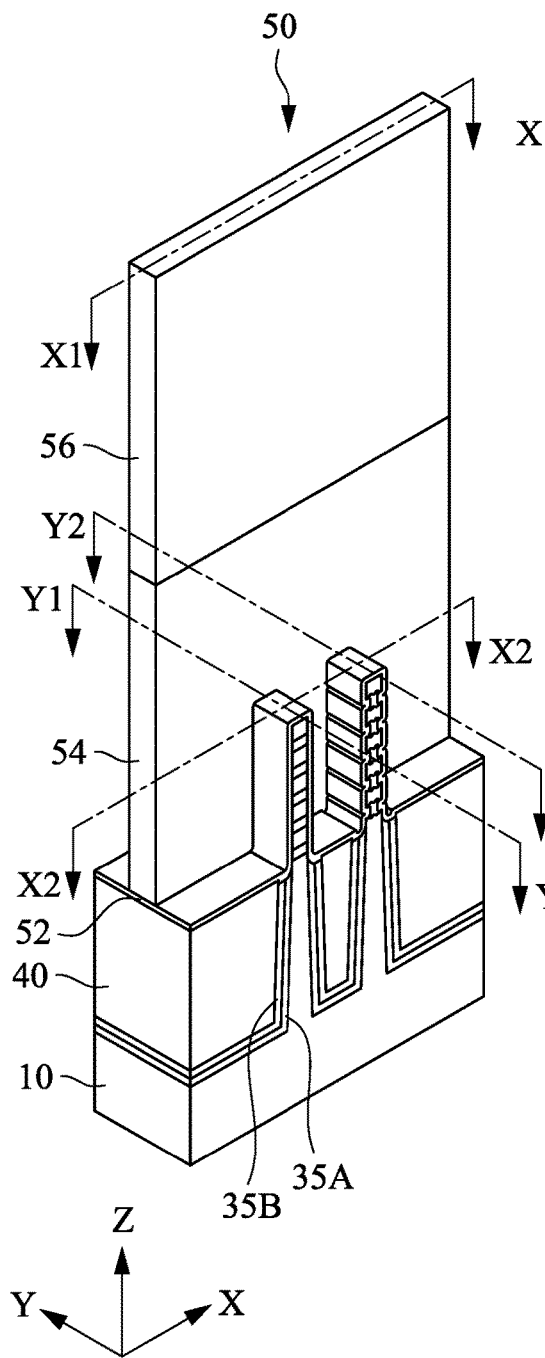
FIGS. 14A, 14B, 14C, 14D and 14E show various views of one of the various stages of a sequential manufacturing process for a GAA FET device according to an embodiment of the present disclosure.
Figure 14B:
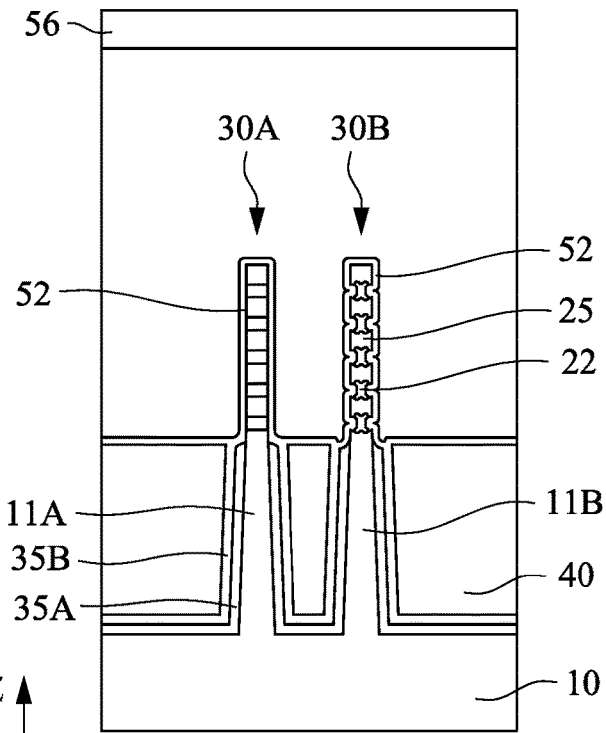
Figure 14C:
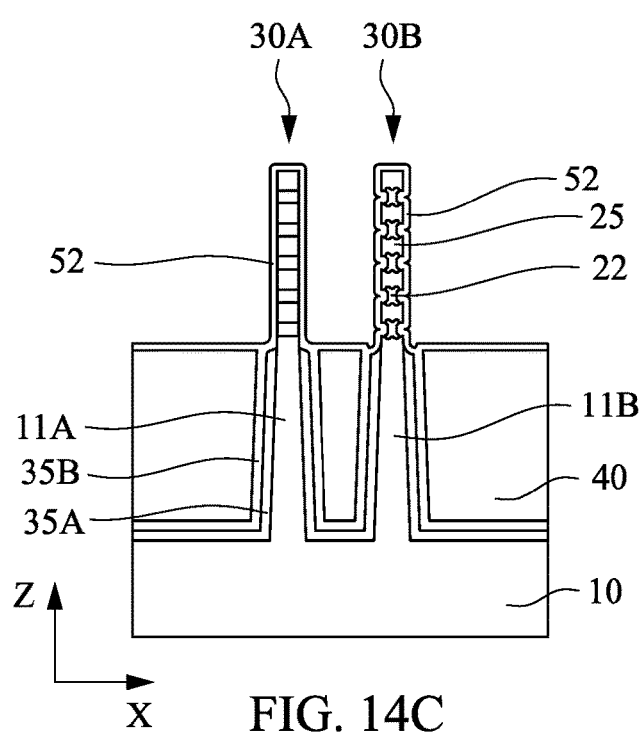
Figure 14D:
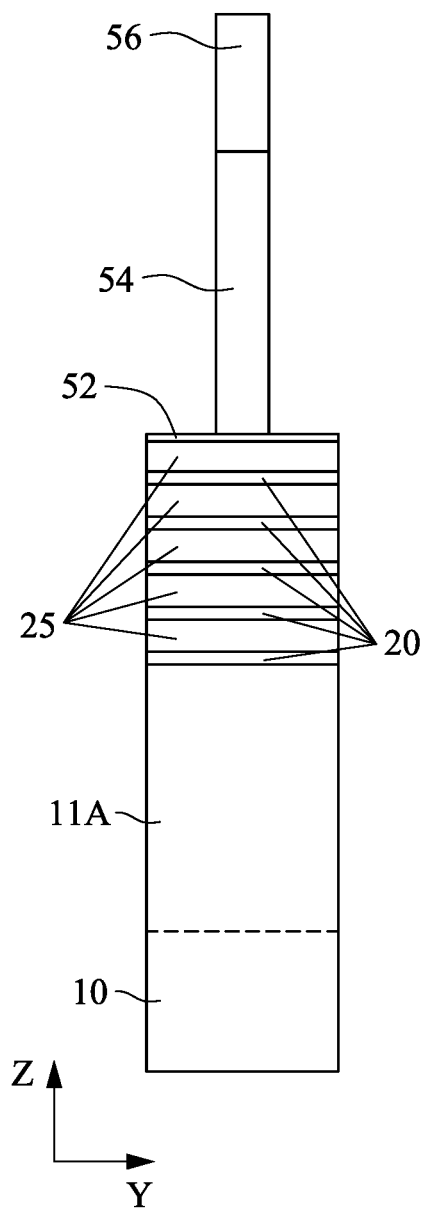
Figure 14E:
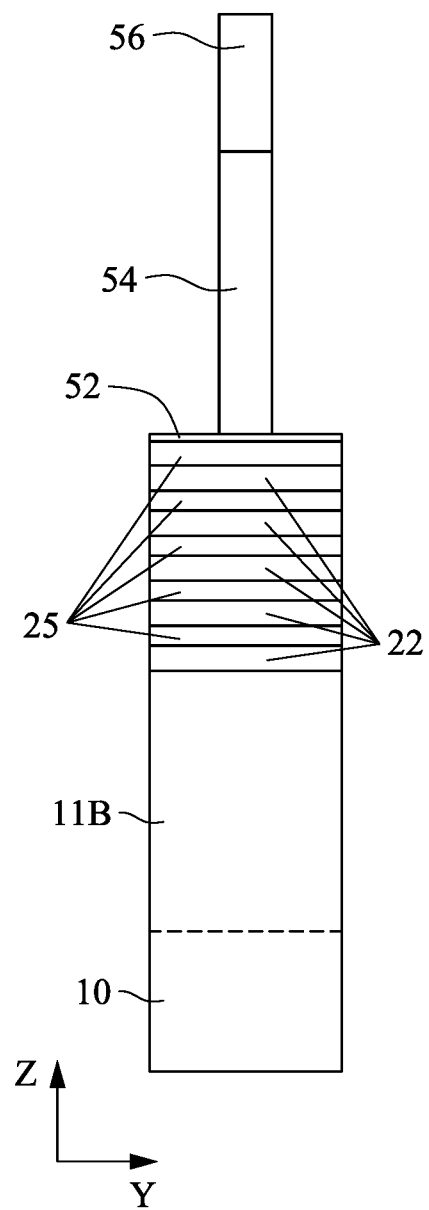
Figure 15A:
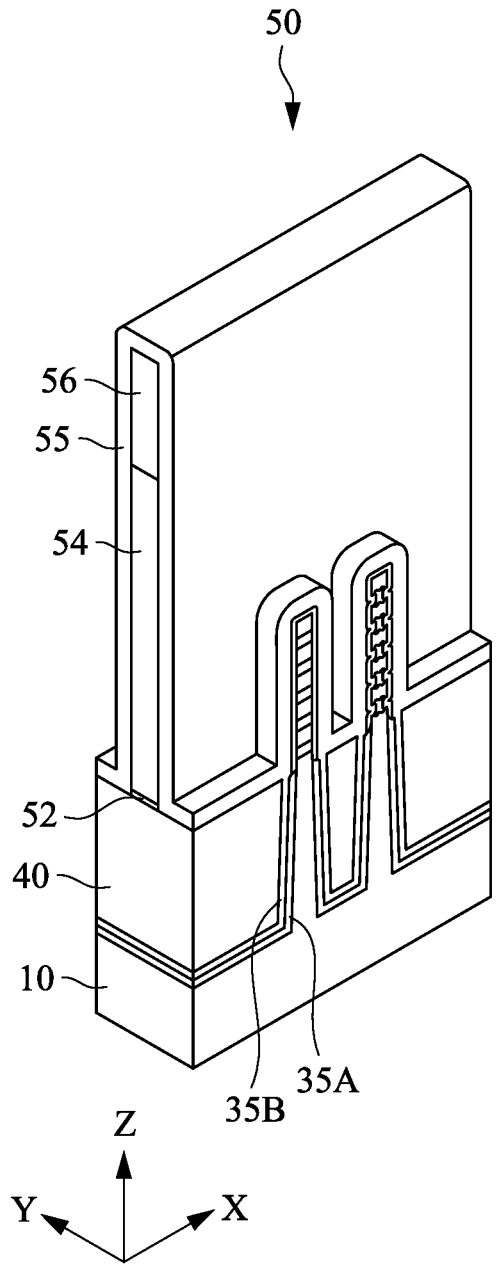
FIGS. 15A, 15B, 15C, 15D and 15E show various views of one of the various stages of a sequential manufacturing process for a GAA FET device according to an embodiment of the present disclosure.
Figure 15B:
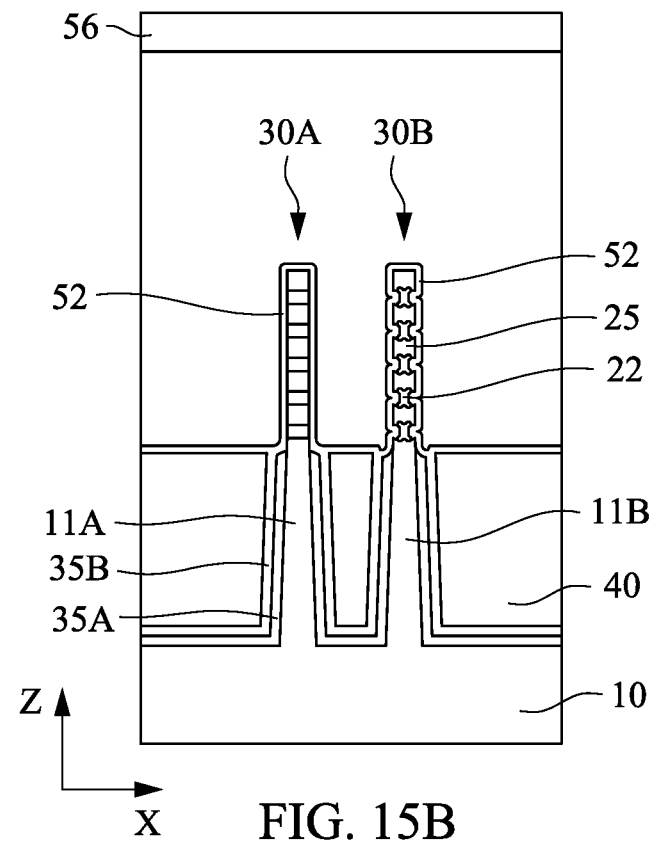
Figure 15C:
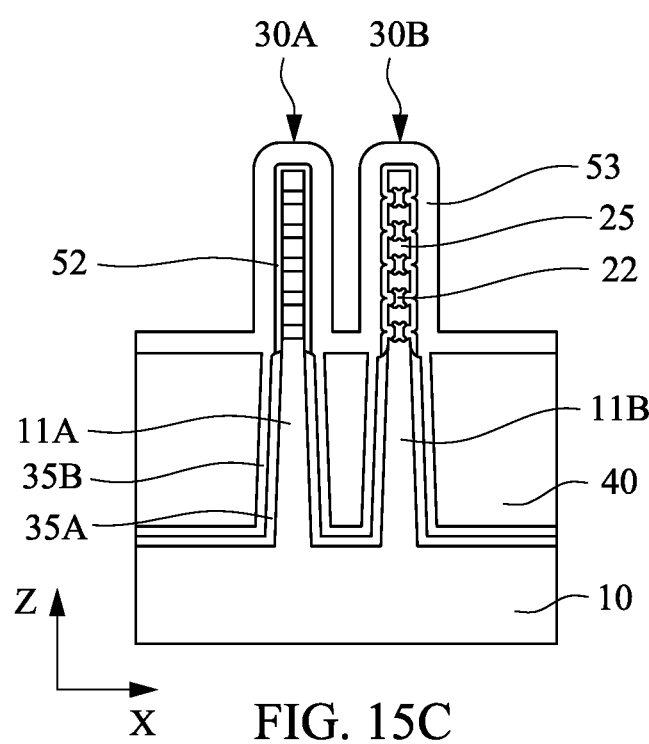
Figure 15D:
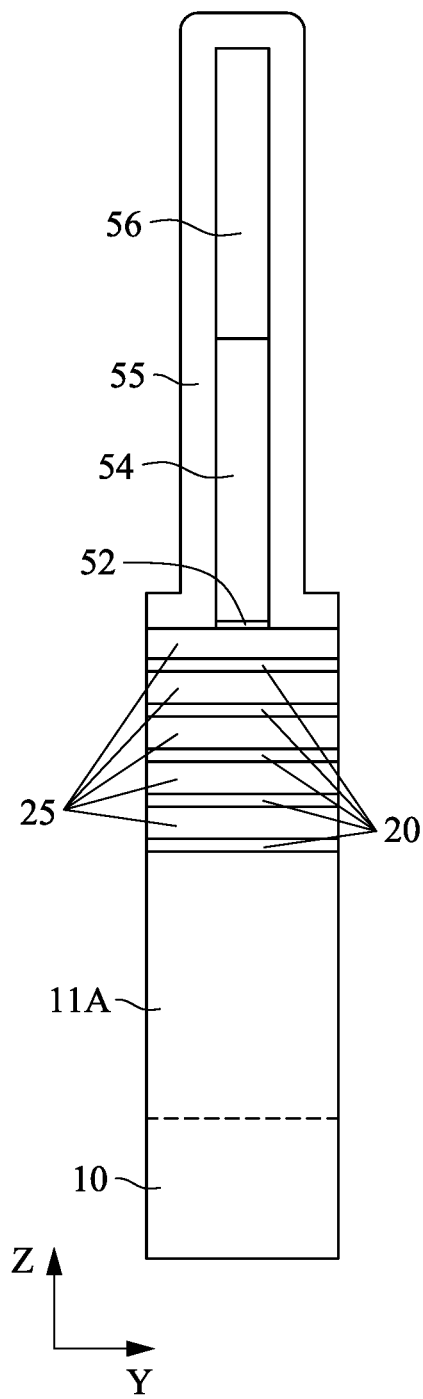
Figure 15E:
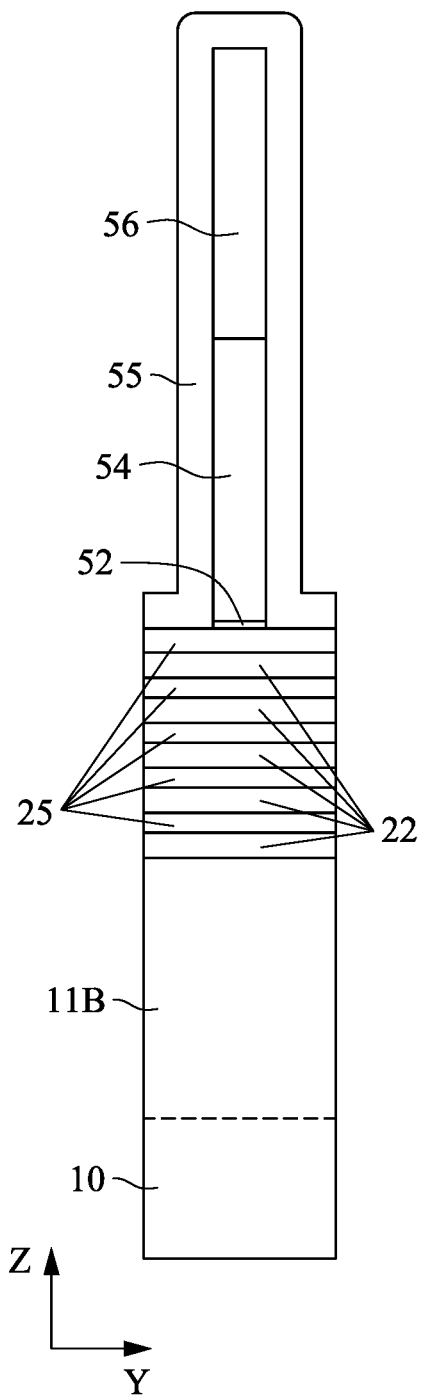
Figure 16A:
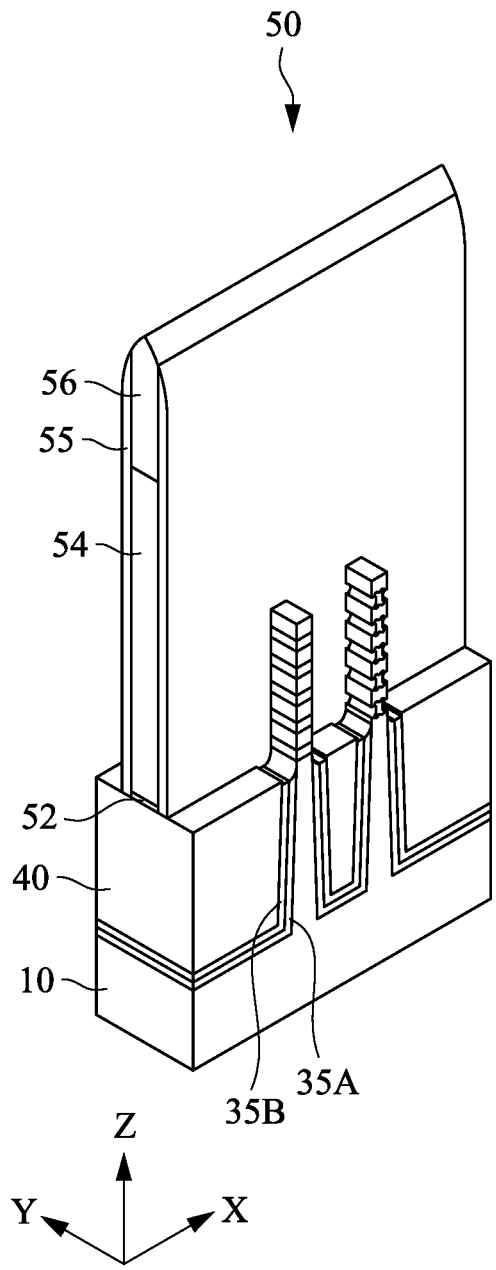
FIGS. 16A, 16B, 16C, 16D and 16E show various views of one of the various stages of a sequential manufacturing process for a GAA FET device according to an embodiment of the present disclosure.
Figure 16B:
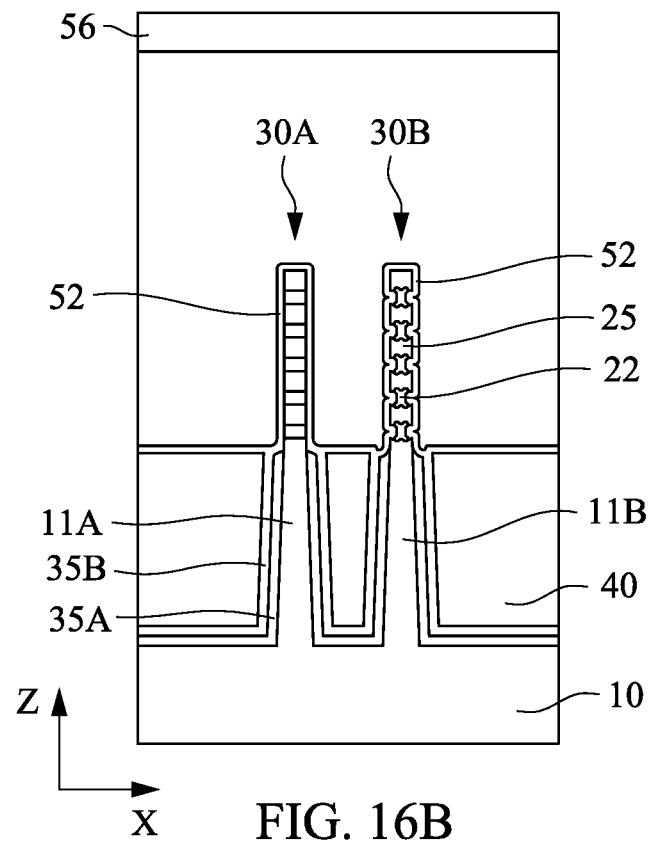
Figure 16C:
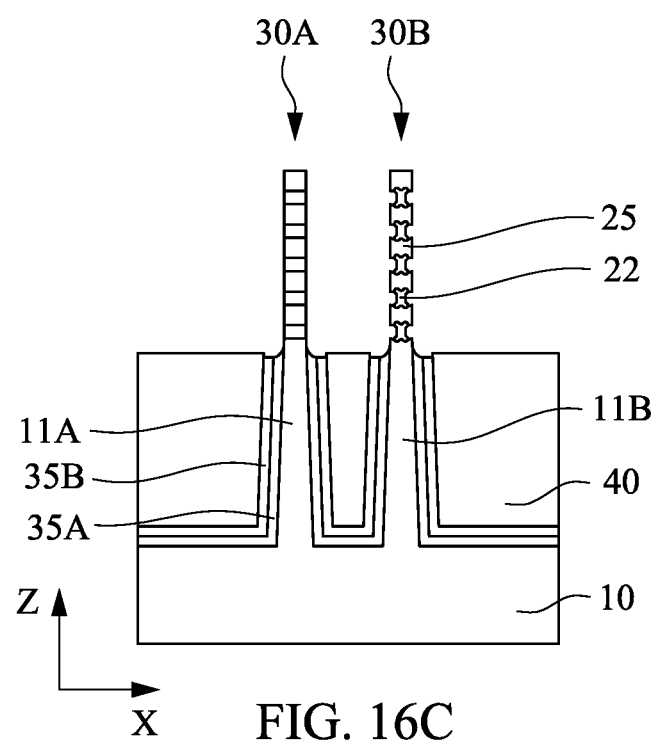
Figure 16D:
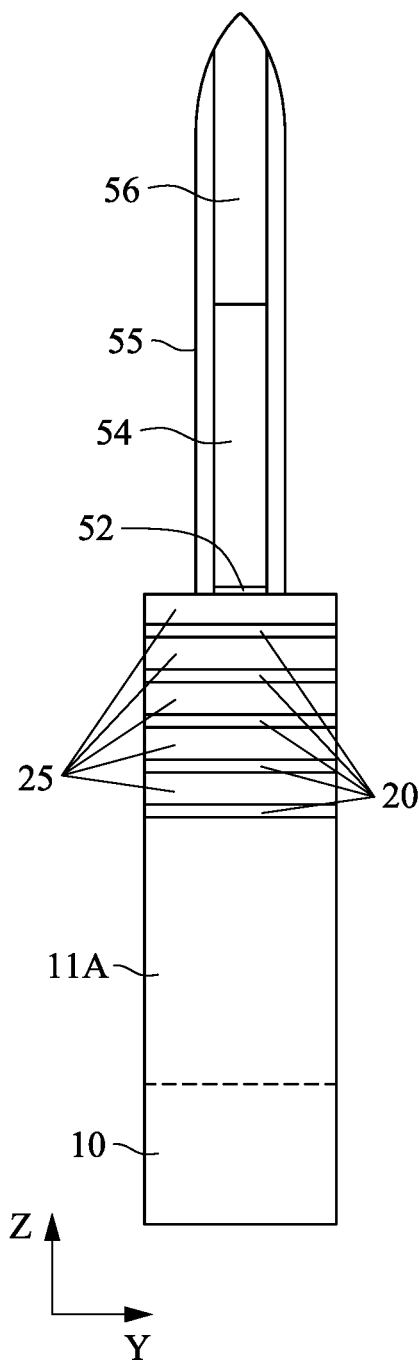
Figure 16E:
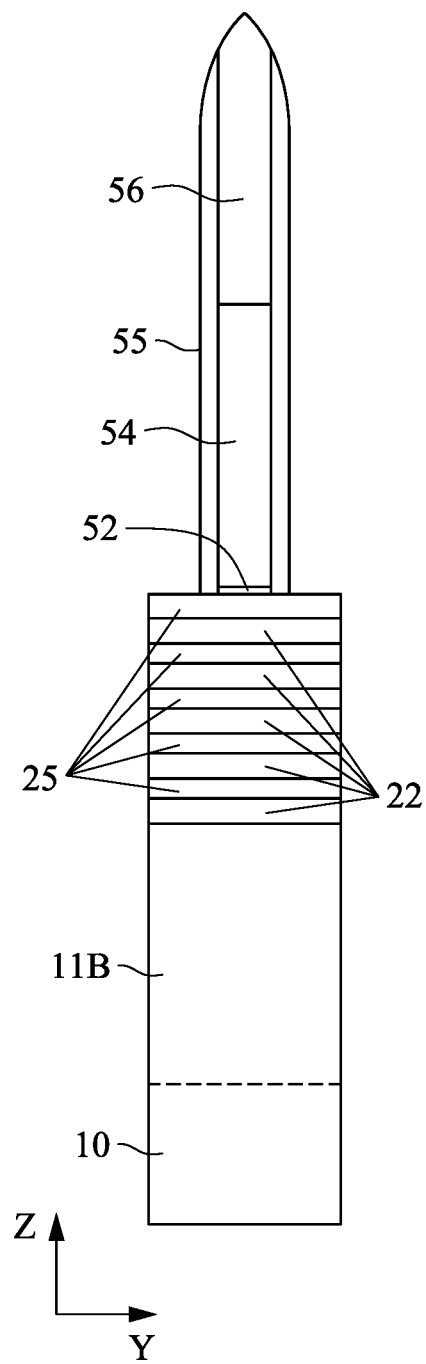
Figure 17A:
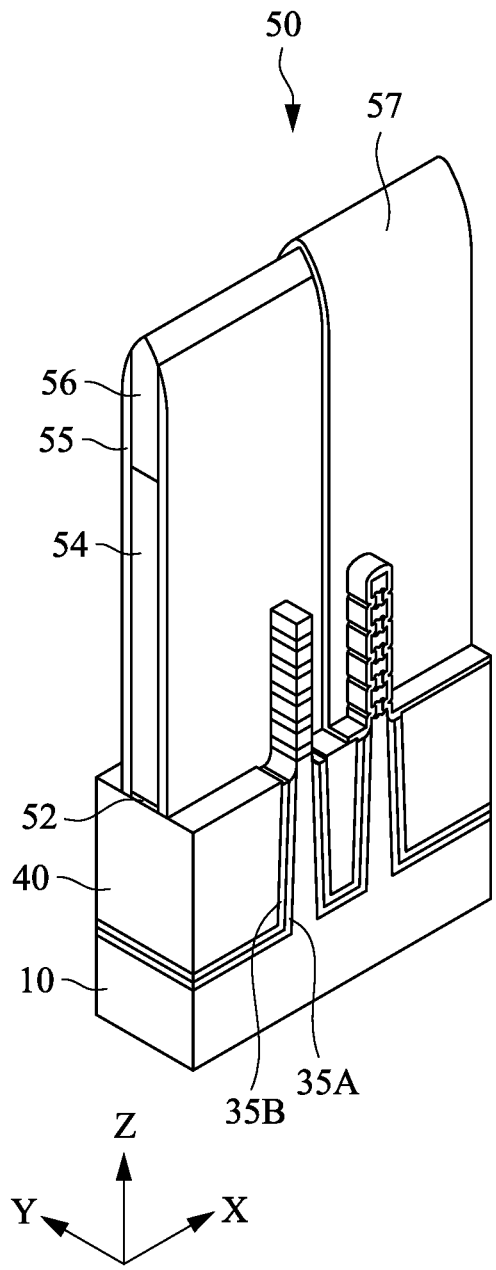
FIGS. 17A, 17B, 17C, 17D and 17E show various views of one of the various stages of a sequential manufacturing process for a GAA FET device according to an embodiment of the present disclosure.
Figure 17B:
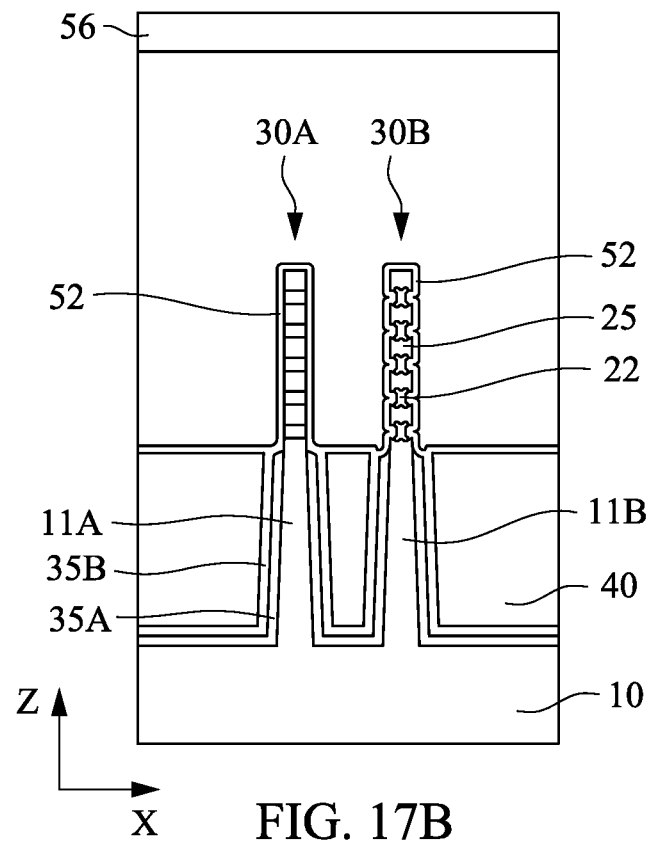
Figure 17C:
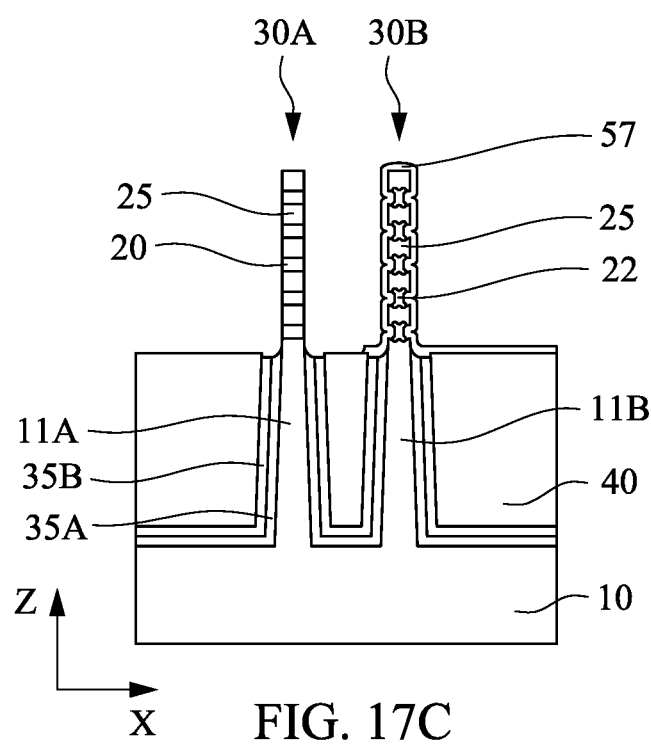
Figure 17D:
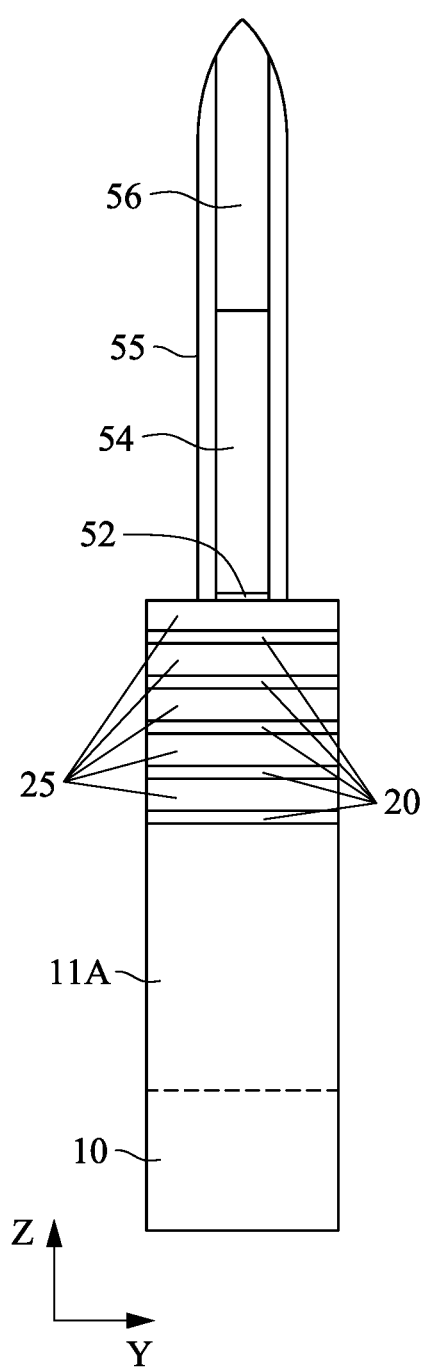
Figure 17E:
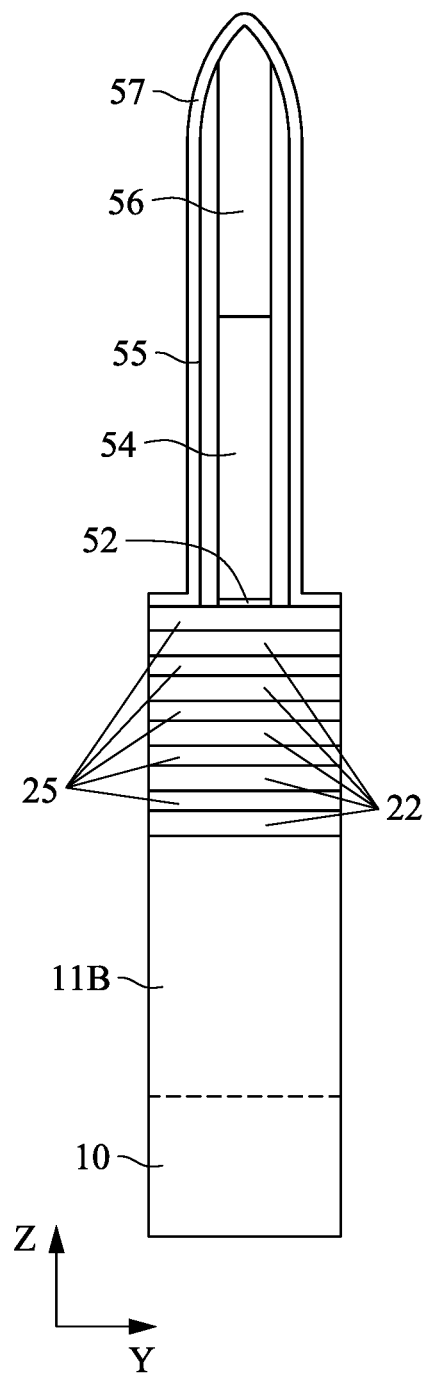
Figure 18A:
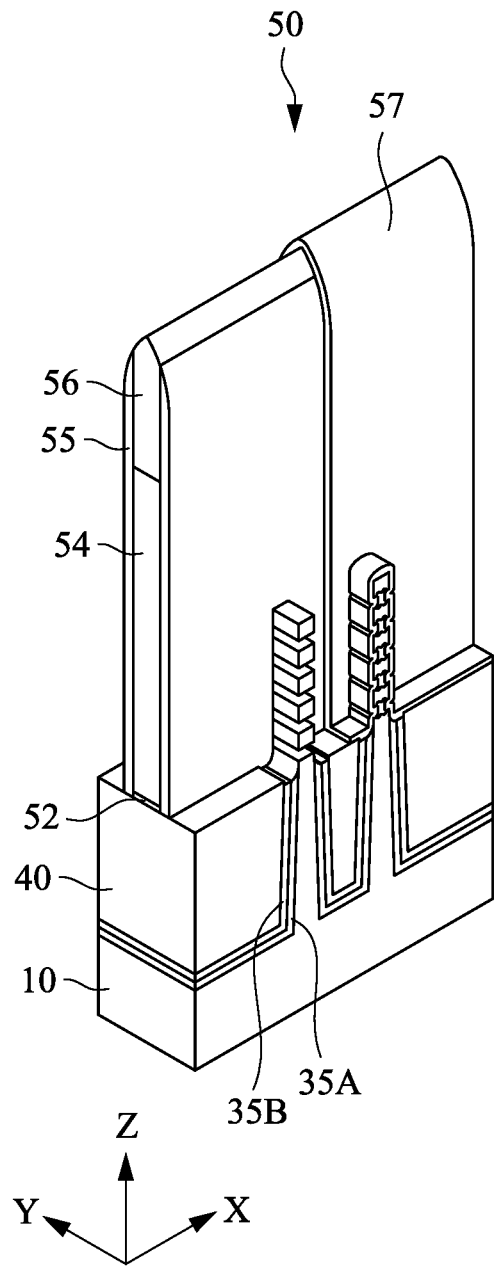
FIGS. 18A, 18B, 18C, 18D and 18E show various views of one of the various stages of a sequential manufacturing process for a GAA FET device according to an embodiment of the present disclosure.
Figure 18B:
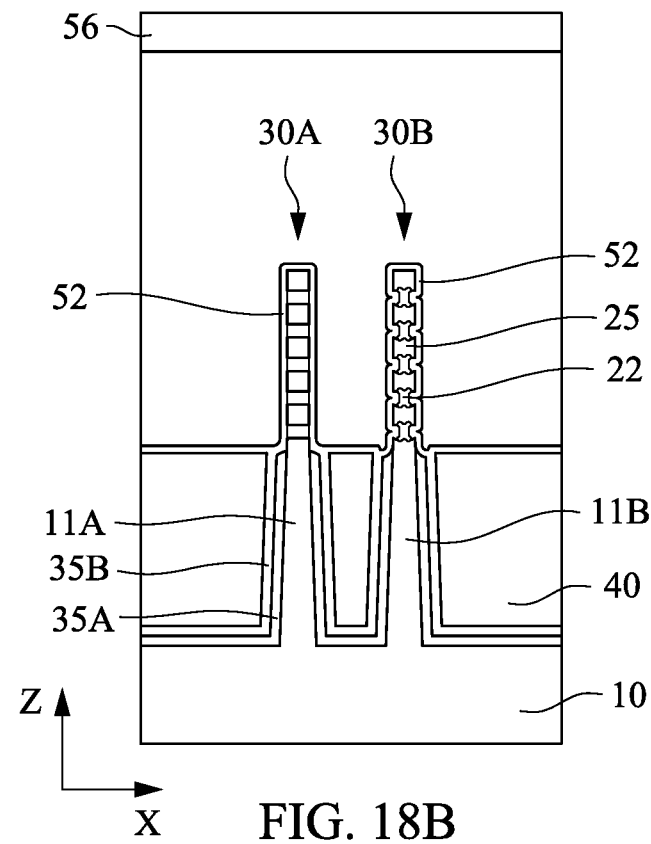
Figure 18C:
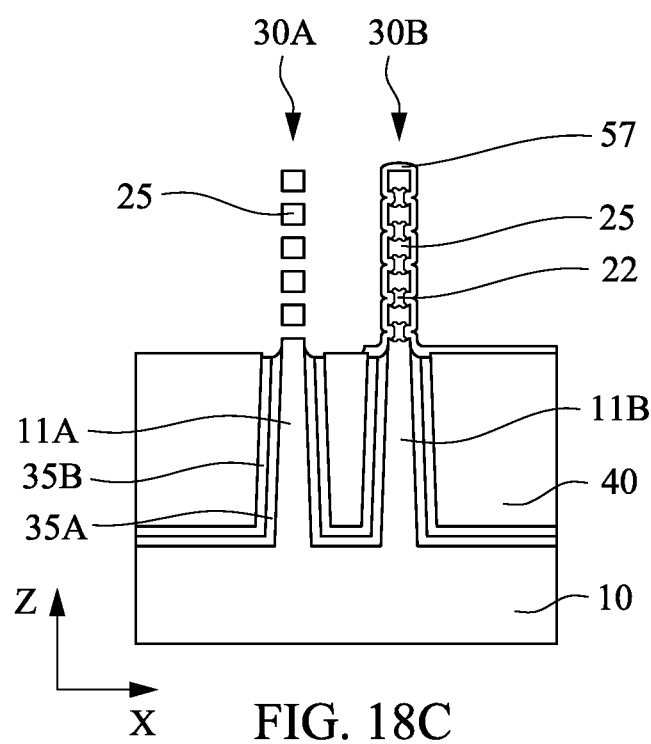
Figure 18D:
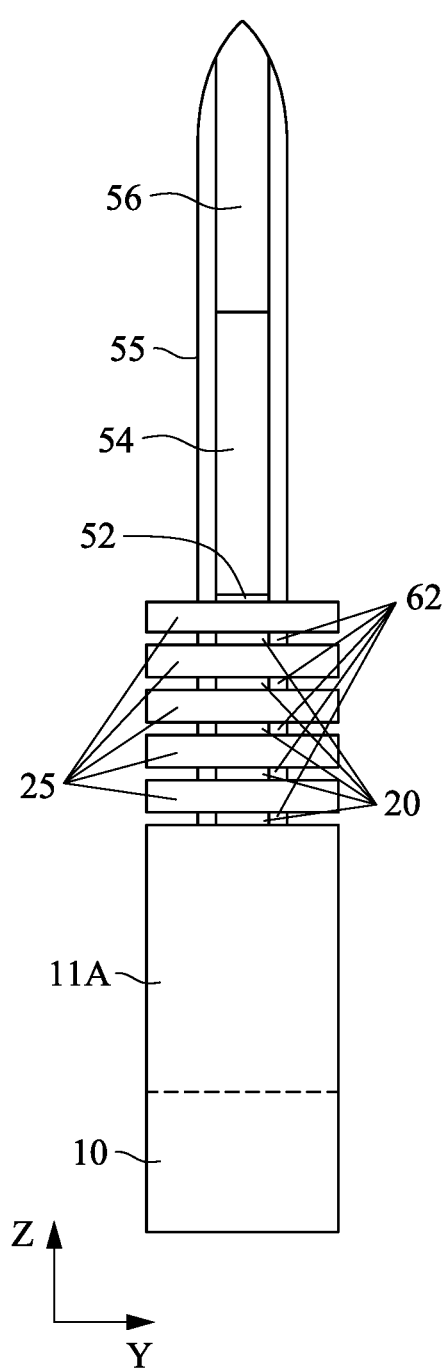
Figure 18E:
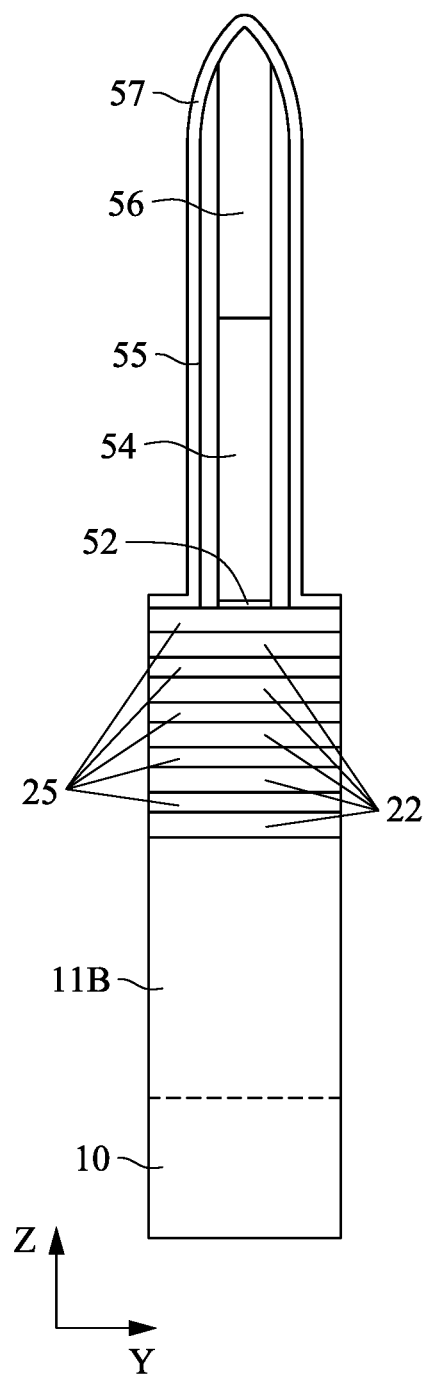
Figure 19A:
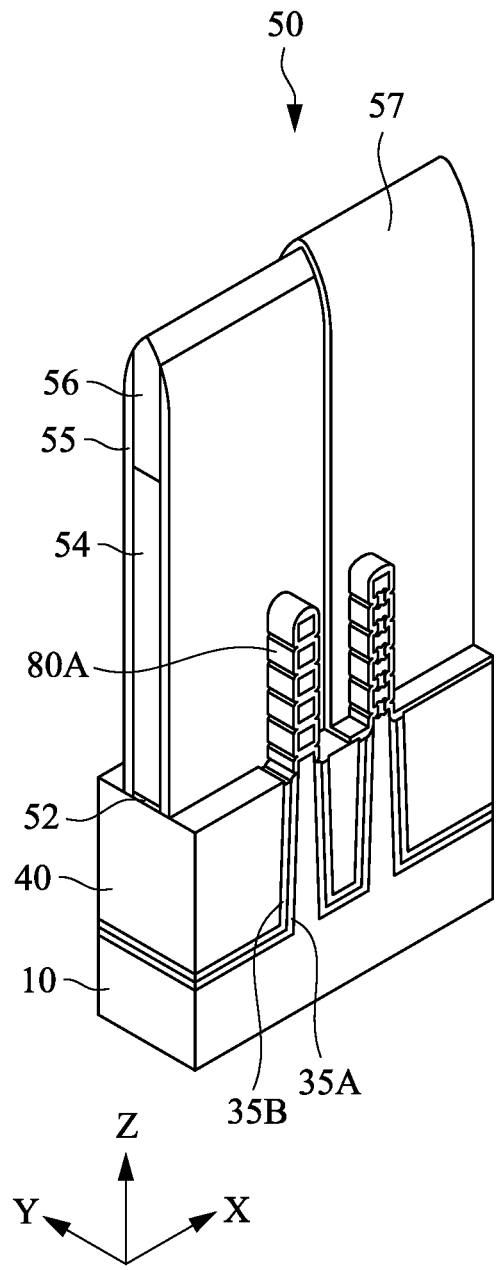
FIGS. 19A, 19B, 19C, 19D and 19E show various views of one of the various stages of a sequential manufacturing process for a GAA FET device according to an embodiment of the present disclosure.
Figure 19B:
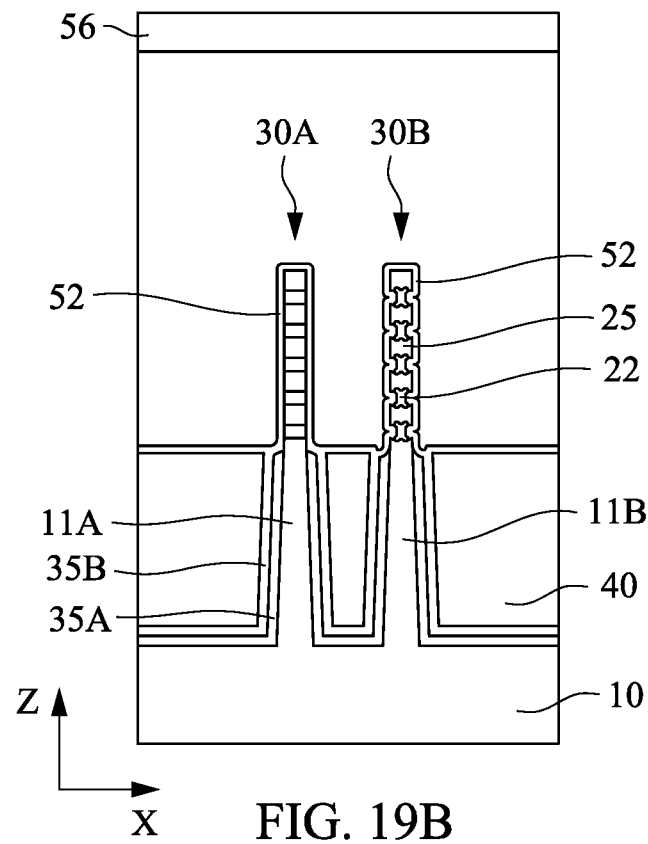
Figure 19C:
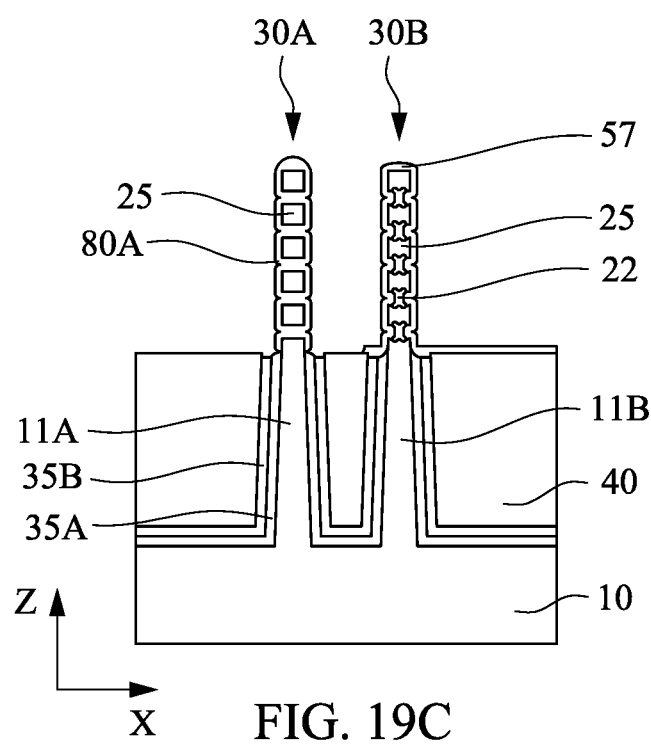
Figure 19D:
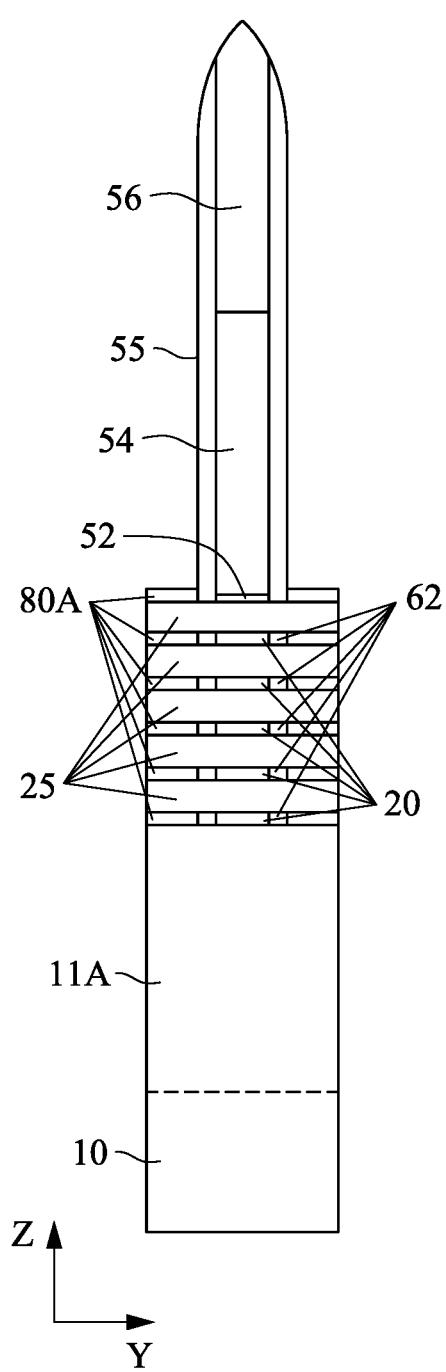
Figure 19E:
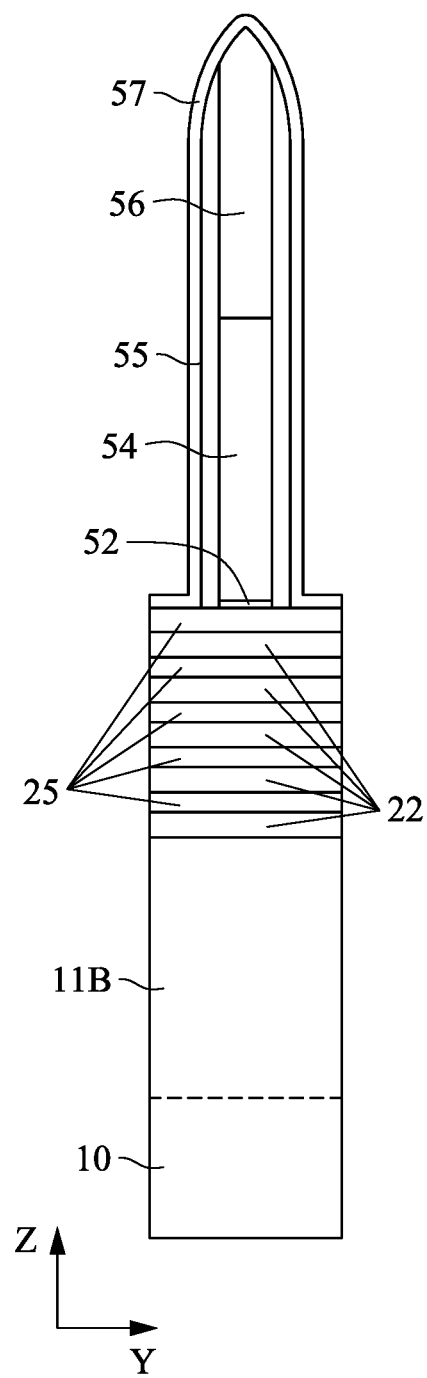
Figure 20A:
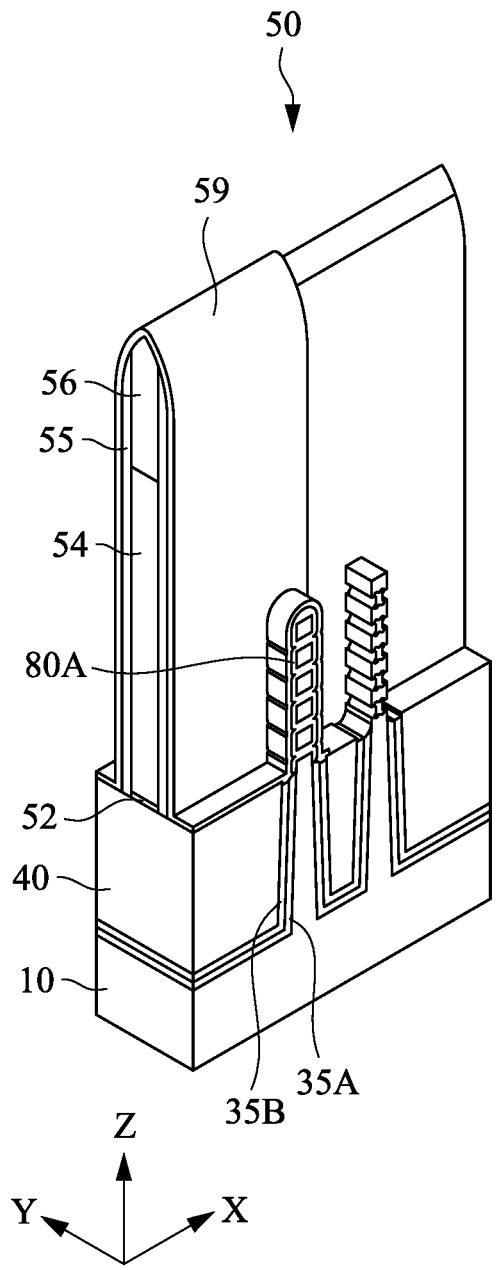
FIGS. 20A, 20B, 20C, 20D and 20E show various views of one of the various stages of a sequential manufacturing process for a GAA FET device according to an embodiment of the present disclosure.
Figure 20B:
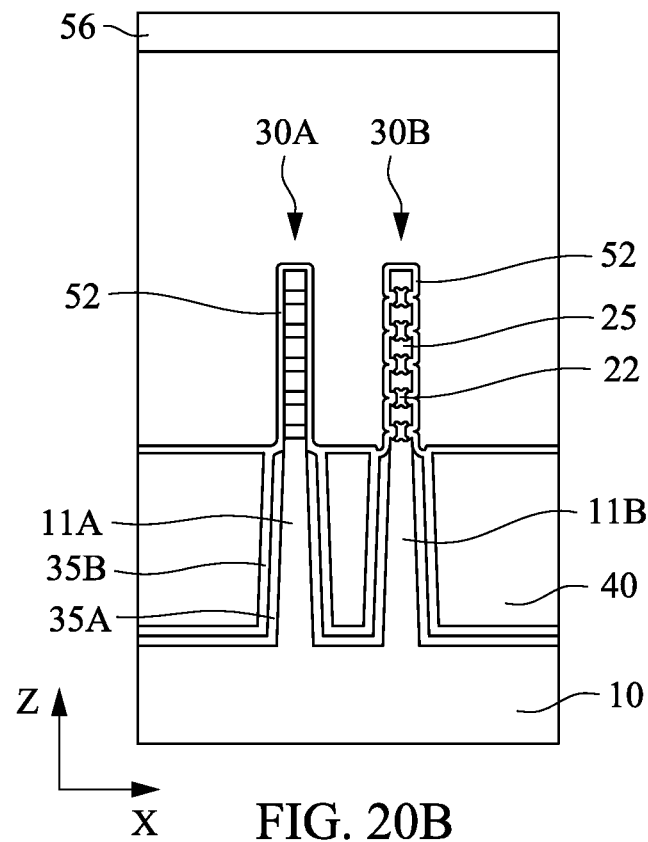
Figure 20C:
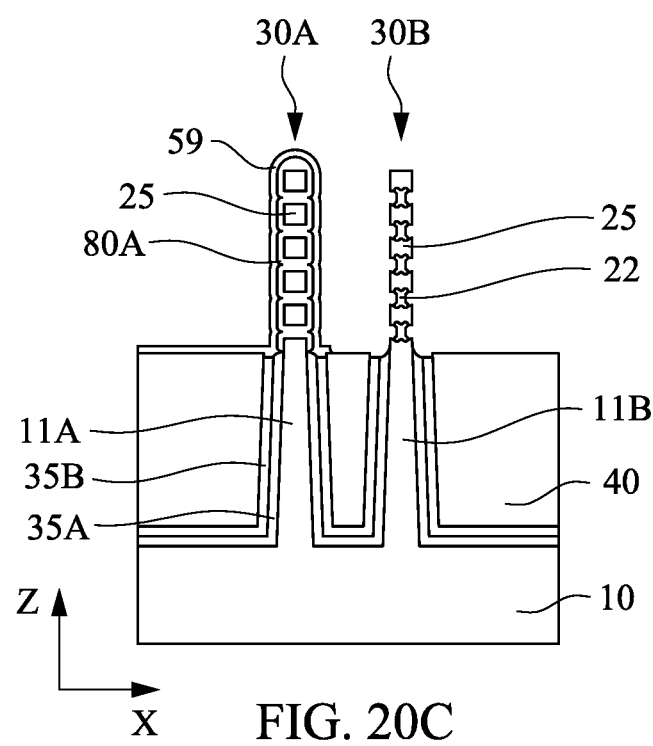
Figure 20D:
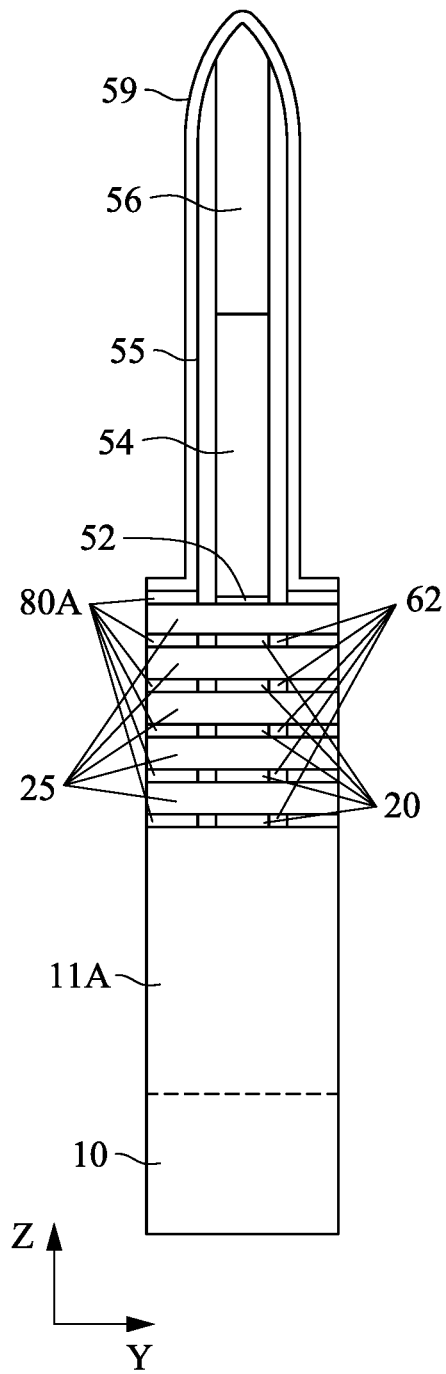
Figure 20E:
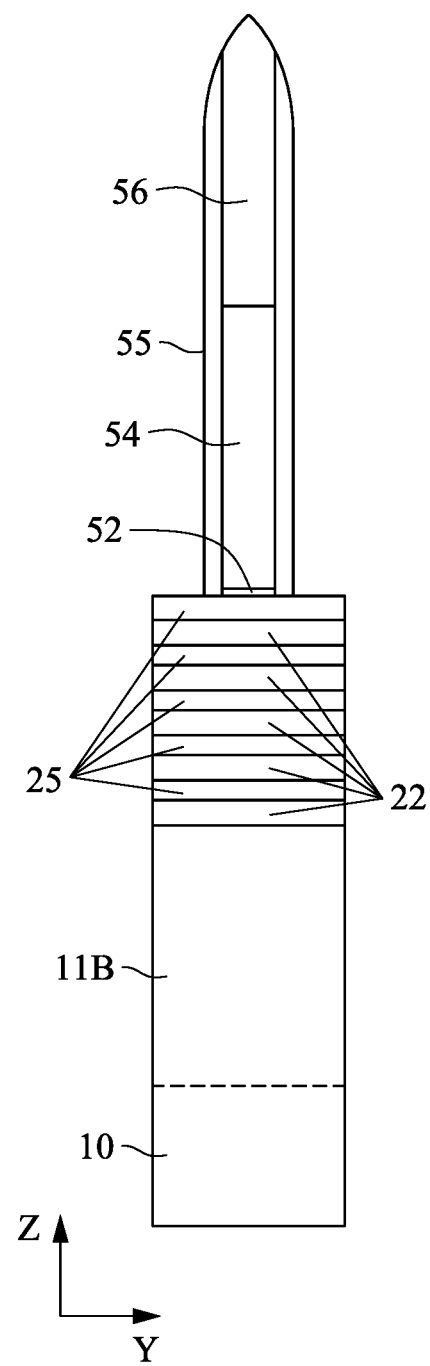
Figure 21A:
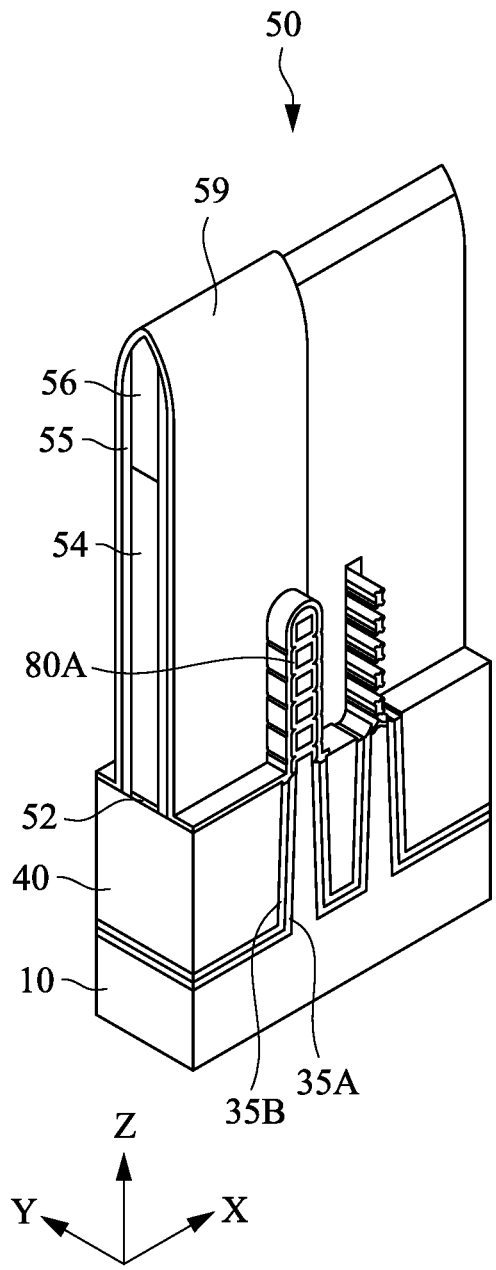
FIGS. 21A, 21B, 21C, 21D and 21E show various views of one of the various stages of a sequential manufacturing process for a GAA FET device according to an embodiment of the present disclosure.
Figure 21B:
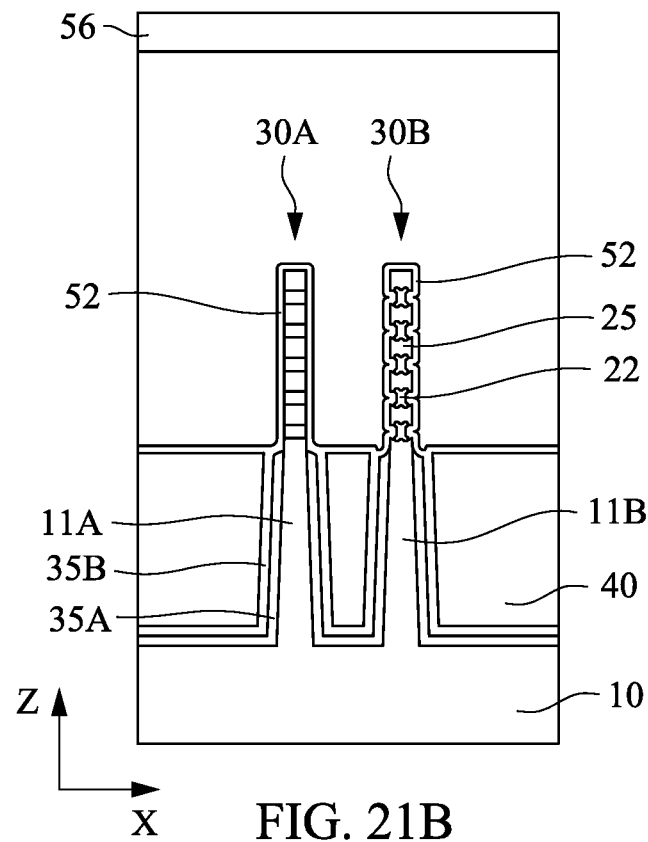
Figure 21C:
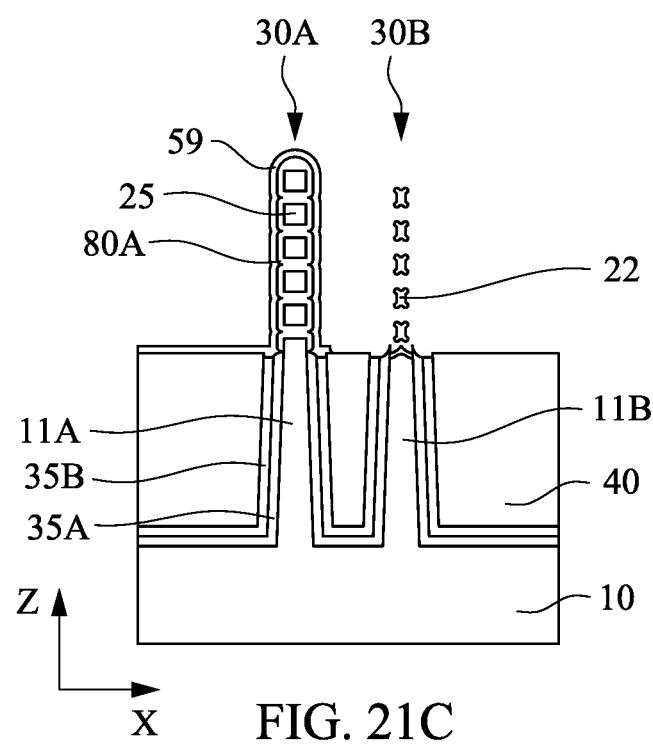
Figure 21D:
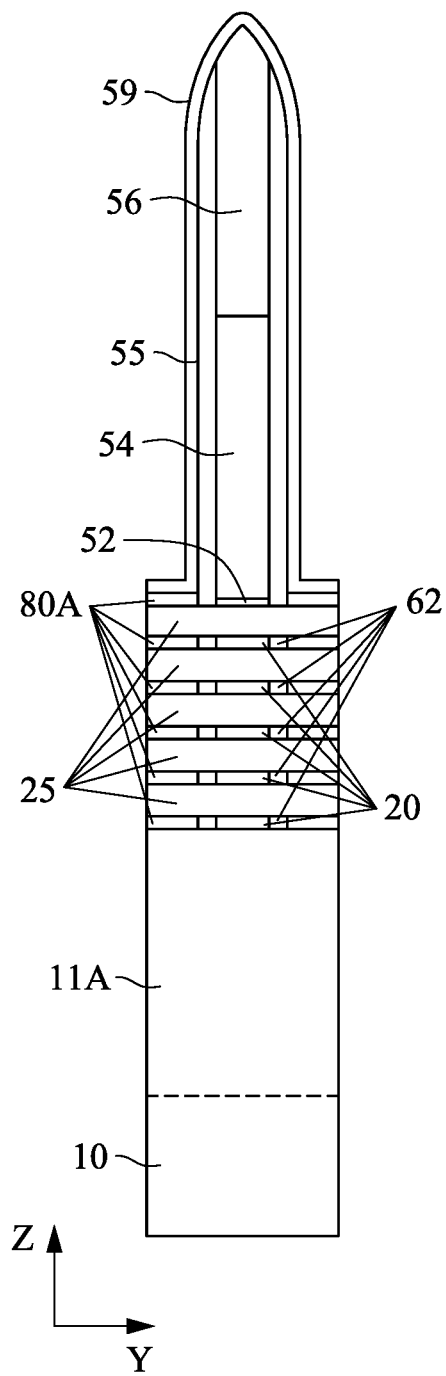
Figure 21E:
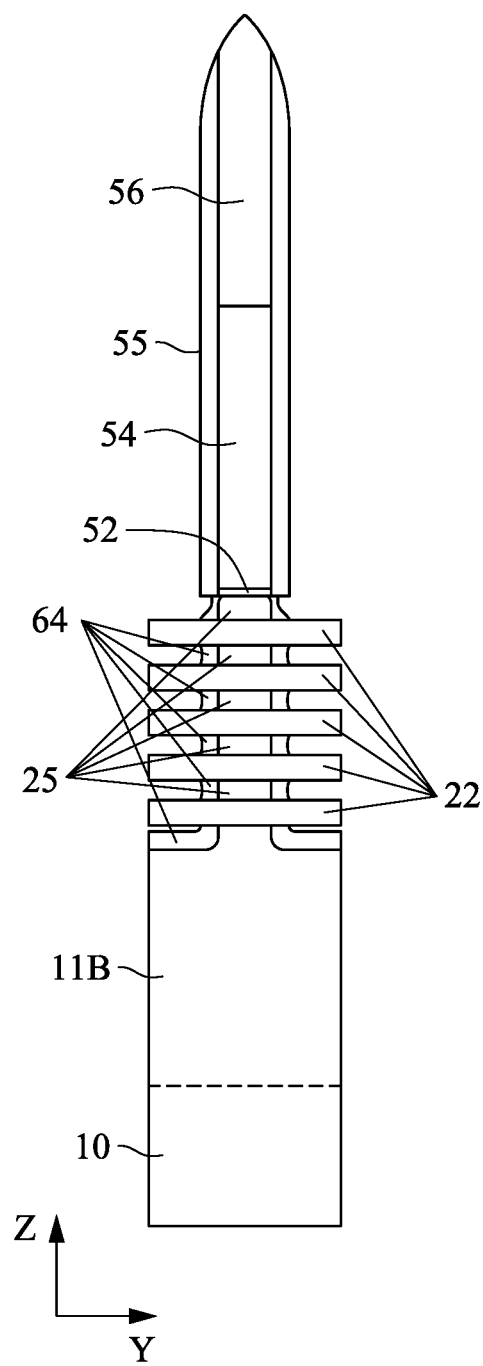
Figure 22A:
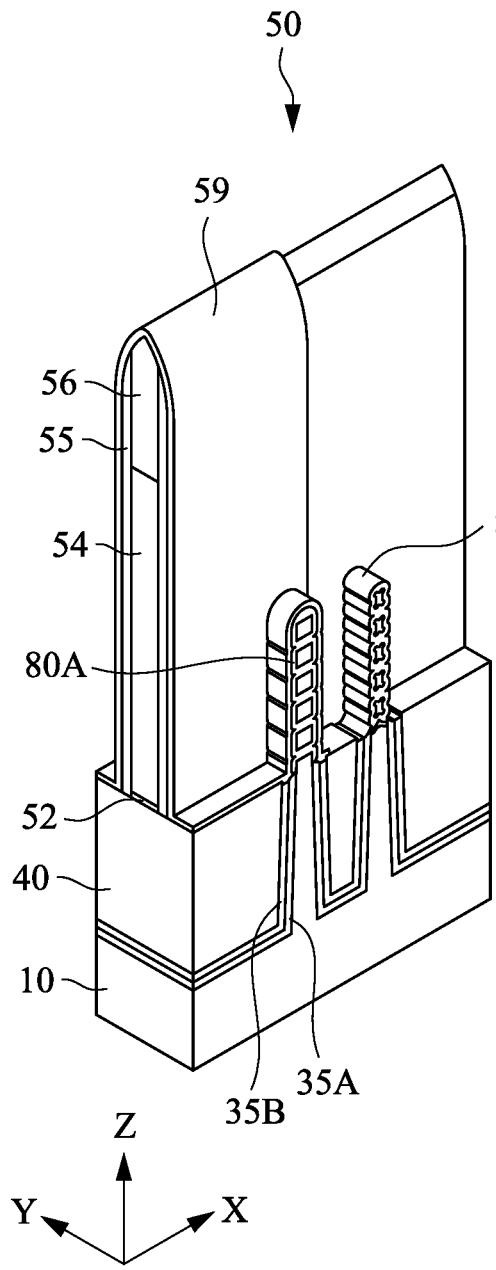
FIGS. 22A, 22B, 22C, 22D and 22E show various views of one of the various stages of a sequential manufacturing process for a GAA FET device according to an embodiment of the present disclosure.
Figure 22B:
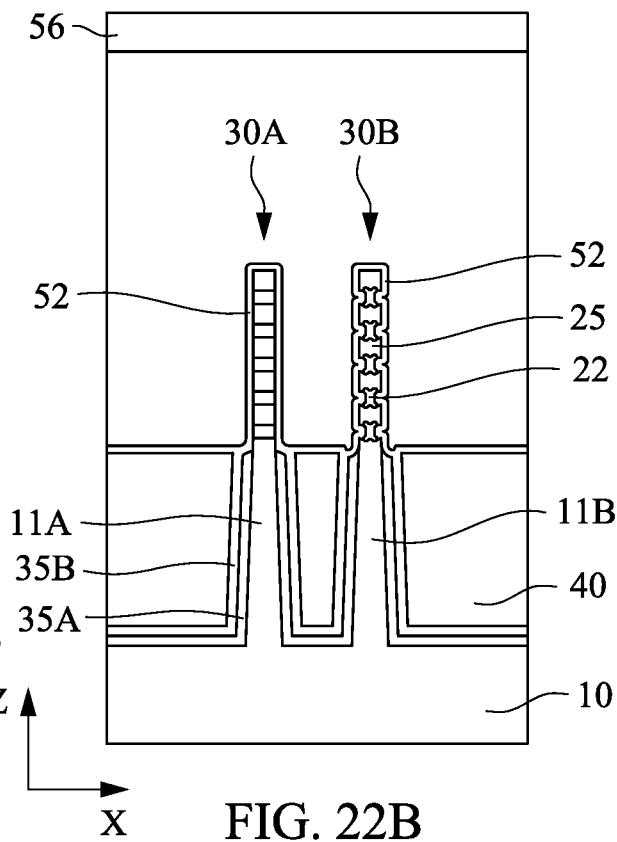
Figure 22C:
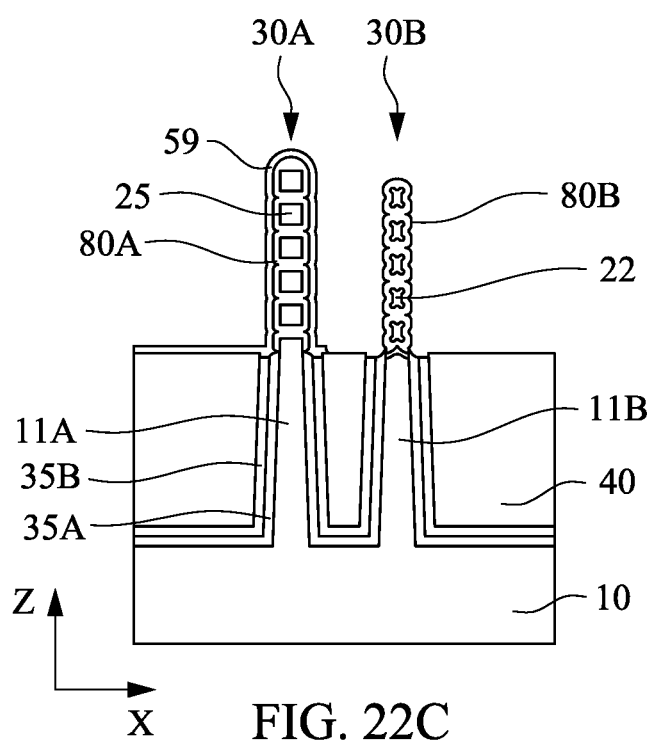
Figure 22D:
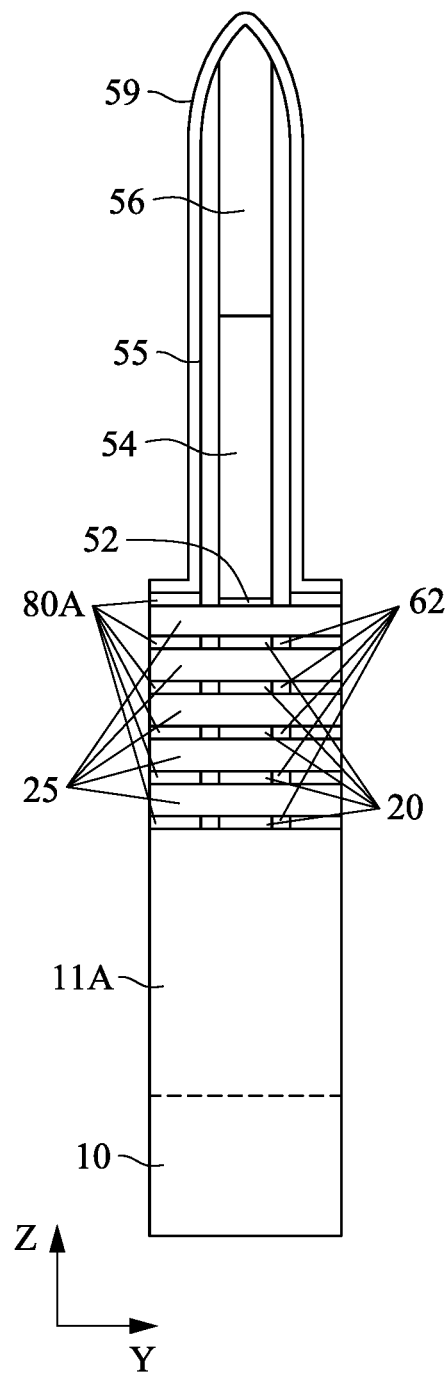
Figure 22E:
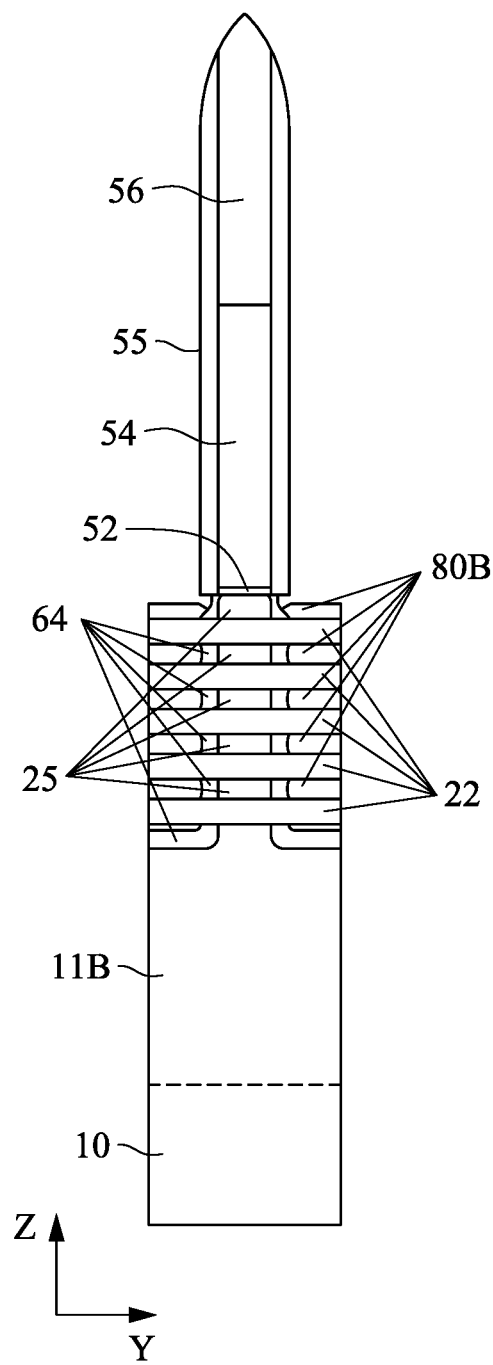
Figure 23A:
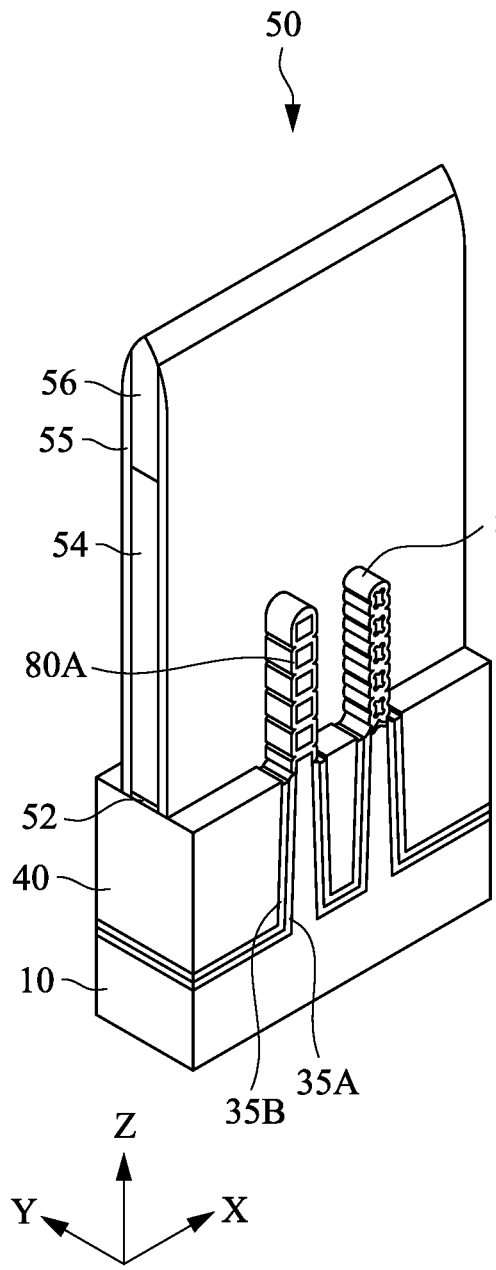
FIGS. 23A, 23B, 23C, 23D and 23E show various views of one of the various stages of a sequential manufacturing process for a GAA FET device according to an embodiment of the present disclosure.
Figure 23B:
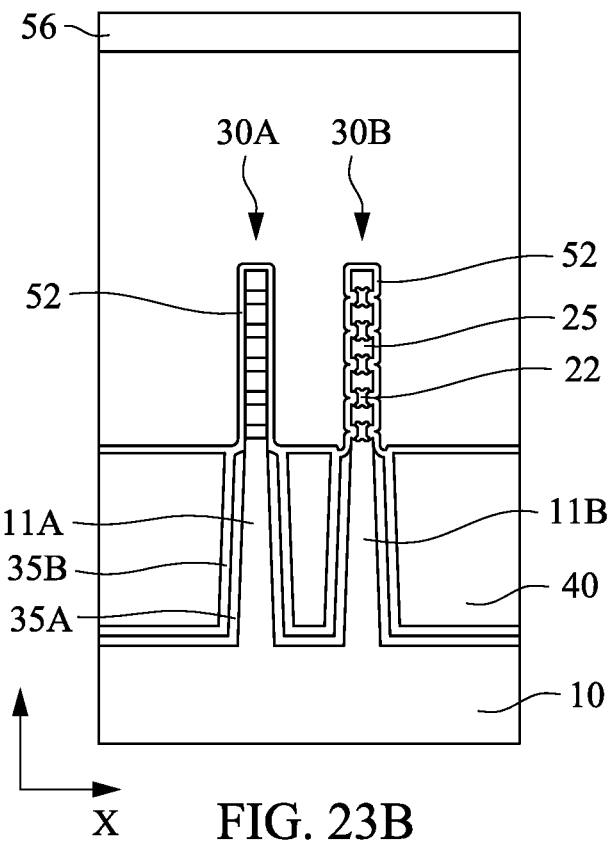
Figure 23C:
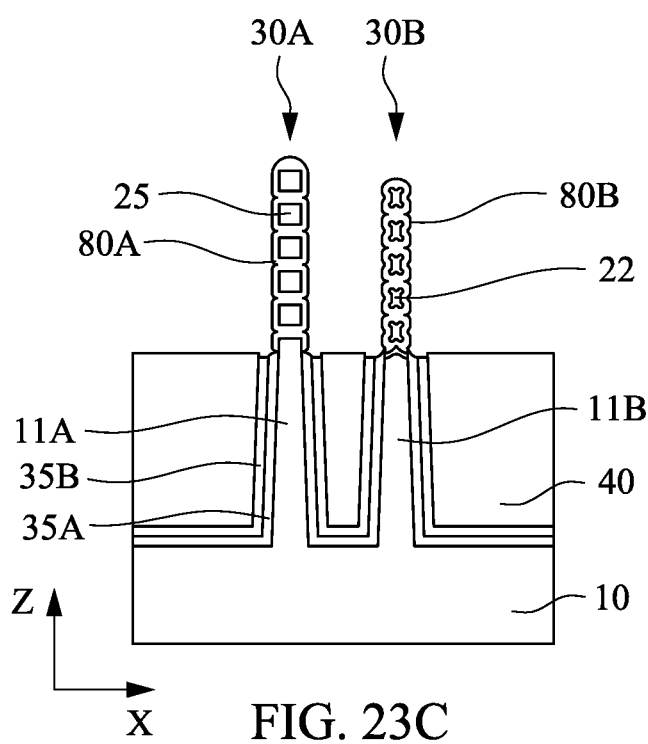
Figure 23D:
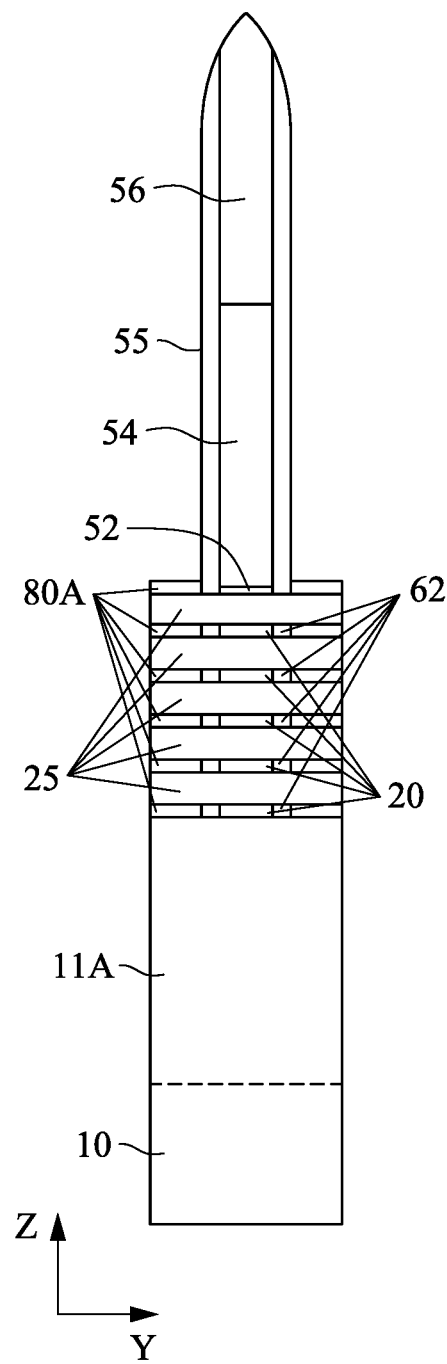
Figure 23E:
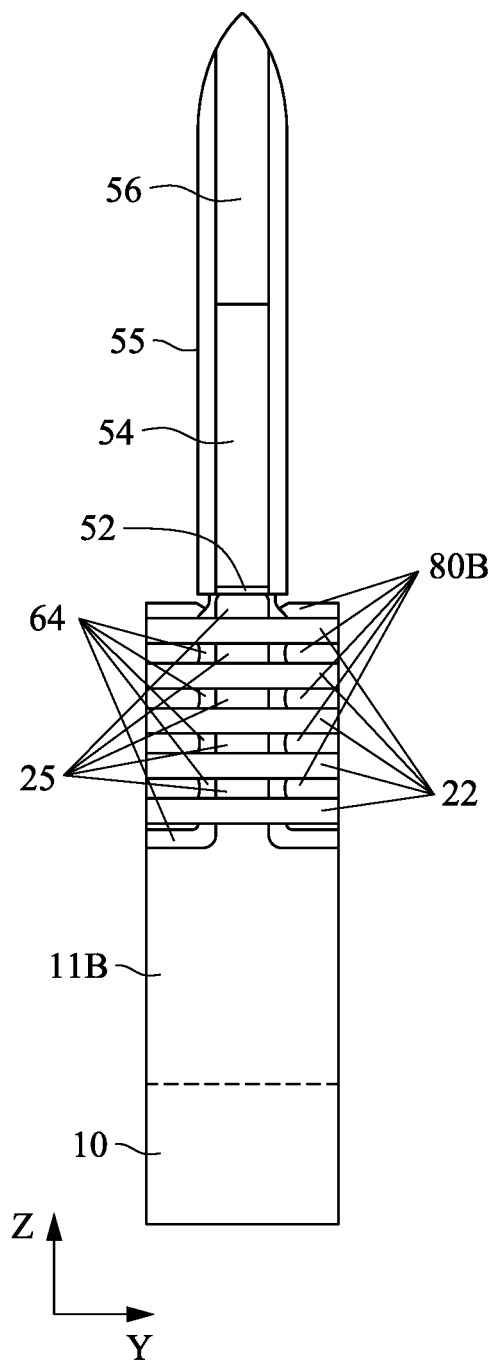
Figure 24A:
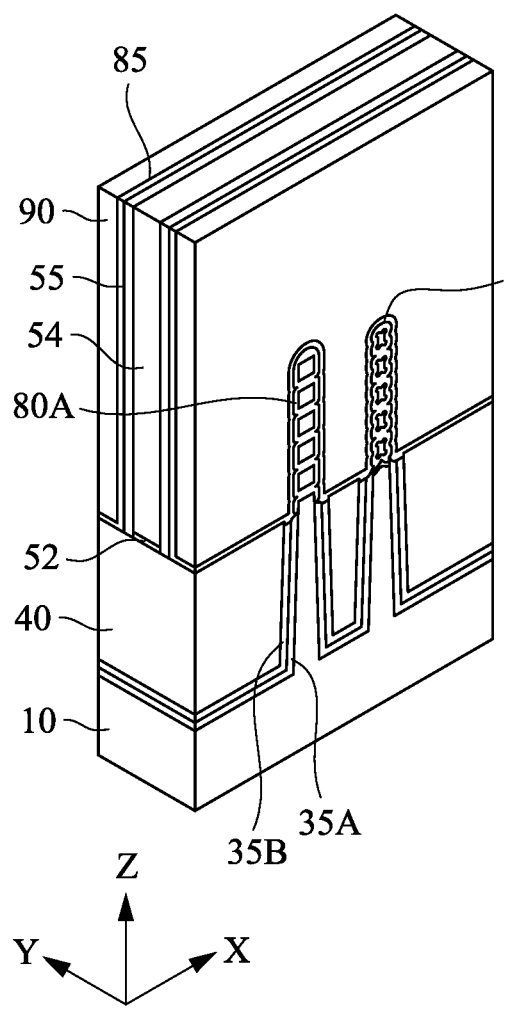
FIGS. 24A, 24B, 24C, 24D and 24E show various views of one of the various stages of a sequential manufacturing process for a GAA FET device according to an embodiment of the present disclosure.
Figure 24B:
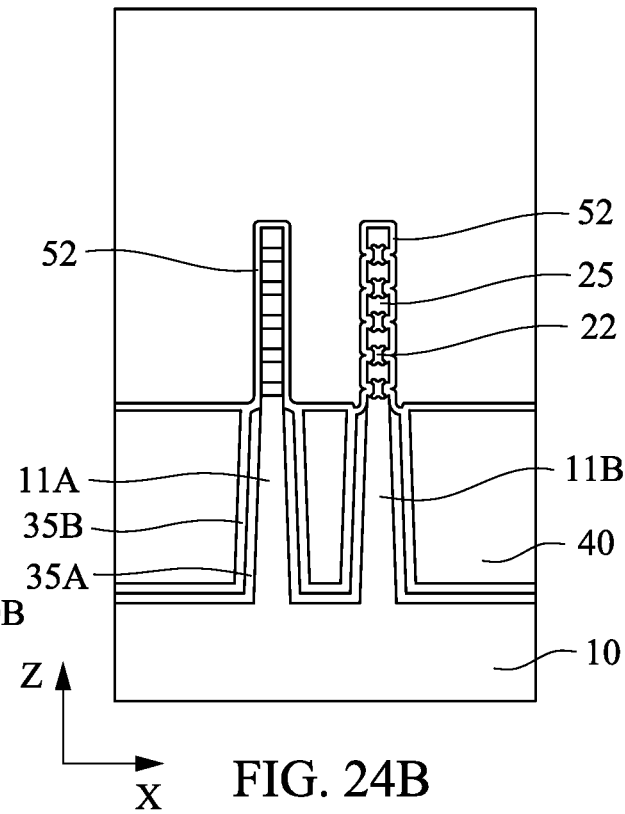
Figure 24C:
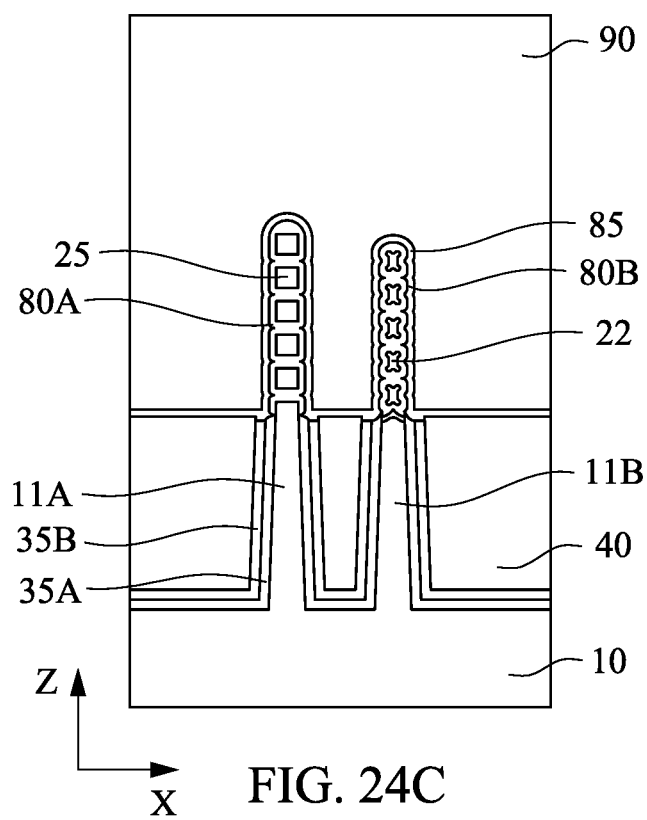
Figure 24D:
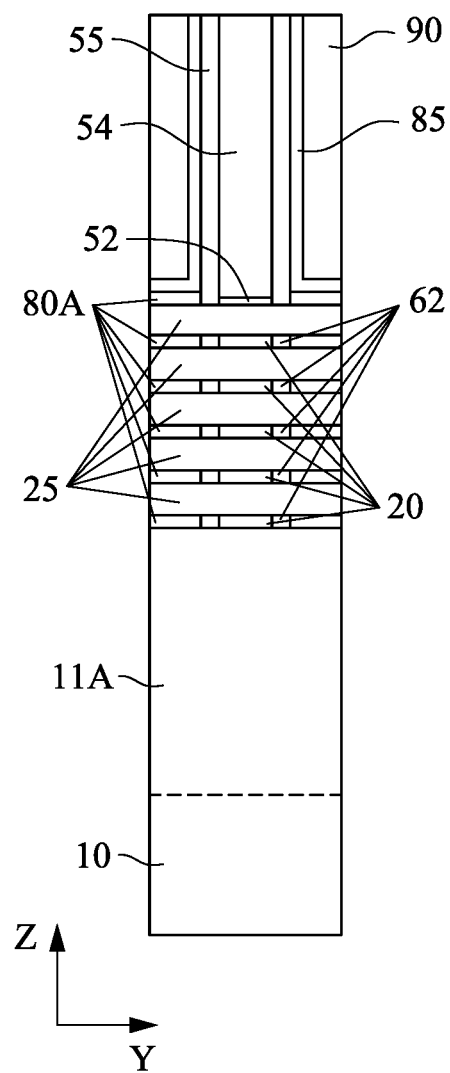
Figure 24E:
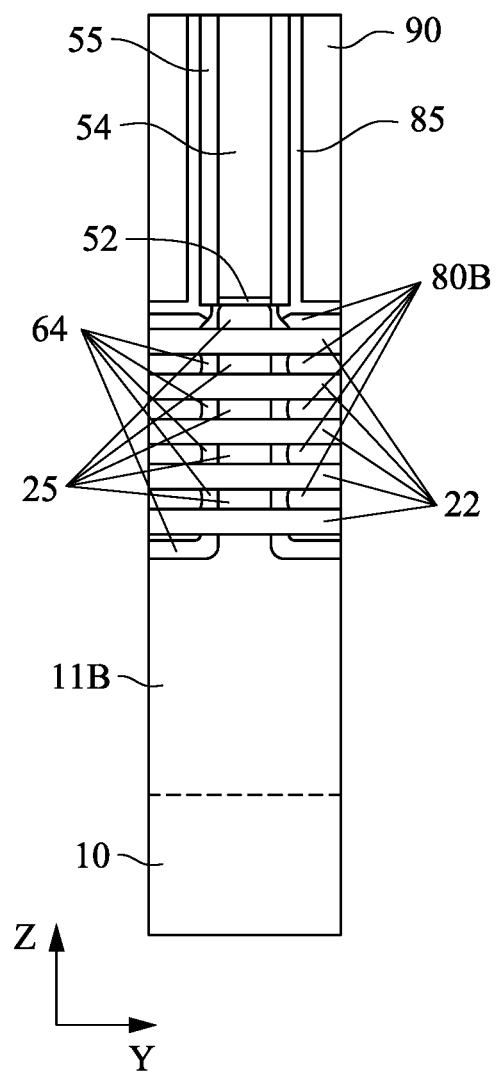
Figure 25A:
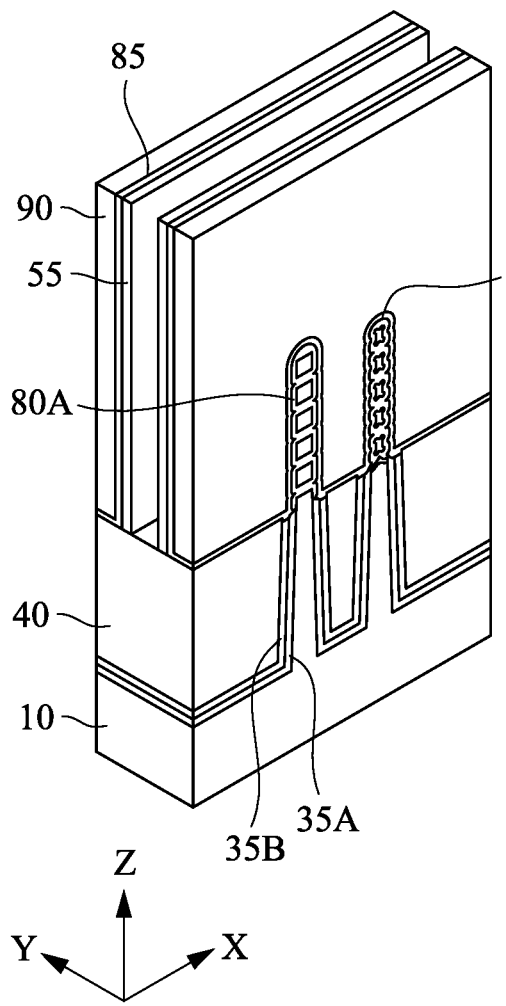
FIGS. 25A, 25B, 25C, 25D and 25E show various views of one of the various stages of a sequential manufacturing process for a GAA FET device according to an embodiment of the present disclosure.
Figure 25B:
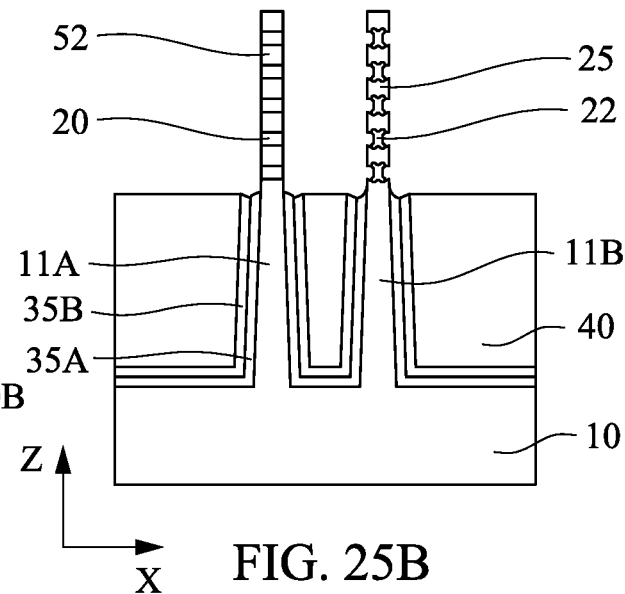
Figure 25C:
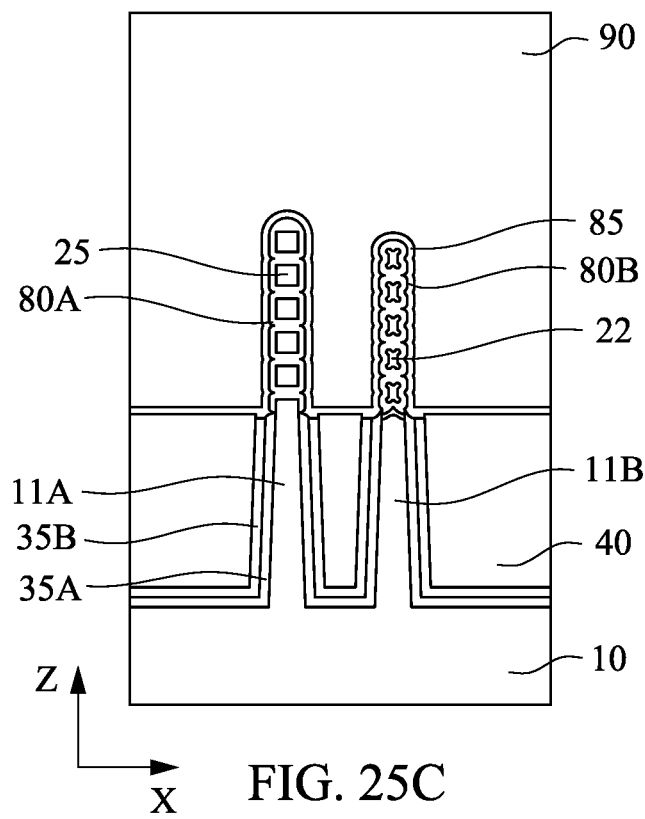
Figure 25D:
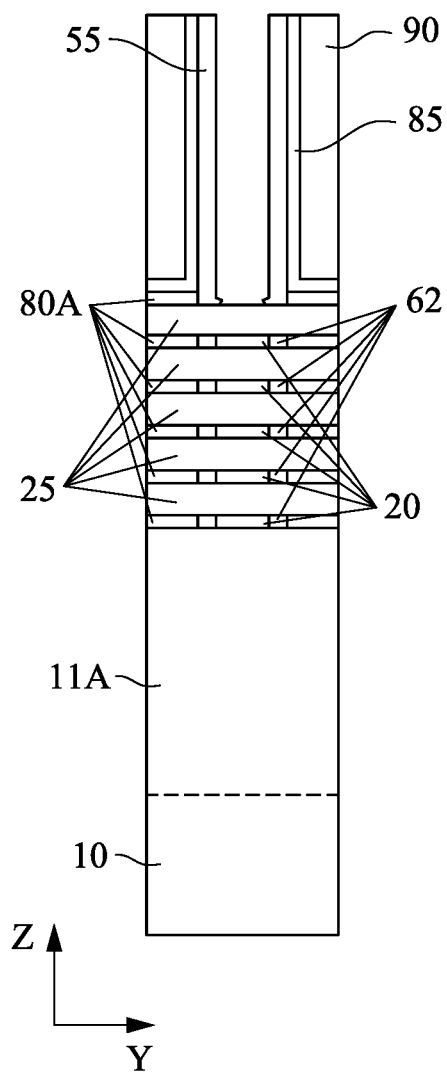
Figure 25E:
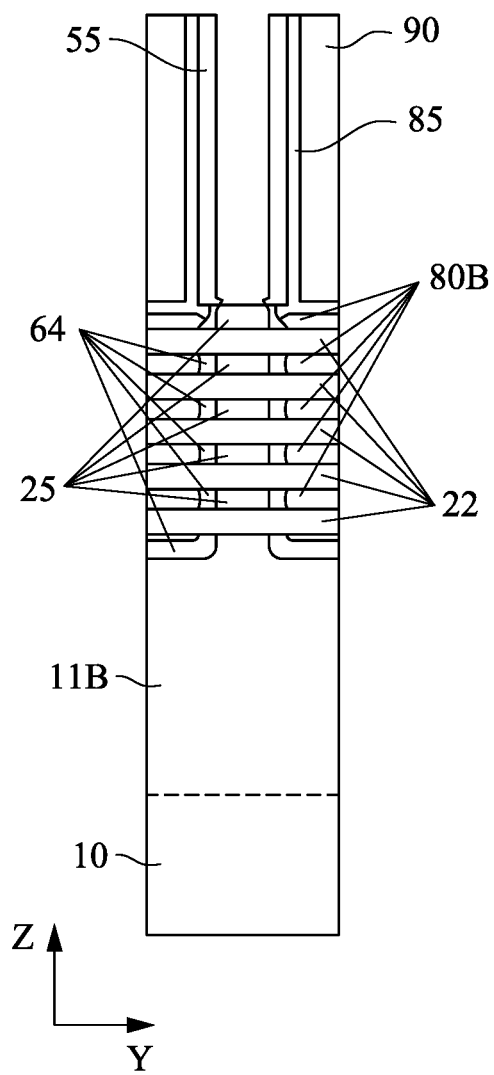

In FIGS. 14A-32E as explained below, the "A" figures (e.g., FIGS. 14A, 15A, . . . 32A) are perspective views, the "B" figures (e.g., FIGS. 14B, 15B, . . . 32B) are cross sectional views along the X direction corresponding to line X1-X1 of FIG. 14A (cutting a gate region), the "C" figures (e.g., FIGS. 14C, 15C, . . . 32C) are cross sectional views along the X direction corresponding to line X2-X2 of FIG. 14A (cutting a source/drain region), the "D" figures (e.g., FIGS. 14D, 15D, . . . 32D) are cross sectional views along the Y direction corresponding to line Y1-Y1 of FIG. 32A (cutting fin structure 30A), and the "E" figures (e.g., FIGS. 14E, 14E, . . . 32E) are cross sectional views along the Y direction corresponding to line Y2-Y2 of FIG. 14A (cutting fin structure 30B).

FIGS. 14A-14E illustrate a structure after a sacrificial gate structure 50 is formed over the exposed fin structures 30A and 30B. The sacrificial gate structure 50 includes a sacrificial gate electrode 54 and the sacrificial gate dielectric layer 52. The sacrificial gate structure 50 is formed over a portion of the fin structures which is to be a channel region. The sacrificial gate structure 50 defines the channel region of the GAA FET.

The sacrificial gate structure 50 is formed by first blanket depositing the sacrificial gate dielectric layer 52 over the fin structures 30A and 30B. A sacrificial gate electrode layer is then blanket deposited on the sacrificial gate dielectric layer and over the fin structures 30, such that the fin structures 30 are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer 56 is formed over the sacrificial gate electrode layer. The mask layer 56 includes one or more of a SiN layer and a silicon oxide layer.

Next, a patterning operation is performed on the mask layer and sacrificial gate electrode layer is patterned into the sacrificial gate structure 50, as shown in FIGS. 14A-14E. The sacrificial gate structure includes the sacrificial gate dielectric layer 52, the sacrificial gate electrode layer 54 (e.g., poly silicon), and the mask layer 56. By patterning the sacrificial gate structure, the stacked layers of the first and second semiconductor layers are partially exposed on opposite sides of the sacrificial gate structure, thereby defining source/drain (S/D) regions, as shown in FIGS. 14A-14E. In this disclosure, a source and a drain are interchangeably used and the structures thereof are substantially the same. In FIGS. 14A-14E, one sacrificial gate structure 50 is formed, but the number of the sacrificial gate structures is not limited to one. Two or more sacrificial gate structures are arranged in the Y direction in some embodiments. In certain embodiments, one or more dummy sacrificial gate structures are formed on both sides of the sacrificial gate structures to improve pattern fidelity.

After the sacrificial gate structure 50 is formed, a blanket layer 53 of an insulating material for gate sidewall spacers 55 is conformally formed by using CVD or other suitable methods, as shown in FIGS. 15A-15E. The blanket layer 53 is deposited in a conformal manner so that it is formed to have substantially equal thicknesses on vertical surfaces, such as the sidewalls, horizontal surfaces, and the top of the sacrificial gate structure. In some embodiments, the blanket layer 53 is deposited to a thickness in a range from about 2 nm to about 10 nm. In some embodiments, the insulating material of the blanket layer 53 is a silicon nitride-based material, such as SiN, SiON, SiOCN or SiCN and combinations thereof. In certain embodiments, the insulating material is one of SiOC, SiCON and SiCN.

Further, as shown in FIGS. 16A-16E, gate sidewall spacers 55 are formed on opposite sidewalls of the sacrificial gate structures by anisotropic etching. After the blanket layer 53 is formed, anisotropic etching is performed on the blanket layer 53 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 56 may be exposed from the sidewall spacers. In some embodiments, an isotropic etching process may be subsequently performed to remove the insulating material from the upper portions of the S/D region of the exposed fin structures 30.

Subsequently, a second protective layer 57 is formed to cover the region corresponding to the second fin structure 30B (for a p-channel region) as shown in FIGS. 17A-17E.

In some embodiments, the second protective layer 57 includes a silicon nitride-based material, such as silicon nitride, SiON, SiOCN or SiCN and combinations thereof, formed by CVD, including LPCVD and PECVD, PVD, ALD, or other suitable process. In certain embodiments, the second protective layer 57 is made of silicon nitride. After a blanket layer is formed, the second protective layer 57 is formed by using one or more lithography and etching operations.

Then, the first semiconductor layers 20 in the S/D region of the first fin structure 30A are removed. Further, the first semiconductor layers 20 are horizontally recessed (etched) so that edges of the first semiconductor layers 20 are located substantially below the gate sidewall spacers 55. In some embodiments, end portions (edges) of the first semiconductor layers 20 have a concave shape such as a V-shape or a U-shape. The depth of the recessing of the first semiconductor layers 20 from the plane including one gate sidewall spacer 55 is in a range from about 5 nm to about 10 nm. The etching of the second semiconductor layer 20 includes wet etching and/or dry etching. A wet etchant such as an ammonium hydroxide ($NH_4OH$) solution can be used to selectively etch the first semiconductor layers 20.

Then, a dielectric material layer is formed, and one or more etching operations are performed to form dielectric inner spacers 62 on end faces of the recessed first semiconductor layers 20, as shown in FIGS. 18A-18E. In some embodiments, the dielectric inner spaces 62 include a silicon nitride-based material, such as SiN, SiON, SiOCN or SiCN and combinations thereof and are different from the material of the gate sidewall spacers 55. In certain embodiments, the dielectric inner spacers 62 are made of silicon nitride. The dielectric material layer can be formed using CVD, including LPCVD and PECVD, PVD, ALD, or other suitable processes. In certain embodiments, the etching is an isotropic etching in some embodiments. The maximum thickness along the Y direction of the dielectric inner spacers 62 is in a range from about 0.5 nm to about 5 nm in some embodiments.

Next, as shown in FIGS. 19A-19E, a first source/drain (S/D) epitaxial layer 80A is formed wrapping around the second semiconductor layer 25 in the S/D region. The first S/D epitaxial layer 80A includes one or more layers of Si, SiP, SiC and SiCP for an n-channel FET. The first S/D epitaxial layer 80A is formed by an epitaxial growth method using CVD, ALD or molecular beam epitaxy (MBE). After the first S/D epitaxial layer 80A is formed, the second protective layer 57 is removed.

Subsequently, a third protective layer 59 is formed to cover the region corresponding to the first fin structure 30A (for an n-channel region) as shown in FIGS. 20A-20E. In some embodiments, the third protective layer 59 includes silicon nitride-based material, such as silicon nitride, SiON, SiOCN or SiCN and combinations thereof, formed by CVD, including LPCVD and PECVD, PVD, ALD, or other suitable process. In certain embodiments, the third protective layer 59 is made of silicon nitride. After a blanket layer is formed, the third protective layer 59 is formed by using one or more lithography and etching operations.

Then, the second semiconductor layers 25 in the S/D region of the second fin structure 30B are removed. Further, the second semiconductor layers 25 are horizontally recessed (etched) so that edges of the second semiconductor layers 25 are located substantially below the gate sidewall spacers 55. In some embodiments, end portions (edges) of the second semiconductor layers 25 have a concave shape such as a V-shape or a U-shape. The depth of the recessing of the second semiconductor layers 25 from the plane including one gate sidewall spacer 55 is in a range from about 5 nm to about 10 nm. The etching of the second semiconductor layer 25 includes wet etching and/or dry etching. A wet etchant such as a tetramethylammonium hydroxide (TMAH) solution can be used to selectively etch the second semiconductor layers 25.

Then, a dielectric material layer is formed, and one or more etching operations are performed to form dielectric inner spacers 64 on end faces of the recessed second semiconductor layers 25, as shown in FIGS. 21A-21E. In some embodiments, the dielectric inner spaces 64 include a silicon nitride-based material, such as SiN, SiON, SiOCN or SiCN and combinations thereof and are different from the material of the gate sidewall spacers 55. In certain embodiments, the dielectric inner spacers 64 are made of silicon nitride. The dielectric material layer can be formed using CVD, including LPCVD and PECVD, PVD, ALD, or other suitable processes. In certain embodiments, the etching is isotropic etching. The maximum thickness along the Y direction of the dielectric inner spacers 64 is in a range from about 0.5 nm to about 5 nm in some embodiments.

Next, as shown in FIGS. 22A-22E, a second source/drain (S/D) epitaxial layer 80B is formed wrapping around the condensed first semiconductor layer 22 in the S/D region. The second S/D epitaxial layer 80B includes one or more layers of Si, SiGe and SiGeP for a p-channel FET. The second S/D epitaxial layer 80B is formed by an epitaxial growth method using CVD, ALD or molecular beam epitaxy (MBE). As shown in FIGS. 22A-22E, a part of the dielectric material layer remains between the second S/D epitaxial layer and the bottom fin structure 11B. After the second S/D epitaxial layer 80B is formed, the third protective layer 59 is removed, as shown in FIGS. 23A-23E.

Subsequently, a liner layer 85 is formed and then an interlayer dielectric (ILD) layer 90 is formed, as shown in FIGS. 24A-24E. The liner layer 85 is made of a silicon nitride-based material, such as silicon nitride, and functions as a contact etch stop layer (CESL) in the subsequent etching operations. The materials for the ILD layer 90 include compounds comprising Si, 0, C and/or H, such as silicon oxide, SiCOH and SiOC. Organic materials, such as polymers, may be used for the ILD layer 90. After the ILD layer 90 is formed, a planarization operation, such as CMP, is performed, so that the sacrificial gate electrode layer 54 is exposed, as shown in FIGS. 24A-24E.

Next, as shown in FIGS. 25A-25E, the sacrificial gate electrode layer 54 and sacrificial gate dielectric layer 52 are removed, thereby exposing a channel region of the fin structures. The ILD layer 90 protects the first and second S/D epitaxial layers 80A and 80B during the removal of the sacrificial gate structure. The sacrificial gate structure can be removed using plasma dry etching and/or wet etching. When the sacrificial gate electrode layer 54 is polysilicon and the ILD layer 90 is silicon oxide, a wet etchant such as a TMAH solution can be used to selectively remove the sacrificial gate electrode layer 54. The sacrificial gate dielectric layer 52 is thereafter removed using plasma dry etching and/or wet etching.

Figure 26A:
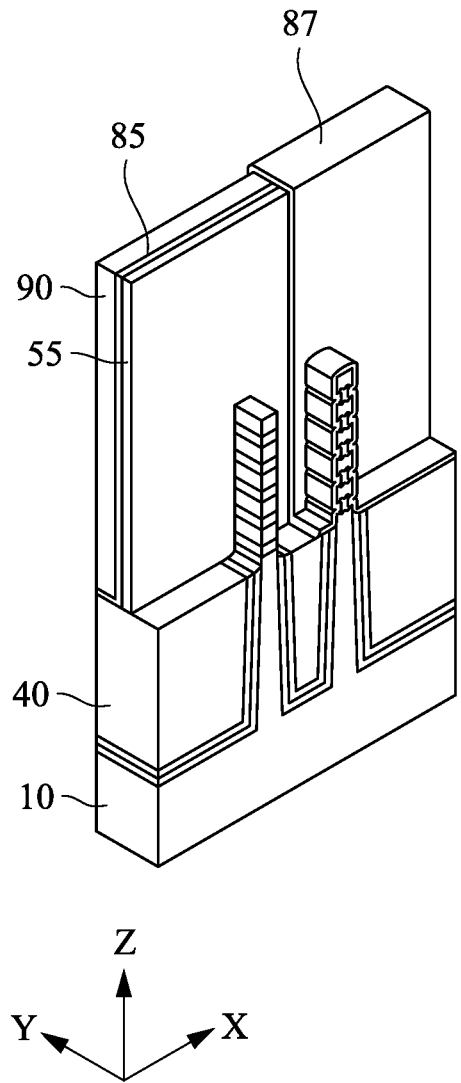
FIGS. 26A, 26B, 26C, 26D and 26E show various views of one of the various stages of a sequential manufacturing process for a GAA FET device according to an embodiment of the present disclosure.
Figure 26B:
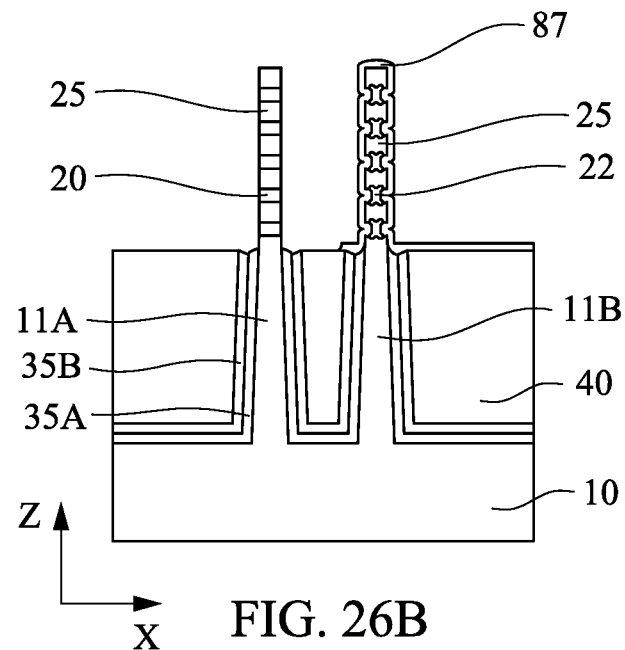
Figure 26C:
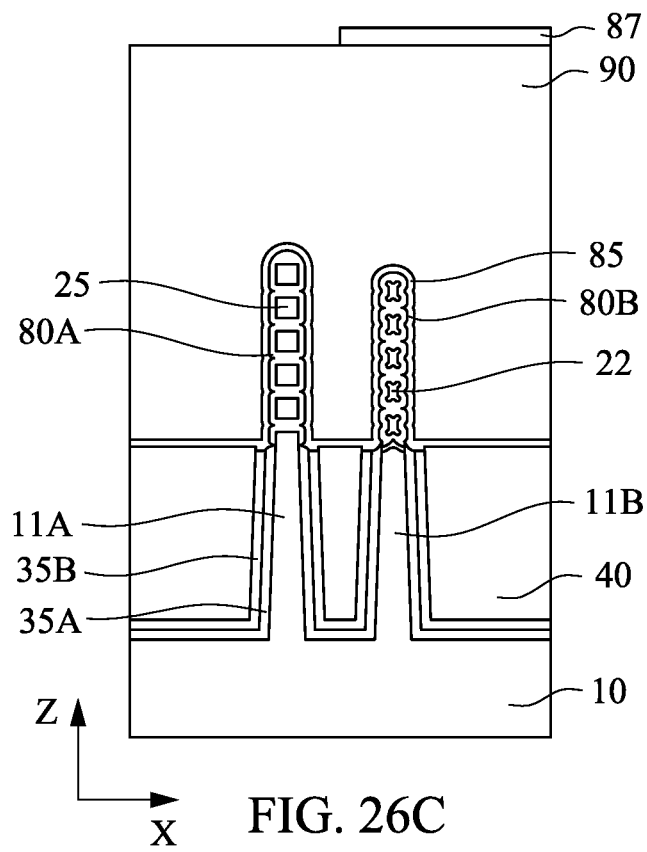
Figure 26D:
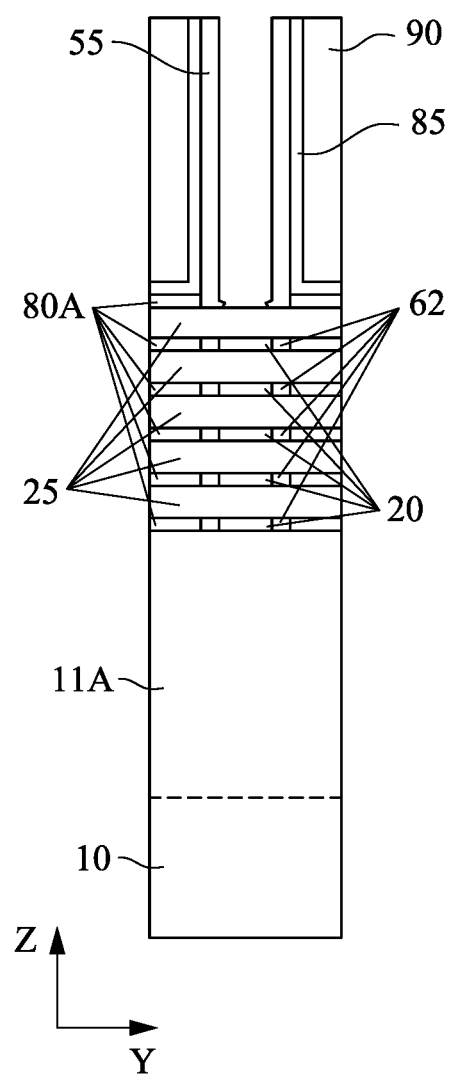
Figure 26E:
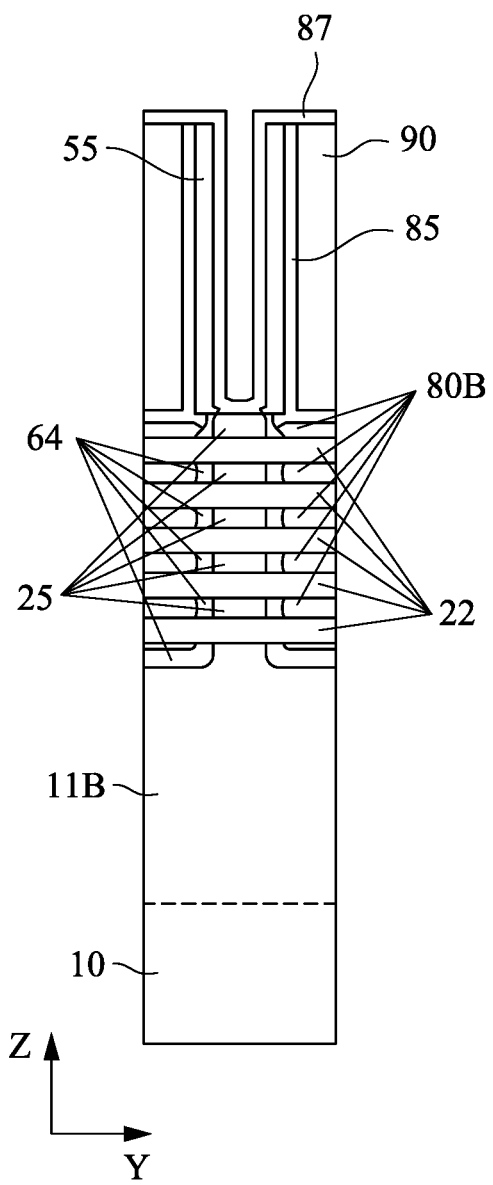
Figure 27A:
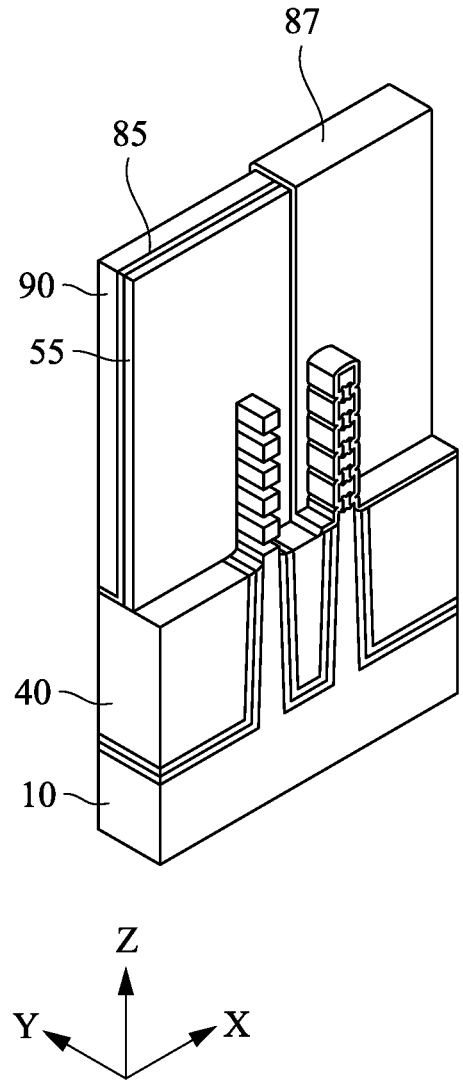
FIGS. 27A, 27B, 27C, 27D and 27E show various views of one of the various stages of a sequential manufacturing process for a GAA FET device according to an embodiment of the present disclosure.
Figure 27B:
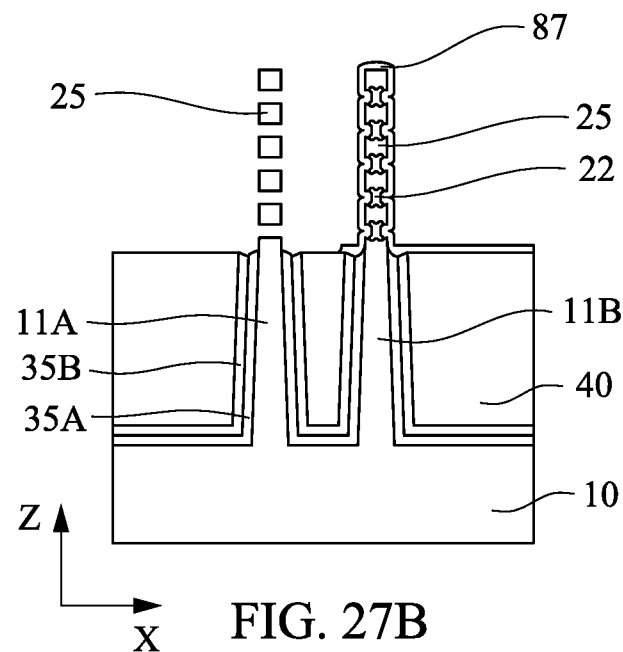
Figure 27C:
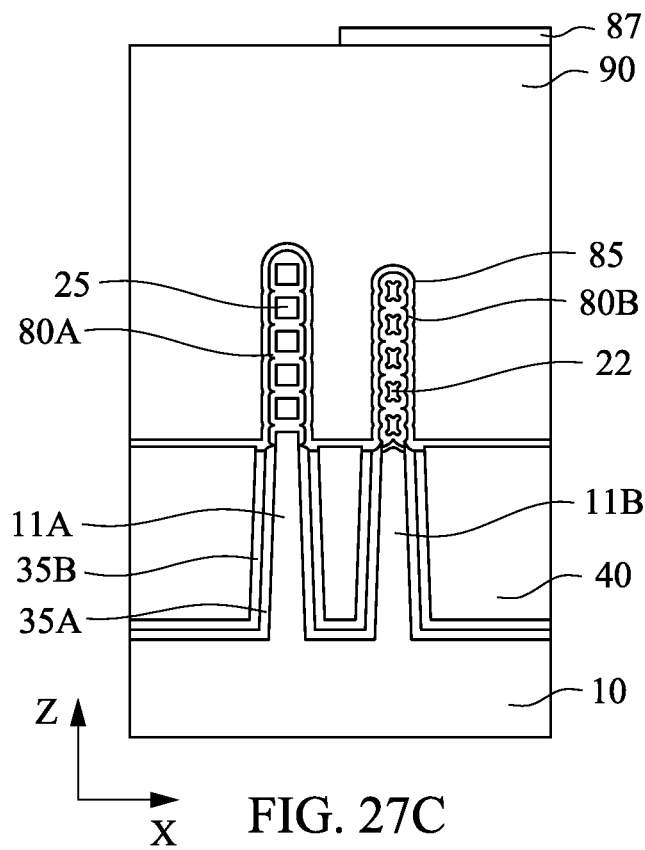
Figure 27D:
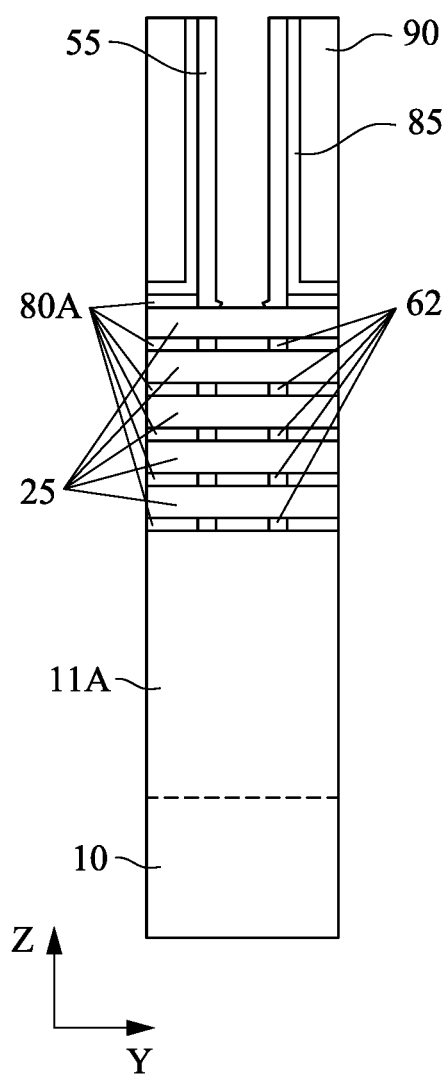
Figure 27E:
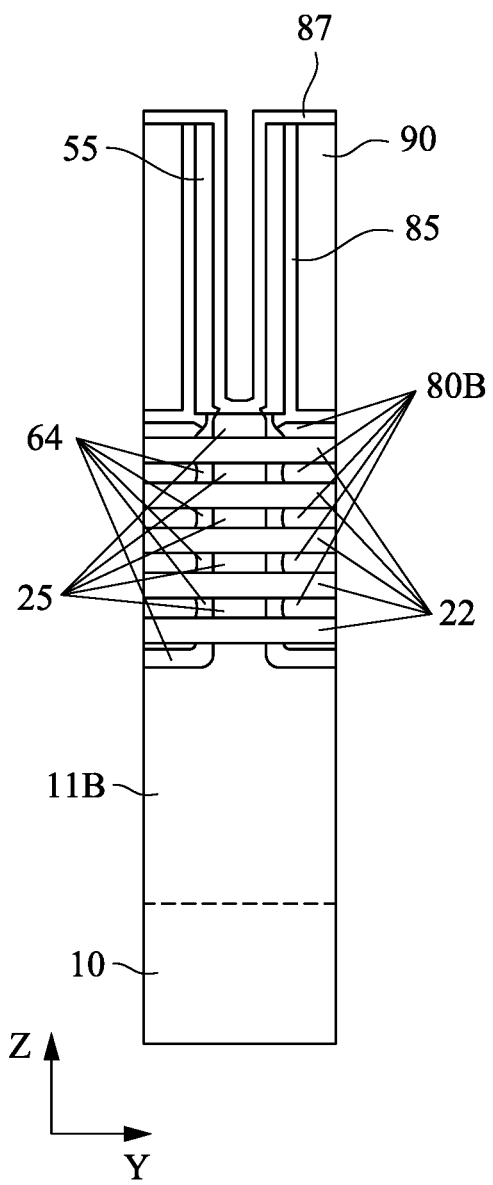
Figure 28A:
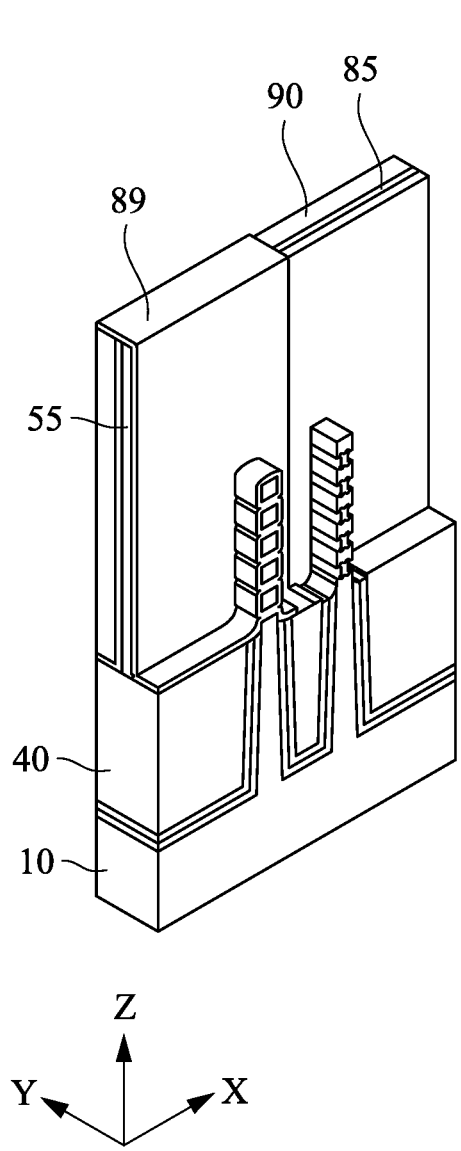
FIGS. 28A, 28B, 28C, 28D and 28E show various views of one of the various stages of a sequential manufacturing process for a GAA FET device according to an embodiment of the present disclosure.
Figure 28B:
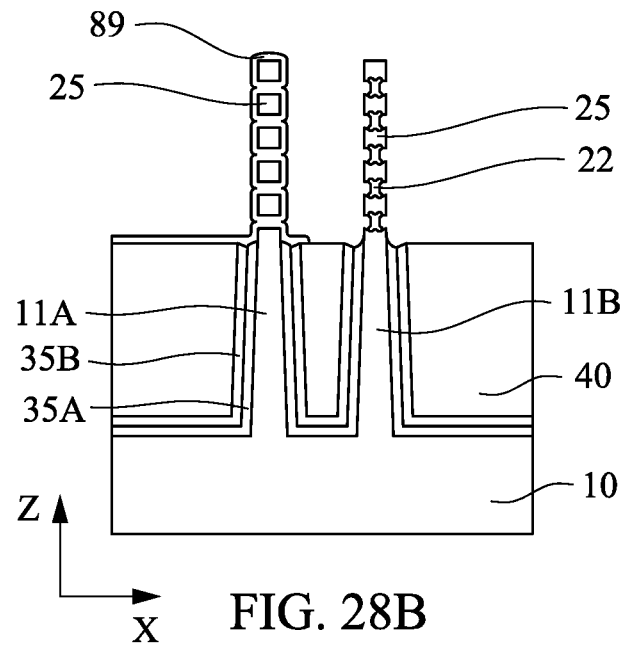
Figure 28C:
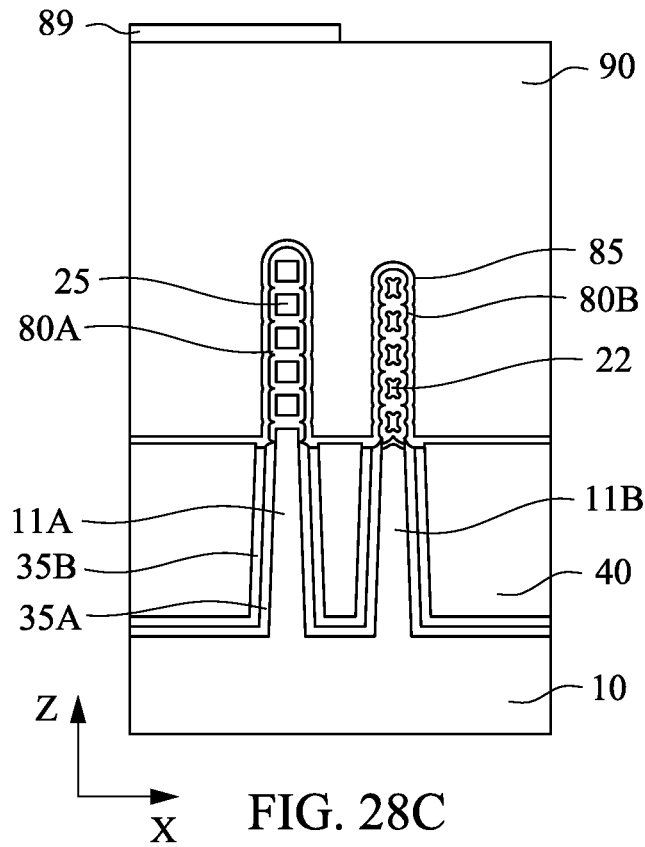
Figure 28D:
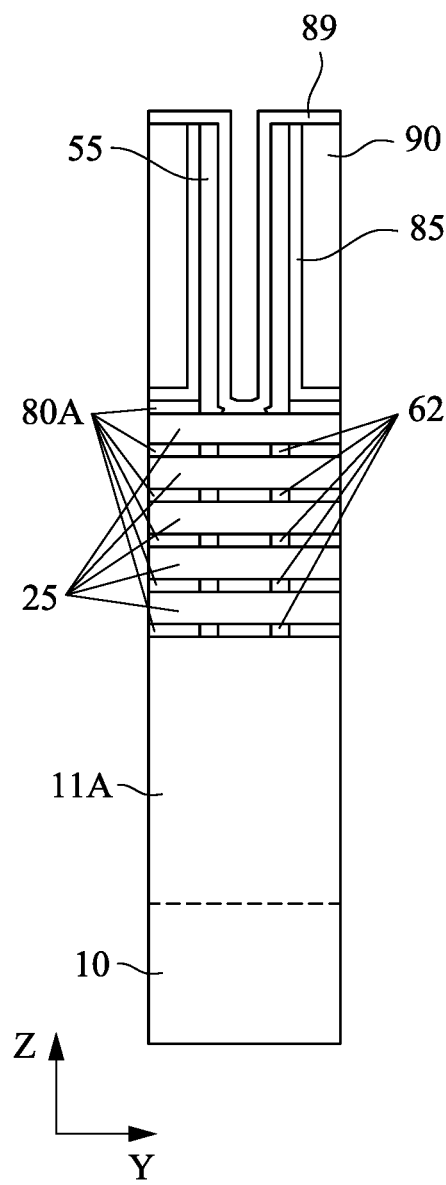
Figure 28E:
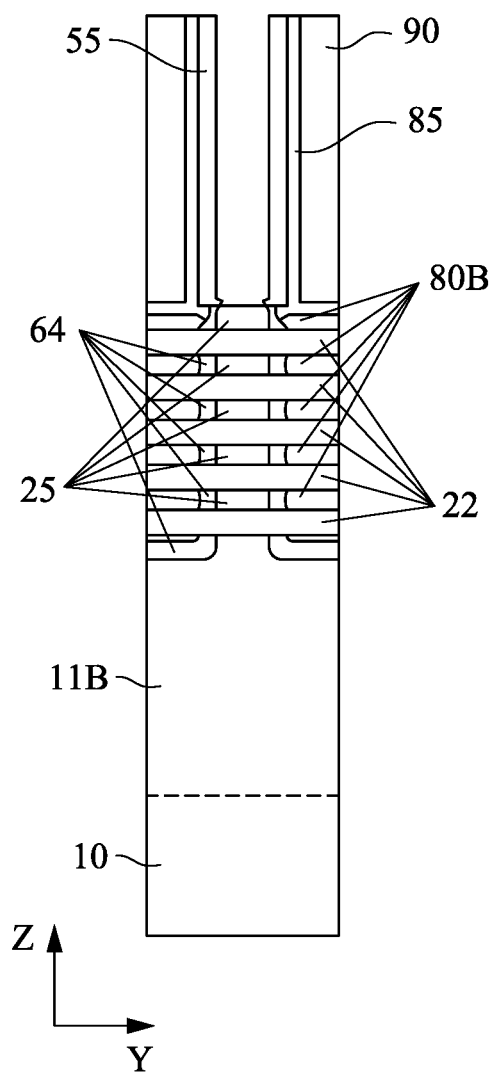
Figure 29A:
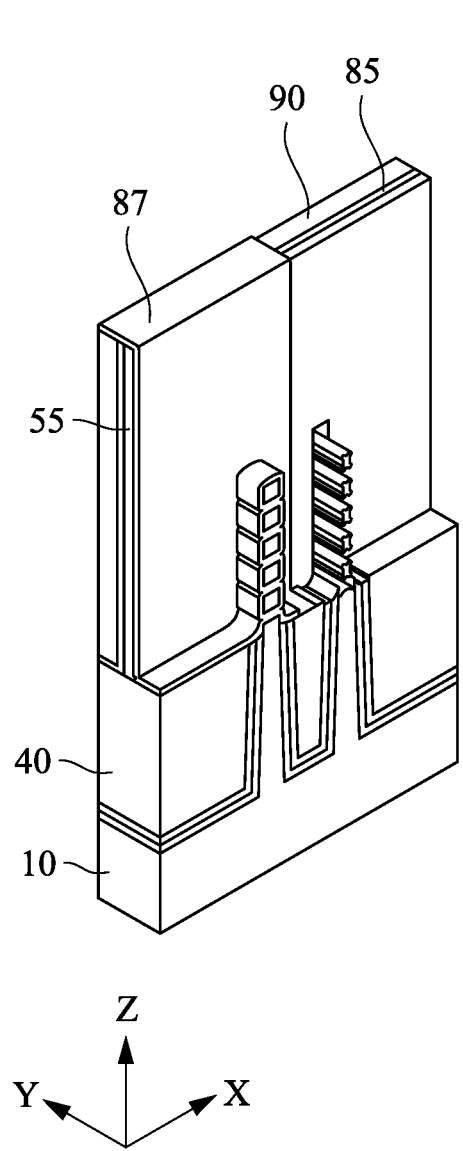
FIGS. 29A, 29B, 29C, 29D and 29E show various views of one of the various stages of a sequential manufacturing process for a GAA FET device according to an embodiment of the present disclosure.
Figure 29B:
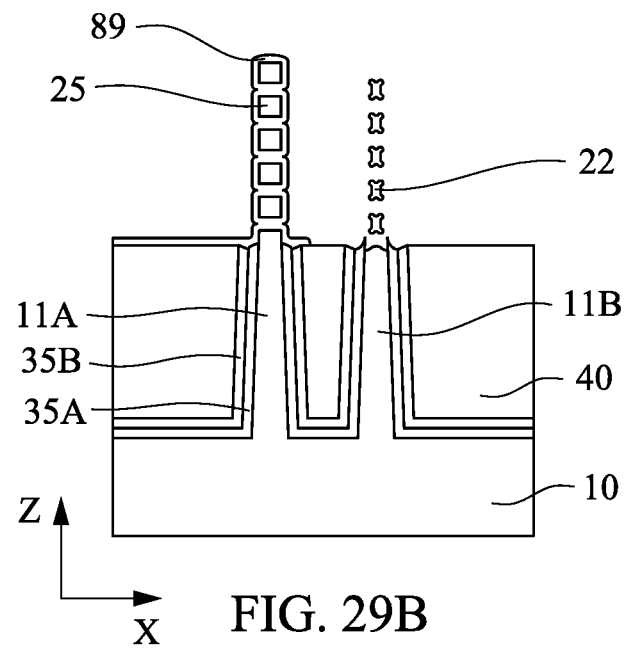
Figure 29C:
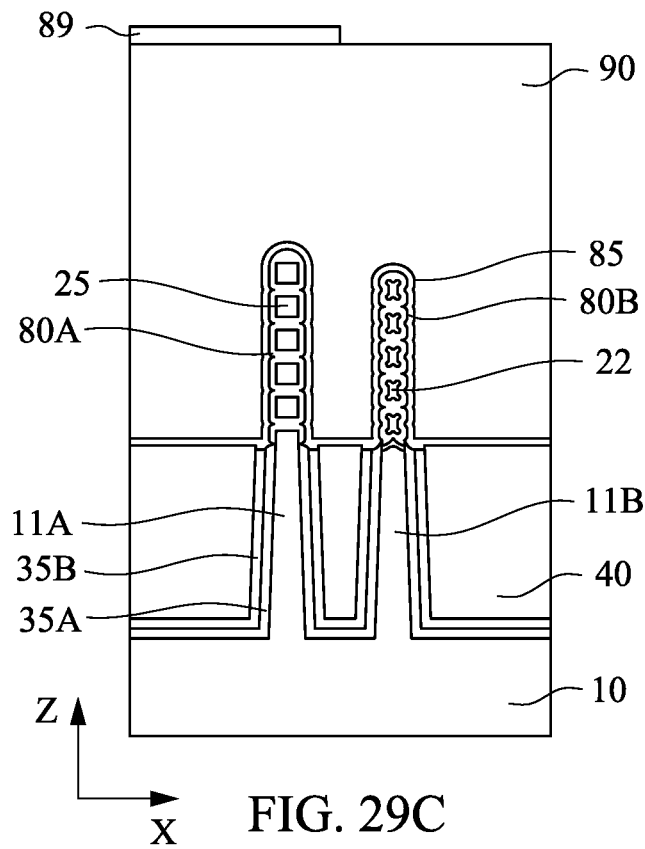
Figure 29D:
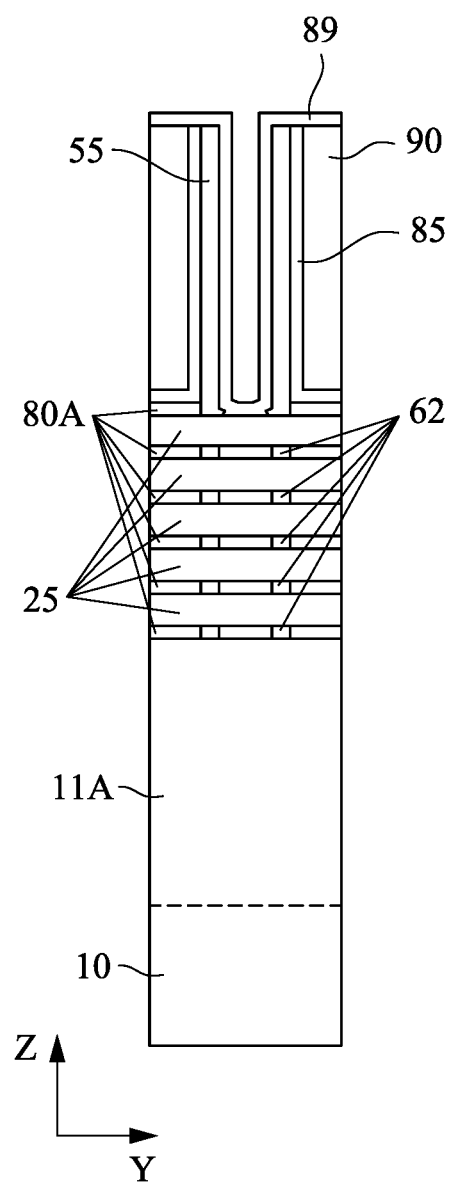
Figure 29E:
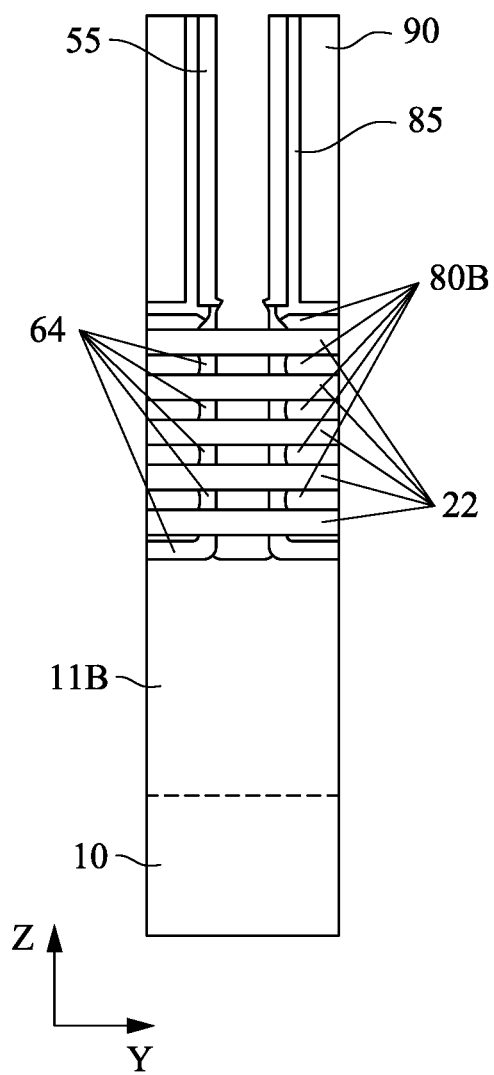
Figure 30A:
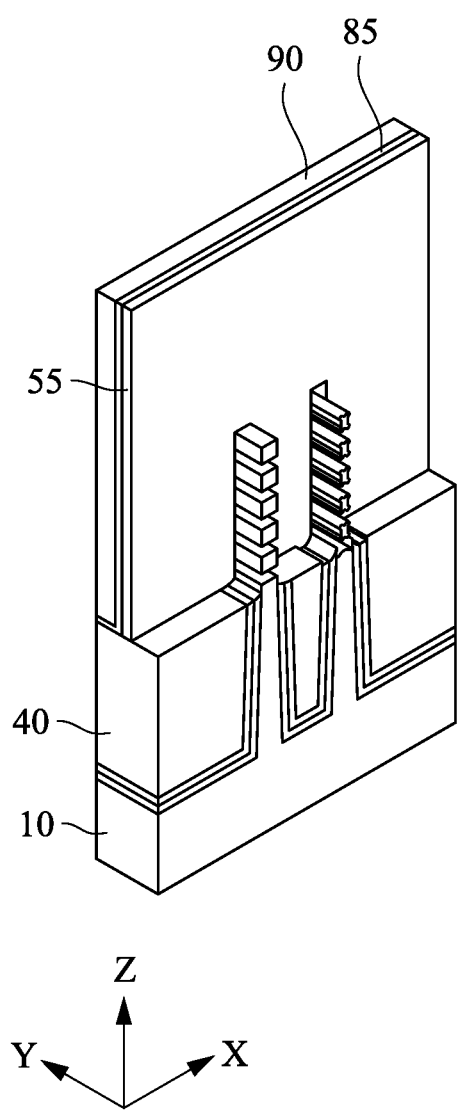
FIGS. 30A, 30B, 30C, 30D and 30E show various views of one of the various stages of a sequential manufacturing process for a GAA FET device according to an embodiment of the present disclosure.
Figure 30B:
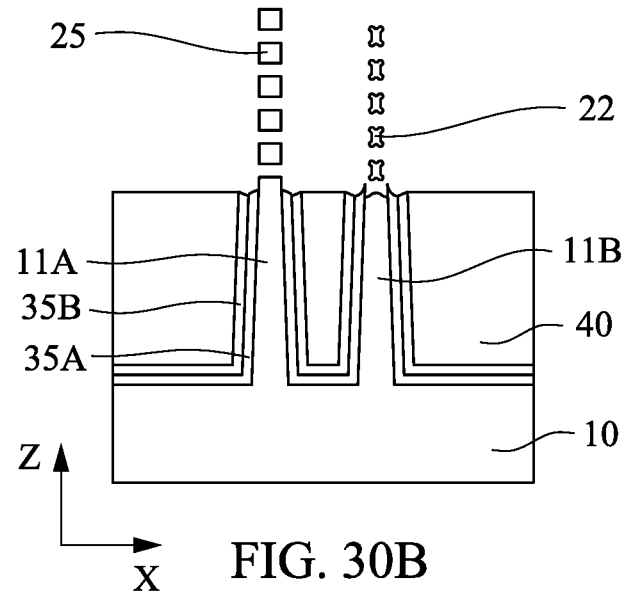
Figure 30C:
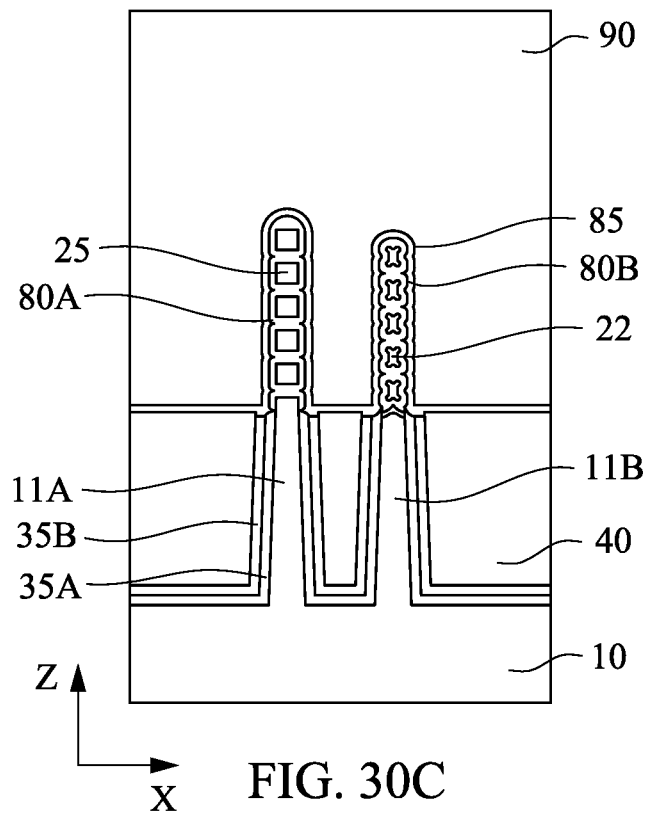
Figure 30D:
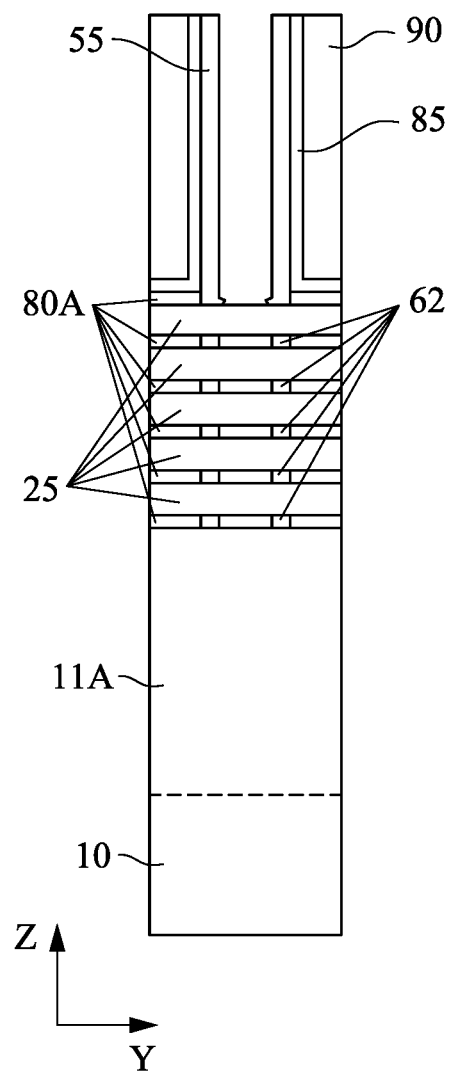
Figure 30E:
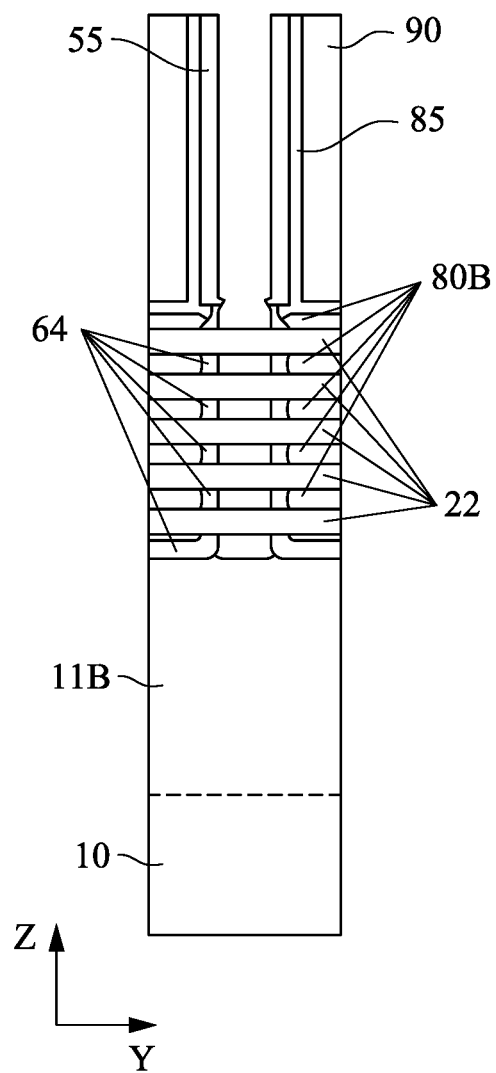
Figure 31A:
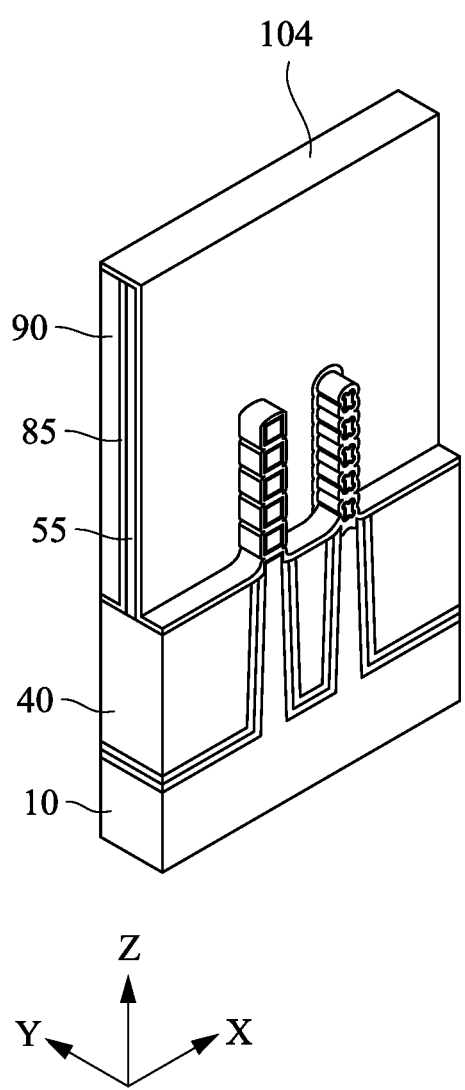
FIGS. 31A, 31B, 31C, 31D and 31E show various views of one of the various stages of a sequential manufacturing process for a GAA FET device according to an embodiment of the present disclosure.
Figure 31B:
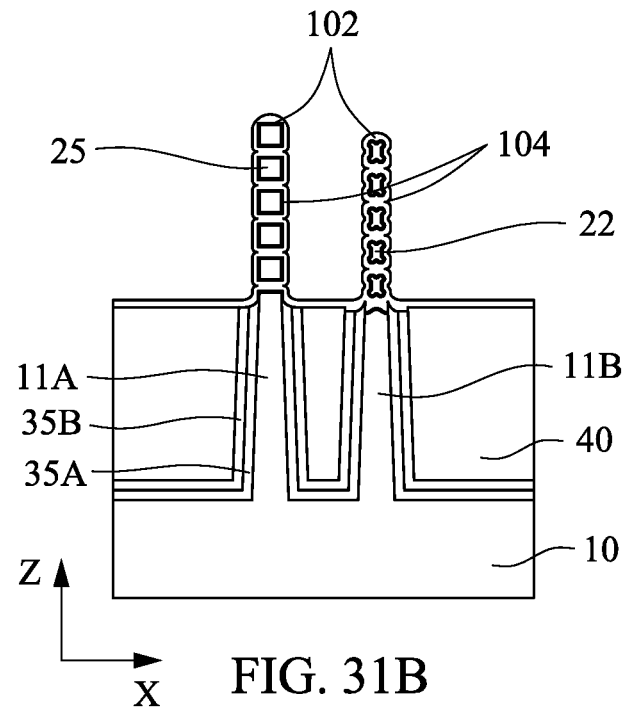
Figure 31C:
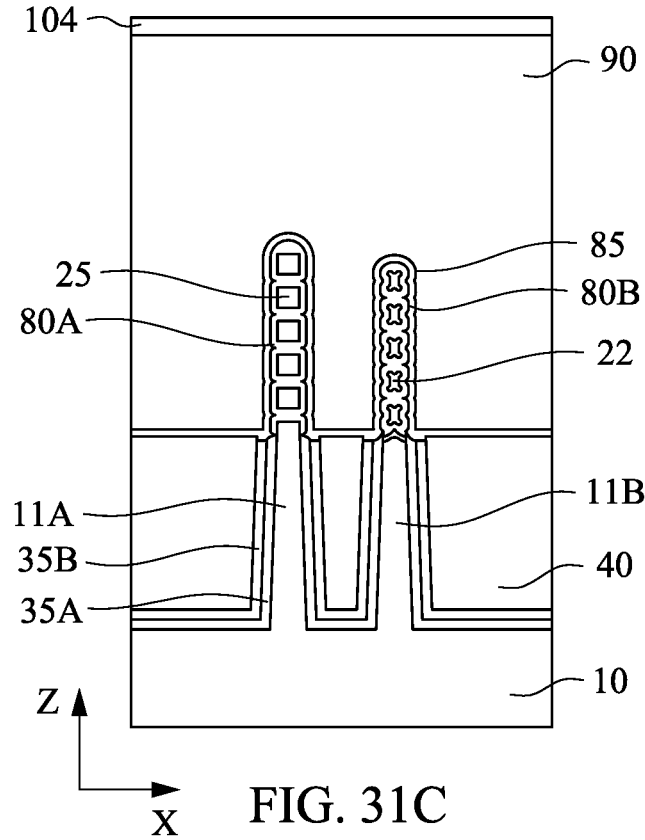
Figure 31D:
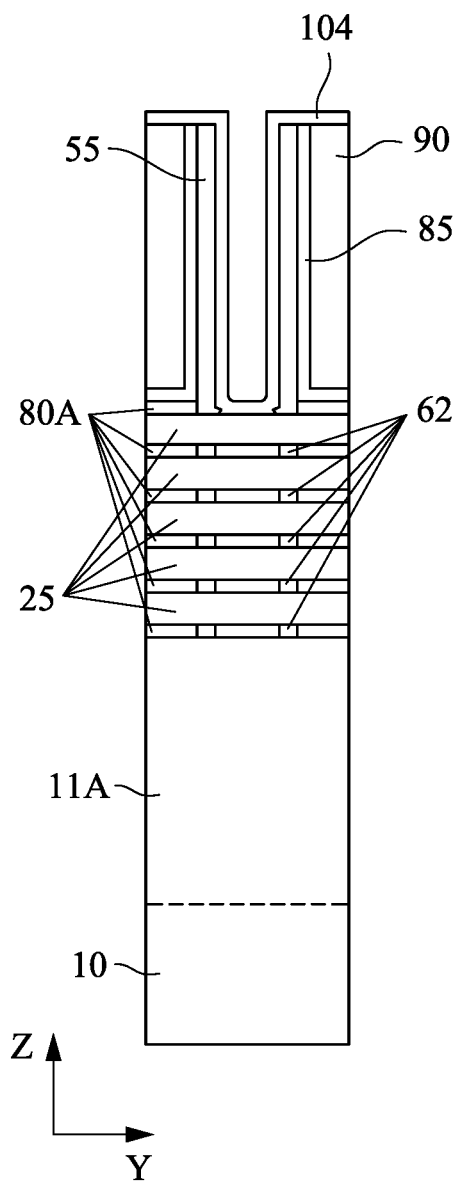
Figure 31E:
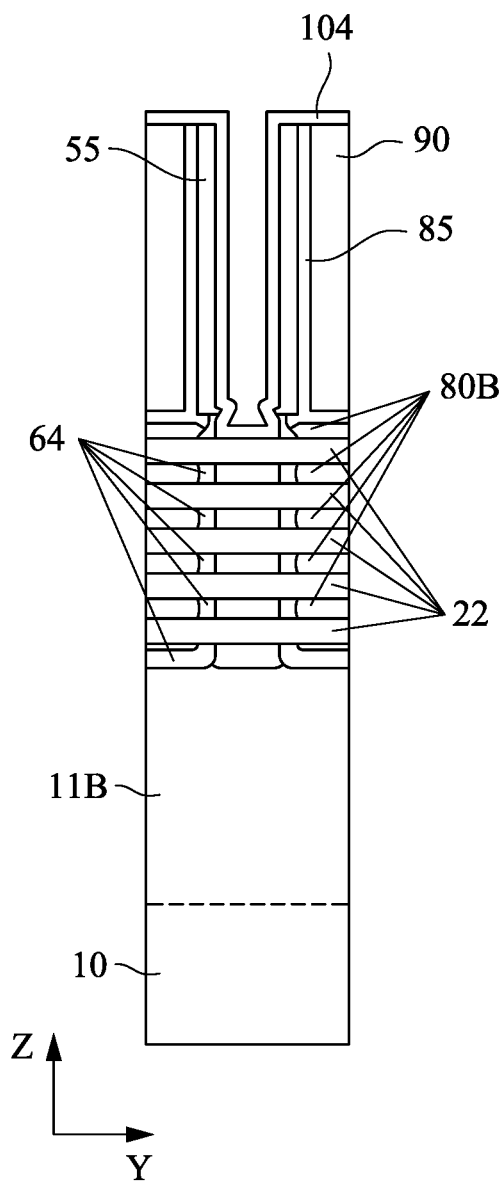

Subsequently, a fourth protective layer 87 is formed to cover the region corresponding to the first fin structure 30A (for the n-channel region) as shown in FIGS. 26A-26E. FIG. 26A is a perspective view exposing the channel region. In some embodiments, the fourth protective layer 87 includes silicon nitride-based material, such as silicon nitride, SiON, SiOCN or SiCN and combinations thereof, formed by a blanket deposition, such as CVD including LPCVD and PECVD, PVD, ALD, or other suitable process. In certain embodiments, the fourth protective layer 87 is made of silicon nitride. After a blanket layer is formed, the fourth protective layer 87 is formed by using one or more lithography and etching operations.

After the fourth protective layer 87 is formed, the first semiconductor layers 20 in the channel region of the first fin structure 30A are removed, thereby forming semiconductor wires of the second semiconductor layers 25, as shown in FIGS. 27A-27E.

The first semiconductor layers 20 can be removed or etched using an etchant that can selectively etch the first semiconductor layers 20. The etching of the first semiconductor layer 20 includes wet etching and/or dry etching. A wet etchant such as an ammonium hydroxide ($NH_4OH$) solution can be used to selectively etch the first semiconductor layers 20.

Then, the fourth protective layer 87 is removed, and a fifth protective layer 89 is formed to cover the region corresponding to the first fin structure 30A (for the n-channel region) as shown in FIGS. 28A-28E. In some embodiments, the fifth protective layer 89 includes silicon nitride-based material, such as silicon nitride, SiON, SiOCN or SiCN and combinations thereof, formed by a blanket deposition, such as CVD including LPCVD and PECVD, PVD, ALD, or other suitable process. In certain embodiments, the fifth protective layer 89 is made of silicon nitride. After a blanket layer is formed, the fifth protective layer 89 is formed by using one or more lithography and etching operations.

After the fifth protective layer 89 is formed, the second semiconductor layers 25 in the channel region of the second fin structure 30B are removed, thereby forming semiconductor wires of the condensed first semiconductor layers 22, as shown in FIGS. 29A-29E.

The second semiconductor layers 25 can be removed or etched using an etchant that can selectively etch the second semiconductor layers 25. The etching of the second semiconductor layers 25 includes wet etching and/or dry etching. A wet etchant such as a TMAH solution can be used to selectively etch the second semiconductor layers 25. Then, the fifth protective layer 89 is removed, as shown in FIGS. 30A-30E.

After the wires of the condensed first semiconductor layers 22 are formed, a gate dielectric layer 104 is formed around the wires of the second semiconductor layer 25 in the first fin structure 30A and the wires of the condensed first semiconductor layer 22 in the second fin structure 30B, as shown in FIGS. 31A-31E. In some embodiments, the gate dielectric layer 104 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, an interfacial layer 102 is formed between the channel layers and the gate dielectric layer 104. The gate dielectric layer 104 may be formed by CVD, ALD or any suitable method. In one embodiment, the gate dielectric layer 104 is formed using a highly conformal deposition process such as ALD in order to ensure the formation of a gate dielectric layer having a uniform thickness around each channel layer. The thickness of the gate dielectric layer 104 is in a range from about 1 nm to about 6 nm in one embodiment.

Further, a gate electrode layer 108 is formed over the gate dielectric layer 104 as shown in FIGS. 32A-32E. The gate electrode layer 108 is formed over the gate dielectric layer 104 to surround each channel layer in some embodiments. The gate electrode 108 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 108 may be formed by CVD, ALD, electro-plating, or other suitable method. The gate electrode layer is also deposited over the upper surface of the ILD layer 90. The gate dielectric layer and the gate electrode layer formed over the ILD layer 90 are then planarized by using, for example, CMP, until the ILD layer 90 is revealed.

In certain embodiments, one or more work function adjustment layers 106 are interposed between the gate dielectric layer 104 and the gate electrode layer 108. The work function adjustment layers 106 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer. The work function adjustment layer 106 may be formed by ALD, PVD, CVD, e-beam evaporation, or other suitable process. Further, the work function adjustment layer 106 may be formed separately for the n-channel FET and the p-channel FET which may use different metal layers.

It is understood that the GAA FETs undergo further CMOS processes to form various features such as contacts/ vias, interconnect metal layers, dielectric layers, passivation layers, etc.

Figure 32A:
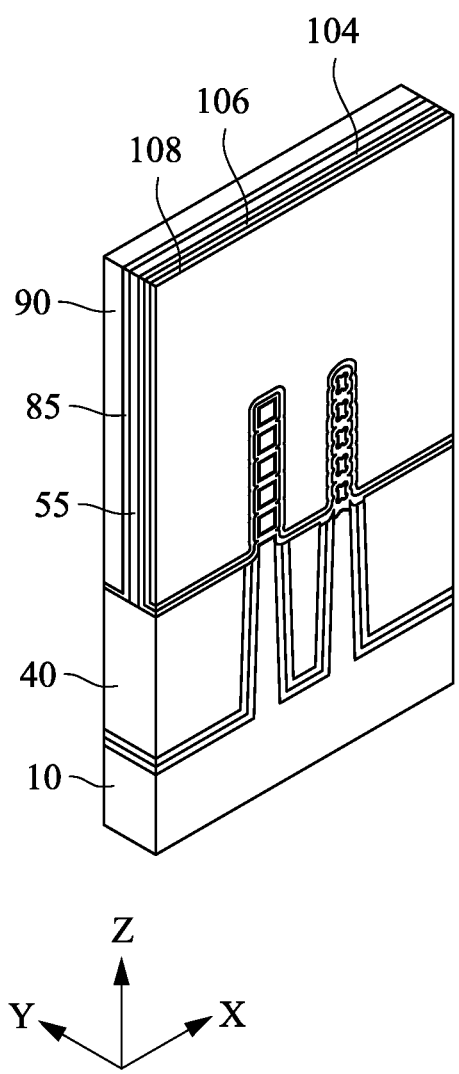
FIGS. 32A, 32B, 32C, 32D and 32E show various views of one of the various stages of a sequential manufacturing process for a GAA FET device according to an embodiment of the present disclosure.
Figure 32B:
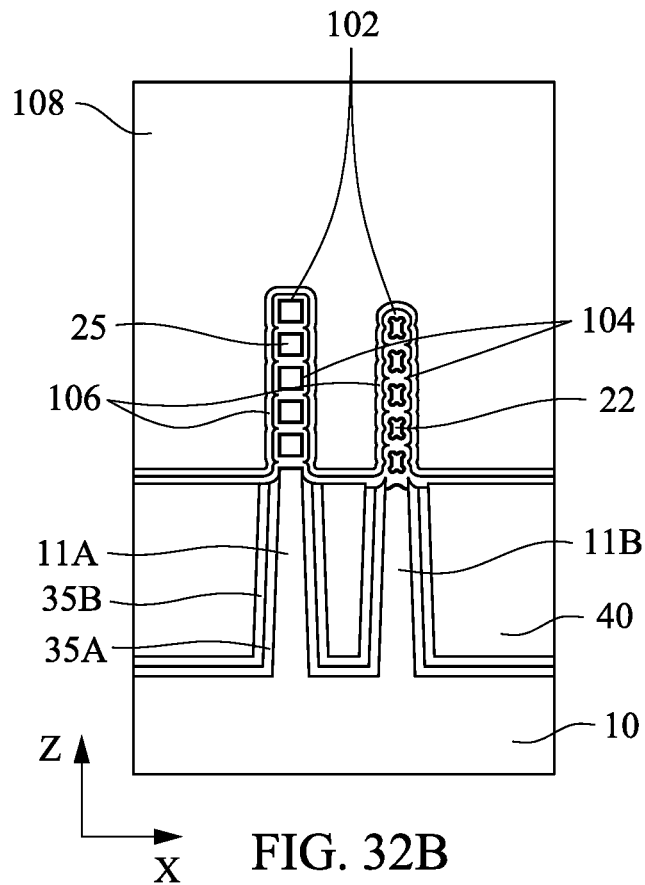
Figure 32C:
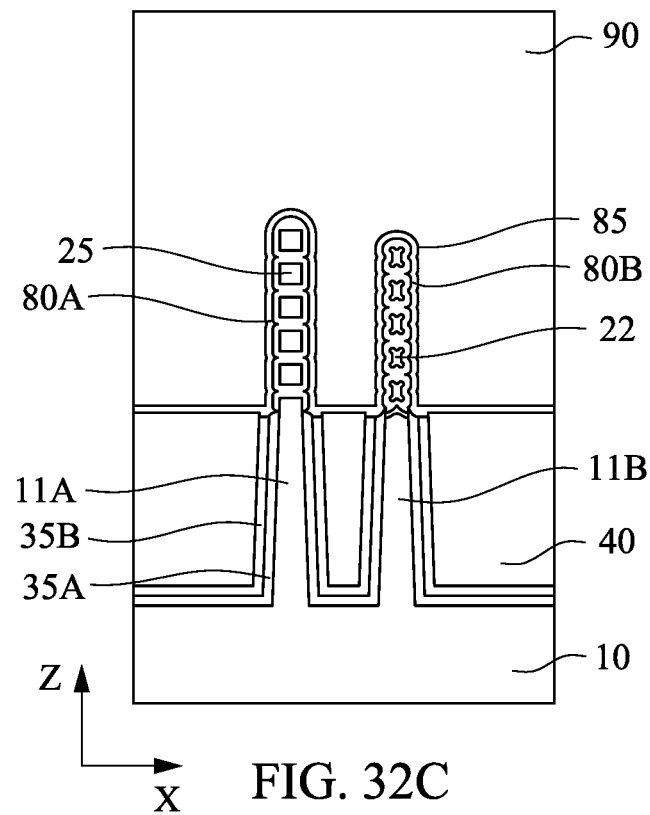
Figure 32D:
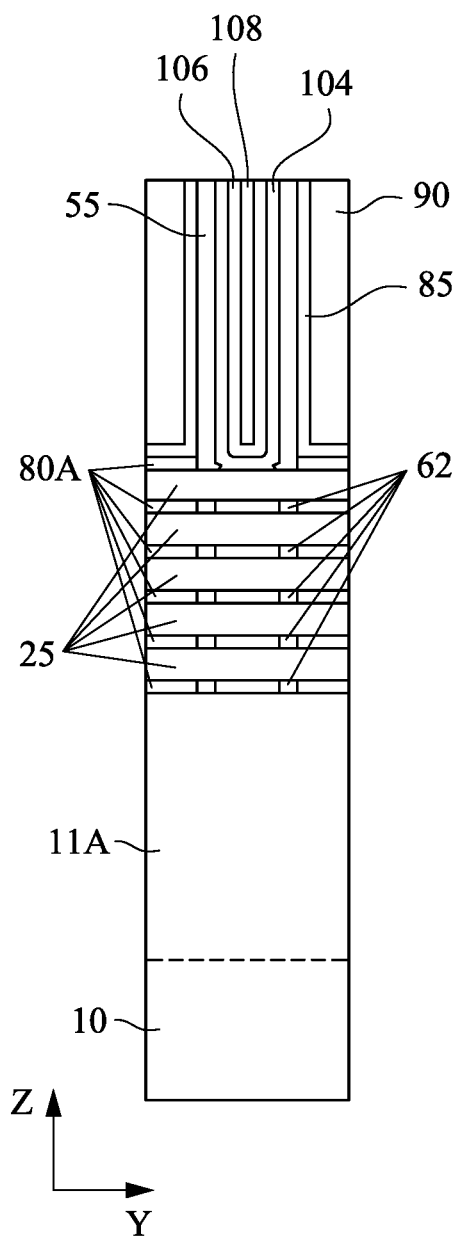
Figure 32E:
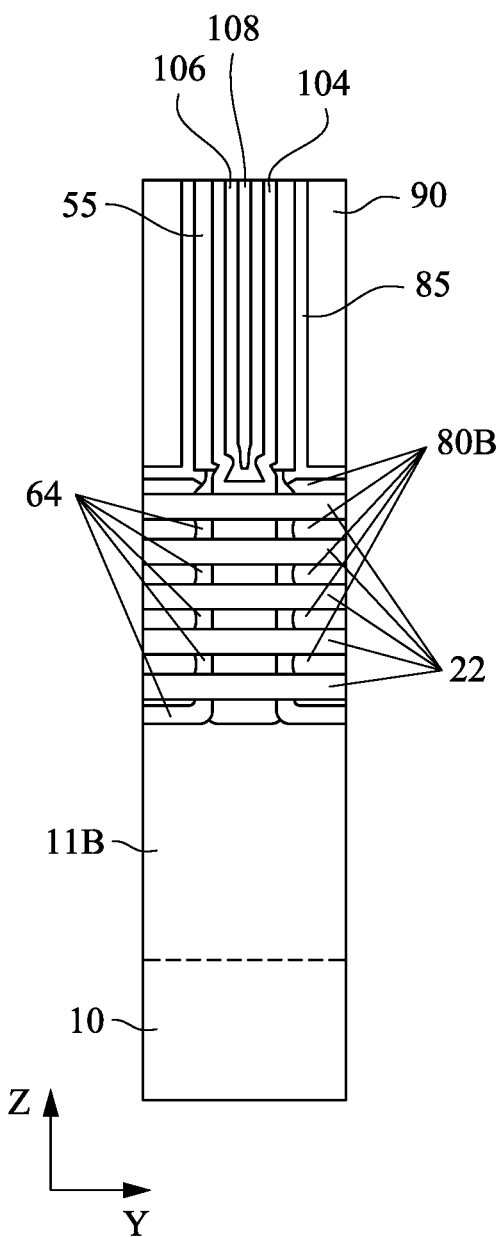
Figure 33A:
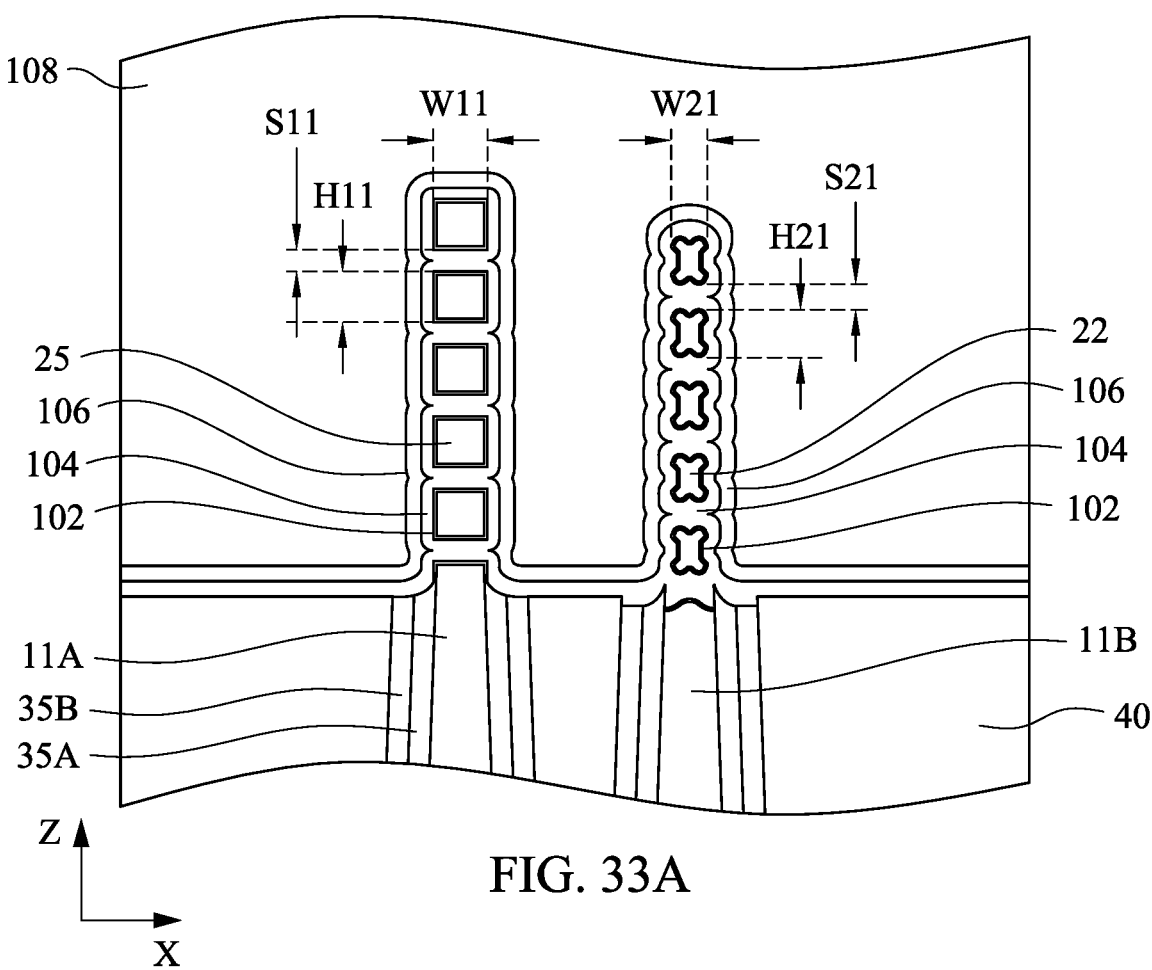
FIGS. 33A, 33B and 33C show various views of a GAA FET device according to embodiments of the present disclosure.

FIG. 33A is an enlarged view of FIG. 32B. An n-channel GAA FET is formed over the first fin structure 30A and a p-channel GAA FET is formed over the second fin structure 30B. Each channel of the n-channel GAA FET (first channel) is made of Si (first semiconductor layer 25) and each channel of the p-channel GAA FET (second channel) is made of SiGe, of which the Ge concentration is increased during manufacturing operations as set forth above (condensed second semiconductor layer 22), in some embodiments. In certain embodiments, the second channels of the p-channel GAA FET are made of $Si_{1-z}Ge_z$, where $0.40 \leq z \leq 0.50$.

In some embodiments, a thickness H11 of the first channel is in a range from about 5 nm to about 10 nm, a space S11 between adjacent channels is in a range from about 5 nm to about 10 nm, and a width W11 is in a range from about 3 nm to about 8 nm. In some embodiments, a thickness H21 of the second channel is in a range from about 5 nm to about 10 nm, a space S21 between adjacent channels is in a range from about 5 nm to about 10 nm, and a width W21 is in a range from about 3 nm to about 8 nm. In certain embodiments, H11≥5 nm≥S11 and H21≥5 nm≥S21. Further, in some embodiments, W11≥W21≥3 nm. In certain embodiments, W21<H21. In certain embodiments, S11<H21 and H11>S21, while S11+H11 is substantially equal to S21+H21. The thickness, width and space are measured at the center of each channel in the X-Y cross section.

Figure 33B:
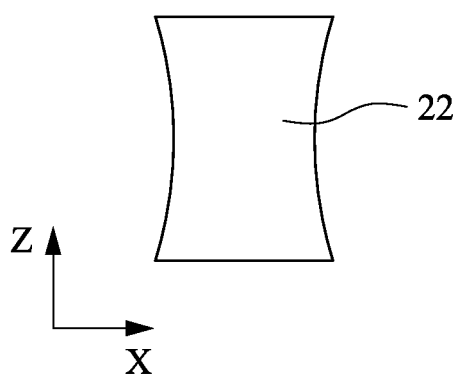
Figure 33C:
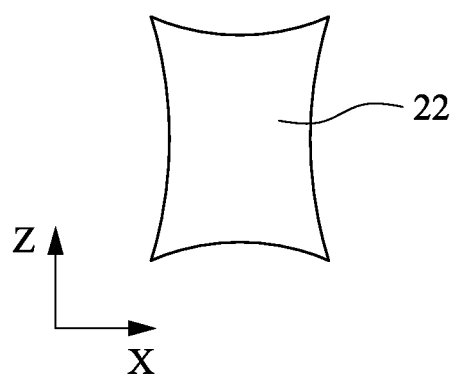

As shown in FIG. 33A, a cross section of the first channels (25) has a rectangular shape with rounded corners in some embodiments. In other embodiments, the cross section of the first channels has an oval shape or a square shape with rounded corners. In some embodiments, a cross section of the second channels (22) has a rectangular shape with rounded corners, an oval shape or a square shape with rounded corners. In other embodiments, as shown in FIGS. 33B and 33C, the cross section of the second channels (22) has a dog-bone shape or a thread-spool (or bobbin) shape. In FIG. 33B, two sides are concave, and in FIG. 33C, four sides are concave. As set forth above, a post thermal annealing process, i.e., a SiGe condensation process, is performed, which increases a Ge concentration within the SiGe layer and also causes Ge out-diffusion into the Si layers for a p-channel FET. The Si bulk layer close to the SiGe interface has Ge contamination, e.g., 20-30% of Ge; the Si surface layer close to the SiGe interface has a higher Ge concentration, e.g., 30-40% of Ge, due to the condensation and out-diffusion effects; and the SiGe bulk layer has the highest Ge concentration, e.g., 40-50%, after the condensation process. The resultant Ge distribution affects the profile of SiGe wire formation. Since an etching rate for the SiGe region with a lower Ge concentration is high, the SiGe wire becomes a dog-bone like shape.

FIGS. 34A-34E show cross sectional views of various GAA FETs according to embodiments of the present disclosure. In FIG. 33A, one gate structure is shared by an n-channel GAA FET and a p-channel GAA FET. In other embodiments, as shown in FIGS. 34A and 34B, separate gate structures 108A and 108B are respectively provided for an n-channel GAA FET and a p-channel GAA FET, while the n-channel GAA FET and the p-channel GAA FET are provided over the same substrate.

Further, in some embodiments, various p-channel FETs as shown in FIGS. 34C-34E are provided on the same substrate together with the GAA FETs shown in FIGS. 32A, 34A and/or 34B. In FIG. 34C, a channel is a semiconductor fin 25A continuously protruding from the bottom fin structure 11. In FIG. 34D, a channel includes a stacked structure of the first semiconductor layers 20 and the second semiconductor layers 25. This structure can be formed by not performing a condensation process and not removing the second semiconductor layers from the channel region. In FIG. 34E, a channel includes a stacked structure of the condensed first semiconductor layers 20 and the second semiconductor layers 25. This structure can be formed by performing a condensation process and not removing the second semiconductor layers from the channel region. The FET shown in FIG. 34C can be an n-type FET.

In some embodiments, GAA FETs shown in FIG. 32A is a CMOS device and is used for a core region of a semiconductor device, which includes FETs formed with the minimum design rules. In some embodiments, FETs shown in FIGS. 34C-34E are used for I/O region of the semiconductor device.

FIGS. 35A-37E show a sequential process for manufacturing a GAA FET device according to another embodiment of the present disclosure. It is understood that additional operations can be provided before, during, and after processes shown by FIGS. 35A-37E, and some of the operations described below can be replaced or eliminated, for additional embodiments of the method. The order of the operations/processes may be interchangeable.

Figure 35A:
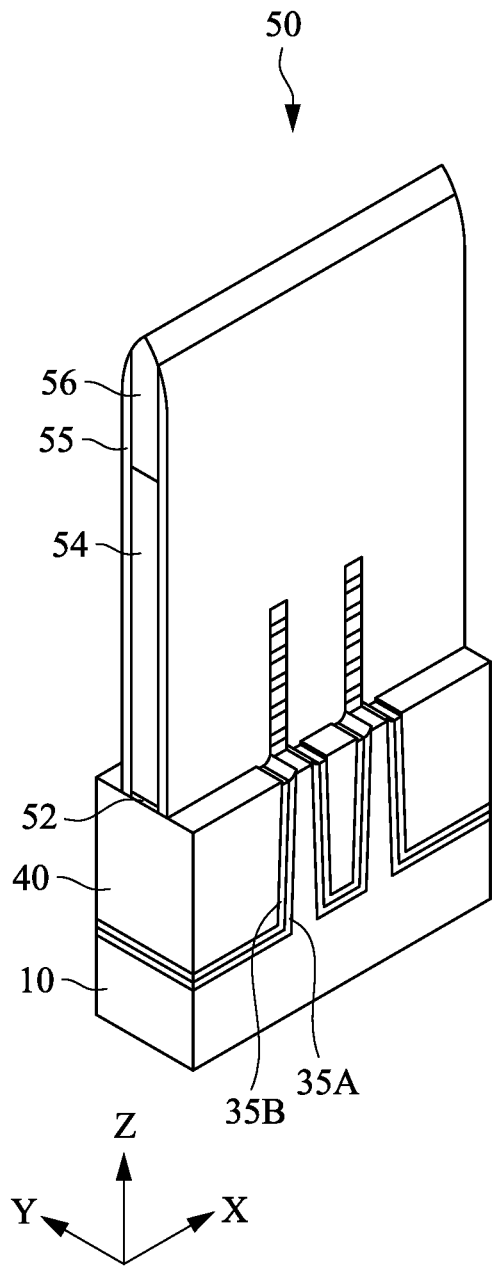
FIGS. 35A, 35B, 35C, 35D and 35E show various views of one of the various stages of a sequential manufacturing process for a GAA FET device according to an embodiment of the present disclosure.
Figure 35B:
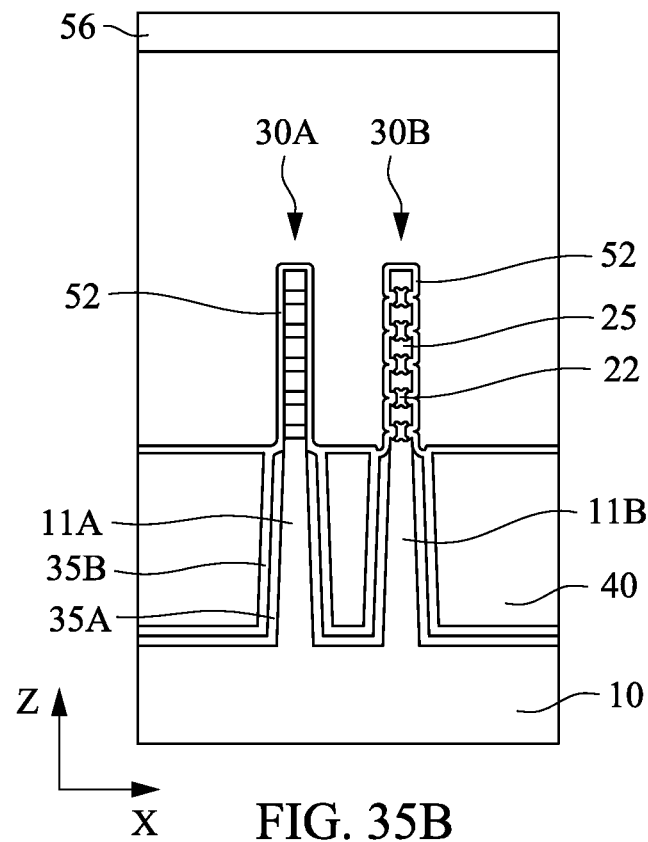
Figure 35C:
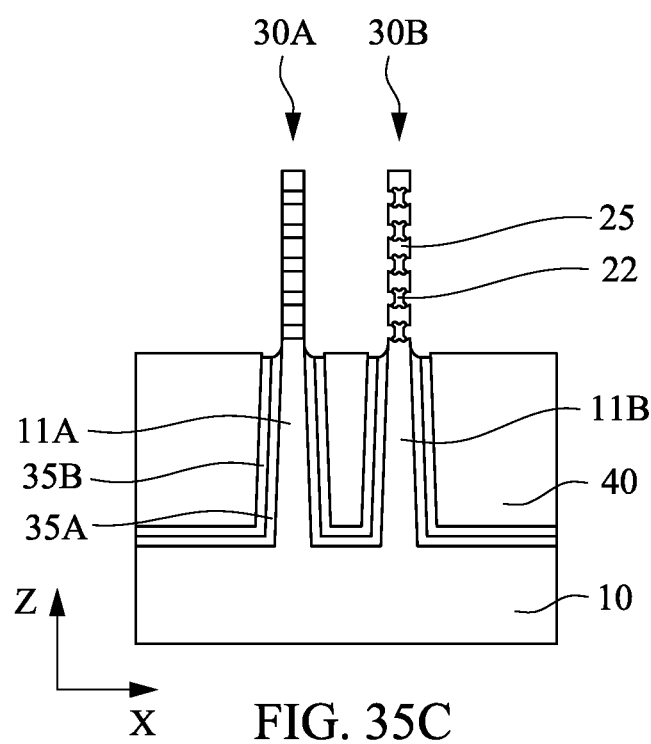
Figure 35D:
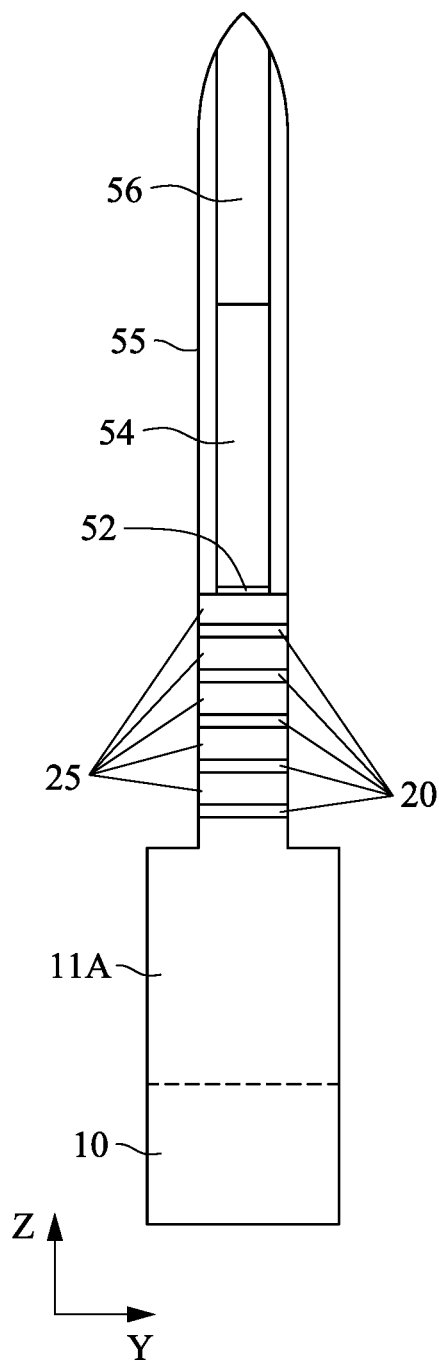
Figure 35E:
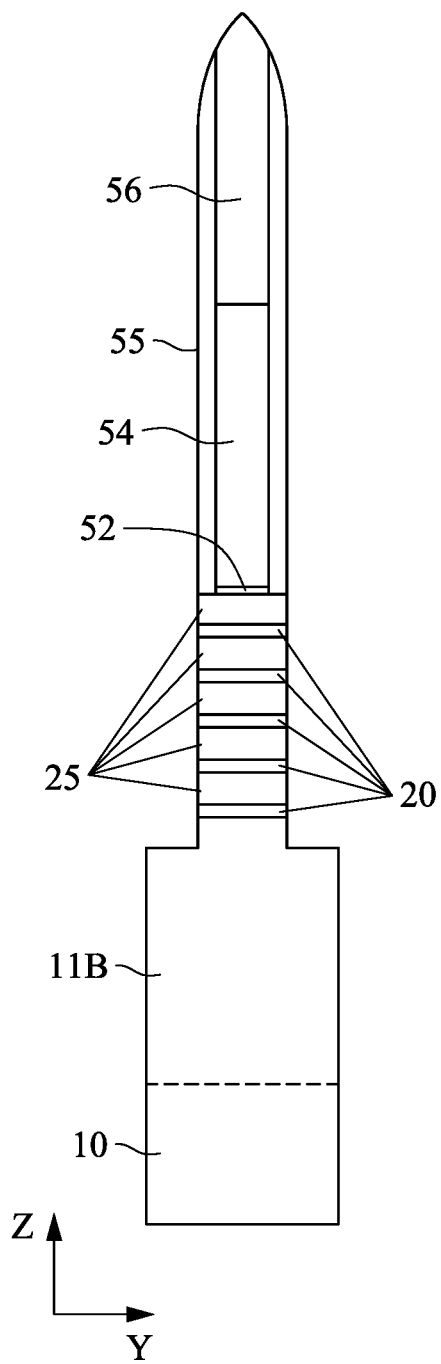
Figure 36A:
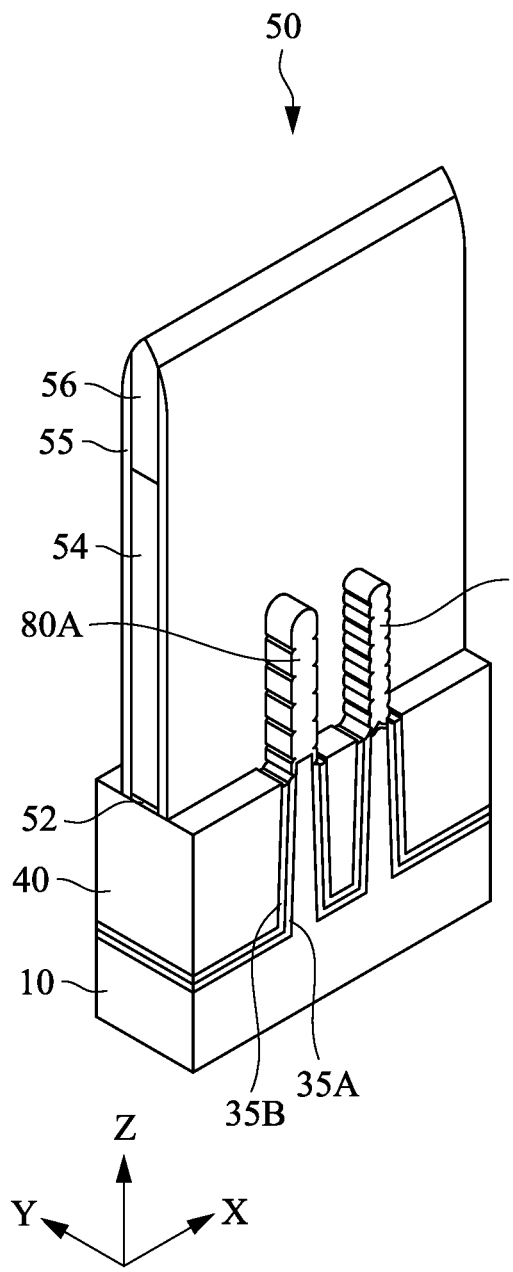
FIGS. 36A, 36B, 36C, 36D and 36E show various views of one of the various stages of a sequential manufacturing process for a GAA FET device according to an embodiment of the present disclosure.
Figure 36B:
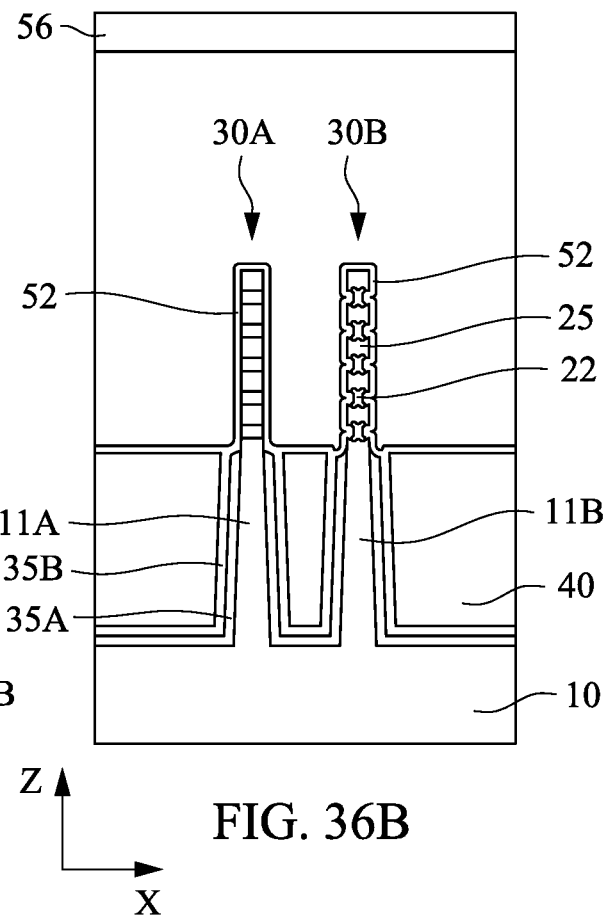
Figure 36C:
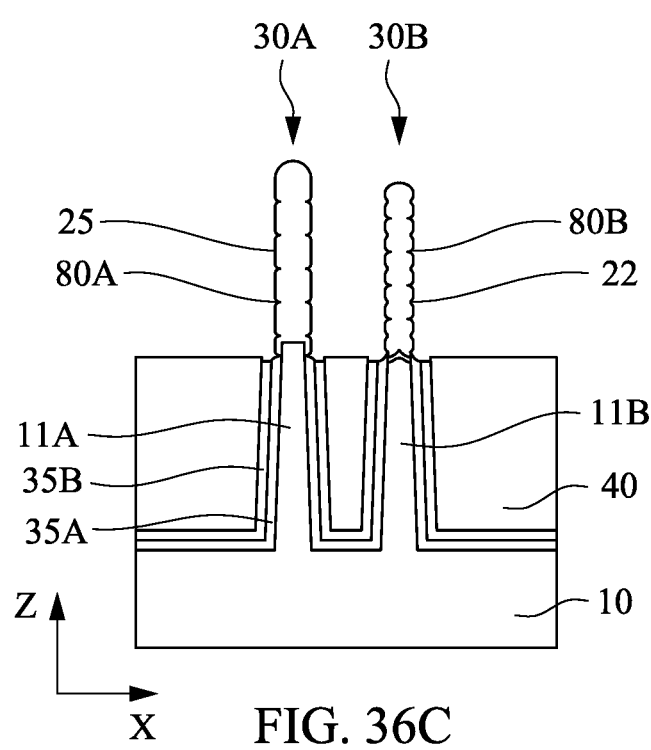
Figure 36D:
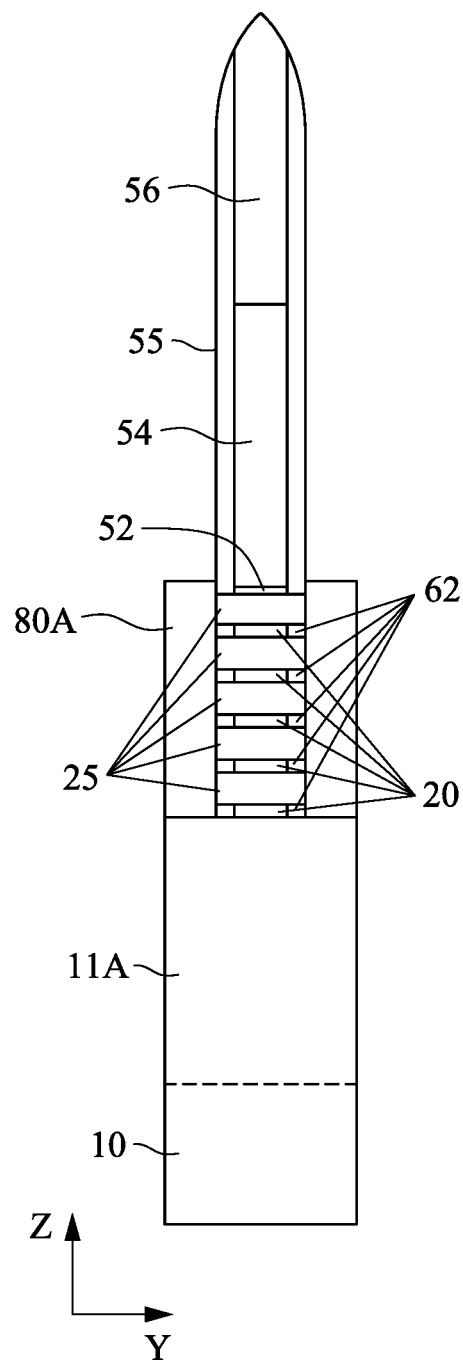
Figure 36E:
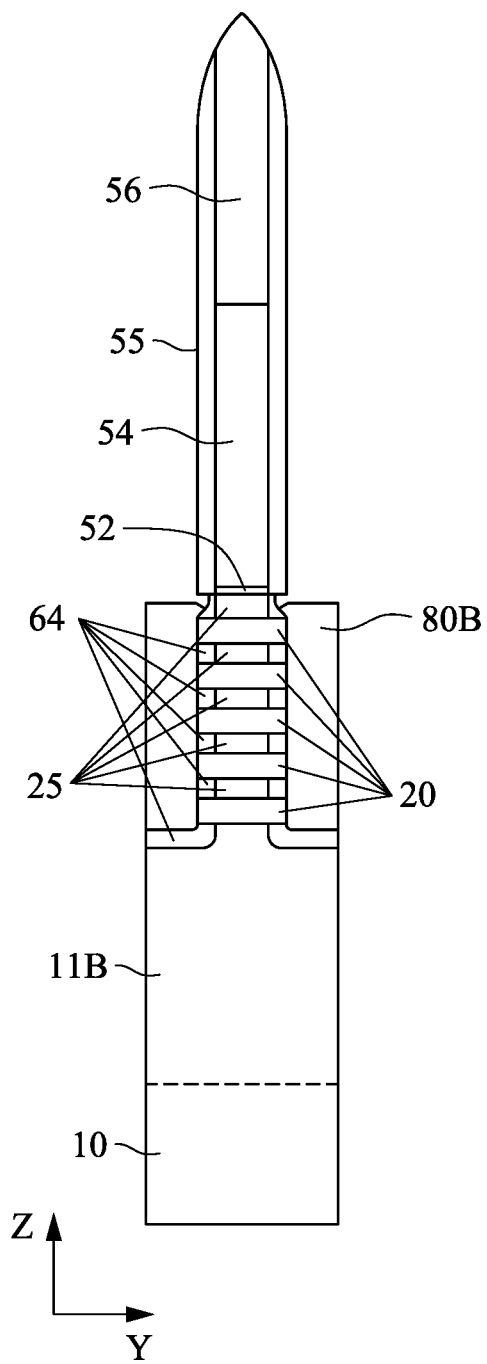
Figure 37A:
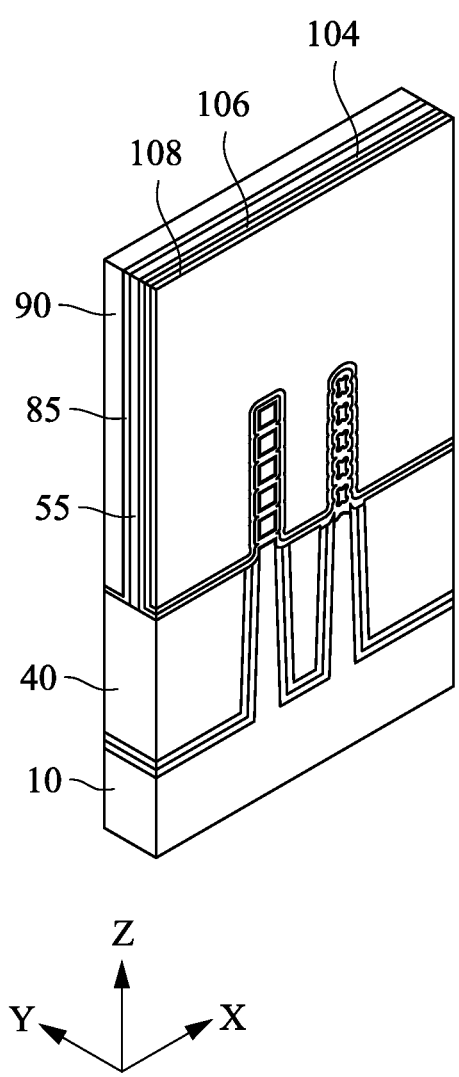
FIGS. 37A, 37B, 37C, 37D and 37E show various views of one of the various stages of a sequential manufacturing process for a GAA FET device according to an embodiment of the present disclosure.
Figure 37B:
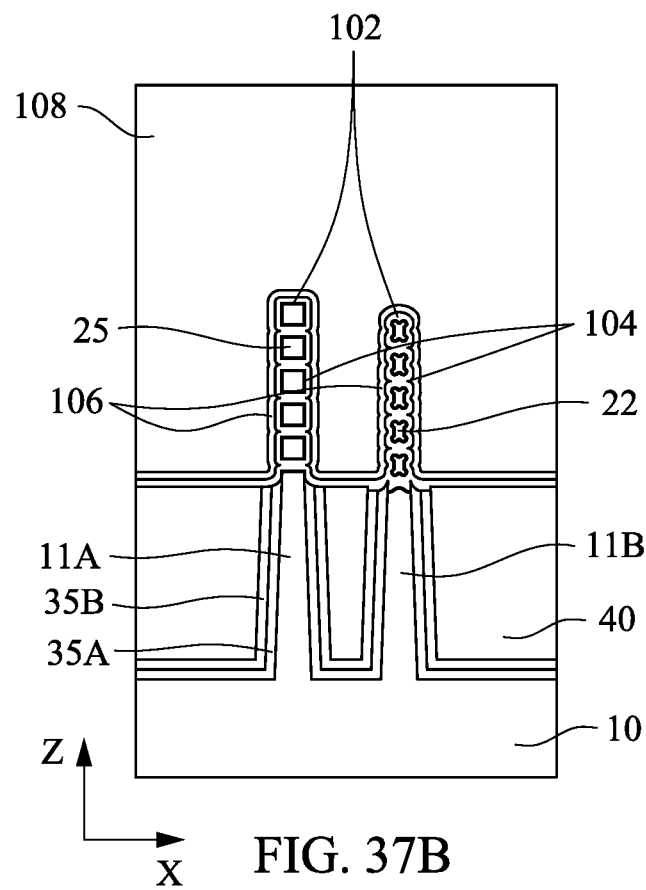
Figure 37C:
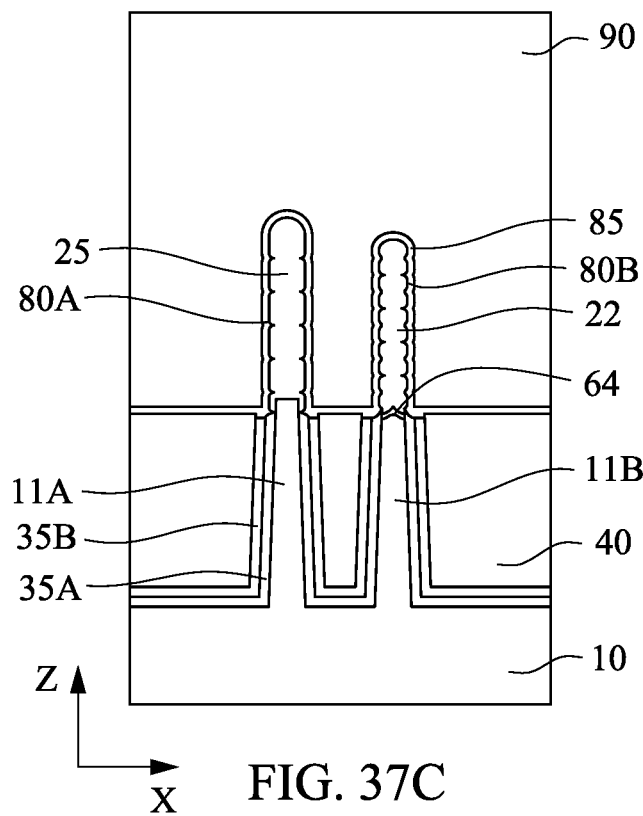
Figure 37D:
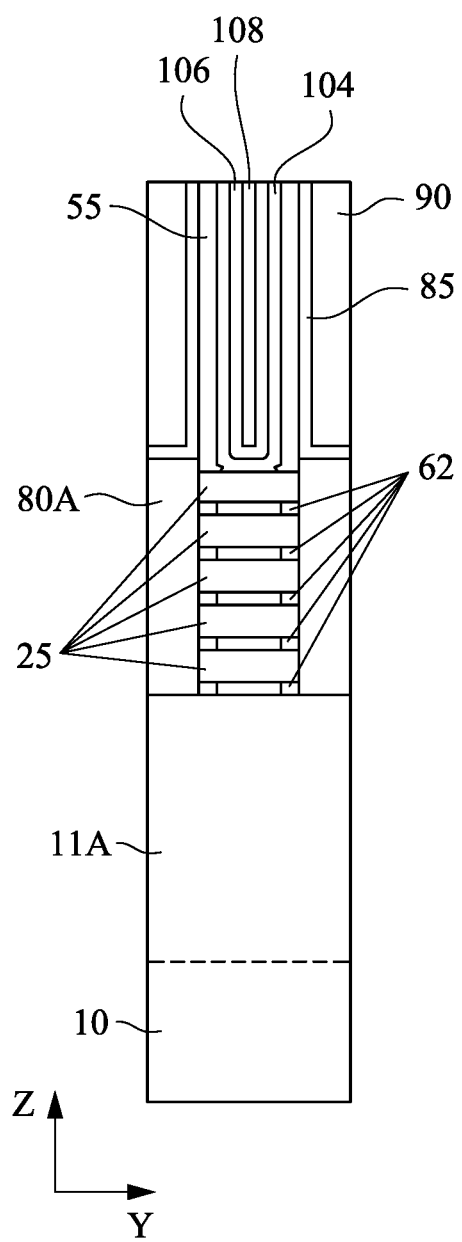
Figure 37E:
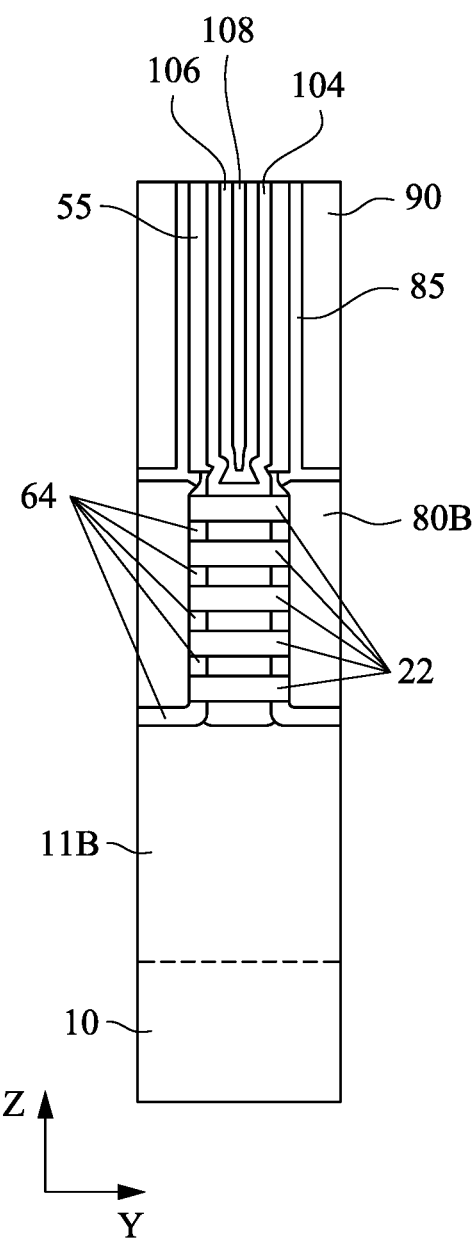

After the structure shown in FIGS. 16A-16E is formed, the S/D regions of the fin structures 30A and 30B are recessed down equal to or below the upper surface of the isolation insulating layer 40, by using dry etching and/or wet etching, as shown in FIGS. 35A-35E. At this stage, end portions of the stacked layer of the first and second semiconductor layers 20, 25 under the sacrificial gate structure have substantially flat faces which are flush with the sidewall spacers 55, as shown in FIGS. 35D and 35E. In some embodiments, the end portions of the stacked layer of the first and second semiconductor layers 20, 25 are slightly horizontally etched.

Subsequently, by using the same as or similar processes to the foregoing embodiments, a first S/D epitaxial layer 80A and a second S/D epitaxial layer 80B are formed as shown in FIGS. 36A-36E. The first S/D epitaxial layer 80A and the second S/D epitaxial layer 80B are separately formed as set forth above.

Then, by using the same as or similar processes to the foregoing embodiments, a gate structure including a gate dielectric layer 104 and a gate electrode layer 108, as shown in FIGS. 37A-37E.

It is understood that the GAA FETs undergoes further CMOS processes to form various features such as contacts/vias, interconnect metal layers, dielectric layers, passivation layers, etc.

The various embodiments or examples described herein offer several advantages over the existing art. For example, in the present disclosure, SiGe layers in a Si/SiGe stacked layer initially have a relatively low Ge concentration to mitigate a lattice mismatch between Si and SiGe. Thus, it is possible to increase a thickness of Si epitaxial layers formed on the SiGe layers. Further, by employing a Ge condensation process to increase the Ge concentration later, it is possible to improve the performances of the SiGe p-channel GAA FET.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure, in which first semiconductor layers containing Ge and second semiconductor layers are alternately stacked, is formed over a bottom fin structure. A Ge concentration in the first semiconductor layers is increased. A sacrificial gate structure is formed over the fin structure. A source/drain epitaxial layer is formed over a source/drain region of the fin structure. The sacrificial gate structure is removed. The second semiconductor layers in a channel region are removed, thereby releasing the first semiconductor layers in which the Ge concentration is increased. A gate structure is formed around the first semiconductor layers in which the Ge concentration is increased. In one or more of the foregoing and the following embodiments, the Ge concentration is increased by oxidizing the first semiconductor layers. In one or more of the foregoing and the following embodiments, the Ge concentration is increased by forming an oxide layer over the fin structure and performing a thermal treatment, thereby oxidizing the first semiconductor layers. In one or more of the foregoing and the following embodiments, the thermal treatment is performed at 800° C. to 1000° C. In one or more of the foregoing and the following embodiments, after the thermal treatment, the oxide layer is removed. In one or more of the foregoing and the following embodiments, the forming the oxide layer, the performing the thermal treatment and the removing the oxide layer are repeated. In one or more of the foregoing and the following embodiments, the first semiconductor layer is made of SiGe, and the Ge concentration of the first semiconductor layers after the Ge concentration is increased is in a range from 45 atomic % to 55 atomic %. In one or more of the foregoing and the following embodiments, the second semiconductor layer is made of Si, and the Ge concentration of the first semiconductor layers before the Ge concentration is increased is in a range from 35 atomic % to 45 atomic %. In one or more of the foregoing and the following embodiments, when the sacrificial gate structure is formed over the fin structure, a width of the first semiconductor layers is smaller than a width of the second semiconductor layers. In one or more of the foregoing and the following embodiments, when the sacrificial gate structure is formed over the fin structure, a width of the first semiconductor layers is smaller than a thickness of the first semiconductor layers.

In accordance with another aspect of the present disclosure, in a method of manufacturing a semiconductor device, a first fin structure and a second fin structure are formed. In each of the first and second fin structures, first semiconductor layers containing Ge and second semiconductor layers are alternately stacked over a bottom fin structure. A Ge concentration in the first semiconductor layers of the second fin structure is increased, while protecting the first fin structure. A sacrificial gate structure is formed over the first and second fin structures. A first source/drain epitaxial layer is formed over a source/drain region of the first fin structure. A second source/drain epitaxial layer is formed over a source/drain region of the second fin structure. The sacrificial gate structure is removed. The first semiconductor layers in a channel region of the first fin structure are removed, thereby releasing the second semiconductor layers. The second semiconductor layers in a channel region of the second fin structure are removed, thereby releasing the first semiconductor layers in which the Ge concentration is increased. A gate structure is formed around the released first semiconductor layers and the released second semiconductor layers. In one or more of the foregoing and the following embodiments, the Ge concentration is increased by oxidizing the first semiconductor layers. In one or more of the foregoing and the following embodiments, the Ge concentration is increased by forming an oxide layer over the second fin structure, and performing a thermal treatment, thereby oxidizing the first semiconductor layers. In one or more of the foregoing and the following embodiments, the thermal treatment is performed at 800° C. to 1000° C. In one or more of the foregoing and the following embodiments, after the thermal treatment, the oxide layer is removed. In one or more of the foregoing and the following embodiments, the forming the oxide layer, the performing the thermal treatment and the removing the oxide layer are repeated. In one or more of the foregoing and the following embodiments, the first semiconductor layer is made of SiGe, and the Ge concentration of the first semiconductor layers after the Ge concentration is increased is in a range from 45 atomic % to 55 atomic %. In one or more of the foregoing and the following embodiments, the second semiconductor layer is made of Si, and the Ge concentration of the first semiconductor layers before the Ge concentration is increased is in a range from 35 atomic % to 45 atomic %.

In accordance with another aspect of the present disclosure, in a method of manufacturing a semiconductor device, a first fin structure and a second fin structure are formed. In each of the first and second fin structures, first semiconductor layers containing Ge and second semiconductor layers are alternately stacked over a bottom fin structure. A Ge concentration in the first semiconductor layers of the second fin structure is increased, while protecting the first fin structure. A sacrificial gate structure is formed over the first and second fin structures. A first source/drain epitaxial layer is formed over a source/drain region of the first fin structure. A second source/drain epitaxial layer is formed over a source/drain region of the second fin structure. The sacrificial gate structure is removed. The first semiconductor layers in a channel region of the first fin structure are removed, thereby releasing the second semiconductor layers. The second semiconductor layers in a channel region of the second fin structure are removed, thereby releasing the first semiconductor layers in which the Ge concentration is increased. A first gate structure is formed around the released first semiconductor layers and a second gate structure is formed around the released second semiconductor layers. In one or more of the foregoing and the following embodiments, the Ge concentration is increased by oxidizing the first semiconductor layers.

In accordance with one aspect of the present disclosure, a semiconductor device includes semiconductor wires vertically arranged, each of which has a channel region, a source/drain epitaxial layer connected to the semiconductor wires, and a gate structure formed around the semiconductor wires. The semiconductor wires are made of $Si_{1-x}Ge_x$, where $0.45 \leq x \leq 0.55$. In one or more of the foregoing and the following embodiments, a width of the semiconductor wires is smaller than a thickness of the semiconductor wires. In one or more of the foregoing and the following embodiments, a thickness of the semiconductor wires is greater than a space between adjacent semiconductor wires. In one or more of the foregoing and the following embodiments, a cross section of the semiconductor wires has a dog-bone shape or a thread-spool shape. In one or more of the foregoing and the following embodiments, the semiconductor device is a p-channel field effect transistor. In one or more of the foregoing and the following embodiments, the source/drain epitaxial layer wraps around source/drain regions of the semiconductor wires. In one or more of the foregoing and the following embodiments, the semiconductor device further includes dielectric inner spacers disposed between the gate structure and the source/drain epitaxial layer. In one or more of the foregoing and the following embodiments, the semiconductor device further includes gate sidewall spacers made of a different material than the dielectric inner spacers. In one or more of the foregoing and the following embodiments, the material of the dielectric inner spacers is silicon nitride. In one or more of the foregoing and the following embodiments, the material of the sidewall spacers is one of SiOC, SiCON and SiCN.

In accordance with another aspect of the present disclosure, a semiconductor device includes an n-channel field effect transistor (FET) and a p-channel FET. The n-channel FET includes first semiconductor wires vertically arranged, each of which has a channel region, and a first source/drain epitaxial layer connected to the first semiconductor wires. The p-channel FET includes second semiconductor wires vertically arranged, each of which has a channel region, and a second source/drain epitaxial layer connected to the second semiconductor wires. The second semiconductor wires are made of $Si_{1-x}Ge_x$, where $0.45 \leq x$, and the first semiconductor wires are made of Si or $Si_{1-y}Ge_y$, where $0 < y \leq 0.2$. In one or more of the foregoing and the following embodiments, the second semiconductor wires are made of $Si_{1-x}Ge_x$, where $0.45 \leq x \leq 0.55$, and the first semiconductor wires are made of Si. In one or more of the foregoing and the following embodiments, a width of the second semiconductor wires is smaller than a width of the first semiconductor wires. In one or more of the foregoing and the following embodiments, a width of the second semiconductor wires is smaller than a thickness of the first semiconductor wires and a thickness of the second semiconductor wires. In one or more of the foregoing and the following embodiments, the first source/drain epitaxial layer wraps around source/drain regions of the first semiconductor wires, and the second source/drain epitaxial layer wraps around source/drain regions of the second semiconductor wires. In one or more of the foregoing and the following embodiments, the first source/drain epitaxial layer is formed on end faces of the first semiconductor wires. In one or more of the foregoing and the following embodiments, a cross section of the second semiconductor wires has a dog-bone shape or a thread-spool shape. In one or more of the foregoing and the following embodiments, a cross section of the first semiconductor wires has one of a rectangular shape with rounded corners and an oval shape. In one or more of the foregoing and the following embodiments, the semiconductor device further includes a gate electrode layer formed around the first semiconductor wires and around the second semiconductor wires.

In accordance with another aspect of the present disclosure, a semiconductor device includes a first p-channel field effect transistor (FET) and a second p-channel FET. The first p-channel FET includes first semiconductor wires vertically arranged, each of which has a channel region, a first source/drain epitaxial layer connected to the first semiconductor wires; and a first gate structure formed around the first semiconductor wires. The second p-channel FET includes second semiconductor wires and third semiconductor wires alternately stacked, each of which has a channel region, a second source/drain epitaxial layer connected to the second and third semiconductor wires, and a second gate structure formed around the second semiconductor wires. The first and second semiconductor wires are made of $Si_{1-x}Ge_x$, where $0.45 \leq x$, and the third semiconductor wires are made of Si or $Si_{1-y}Ge_y$, where $0 < y \leq 0.2$.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
first and second semiconductor wires vertically arranged and alternately stacked, and each having a channel region;
a source/drain epitaxial layer connected to the first and the second semiconductor wires;
a gate structure formed around the first and the second semiconductor wires;
a dielectric inner spacer disposed between the gate structure and the source/drain epitaxial layer; and
a gate sidewall spacer made of a different material than a material of the dielectric inner spacer,
wherein a cross section of the second semiconductor wires has a dog-bone shape or a thread-spool shape.

2. The semiconductor device of claim 1, wherein the first semiconductor wires are made of $Si_{1-x}Ge_x$, where $0.45 \leq x$.

3. The semiconductor device of claim 2, wherein the second semiconductor wires are made of Si or $S_{1-y}Ge_y$, where $0 < y \leq 0.2$.

4. The semiconductor device of claim 1, wherein a width of the first and the second semiconductor wires is smaller than a thickness thereof.

5. The semiconductor device of claim 1, wherein a thickness of the first and the second semiconductor wires is greater than a space between adjacent semiconductor wires.

6. The semiconductor device of claim 1, wherein the semiconductor device is a p-channel field effect transistor.

7. The semiconductor device of claim 1, wherein the source/drain epitaxial layer wraps around source/drain regions of the semiconductor wires.

8. The semiconductor device of claim 1, wherein the material of the gate sidewall spacer is SiOC, SiCON, or SiCN.

9. The semiconductor device of claim 8, wherein the material of the dielectric inner spacer is silicon nitride.

10. A semiconductor device comprising:
an n-channel field effect transistor (FET) comprising:
first semiconductor wires vertically arranged each having a first channel region;
a first source/drain epitaxial layer connected to the first semiconductor wires;
a first gate structure formed around the first semiconductor wires;
a first dielectric inner spacer disposed between the first gate structure and the first source/drain epitaxial layer; and
a first gate sidewall spacer made of a different material than a material of the first dielectric inner spacer; and
a p-channel FET comprising:
second semiconductor wires vertically arranged each having a second channel region;
a second source/drain epitaxial layer connected to the second semiconductor wires;
a second gate structure formed around the second semiconductor wires;
a second dielectric inner spacer disposed between the second gate structure and the second source/drain epitaxial layer; and
a second gate sidewall spacer made of a different material than a material of the second dielectric inner spacer,
wherein a cross section of the second semiconductor wires has a dog-bone shape or a thread-spool shape.

11. The semiconductor device of claim 10, wherein the second semiconductor wires are made of $Si_{1-x}Ge_x$, where $0.45 \leq x$, and wherein the first semiconductor wires are made of Si or $Si_{1-y}Ge_y$, where $0 < y \leq 0.2$.

12. The semiconductor device of claim 10, wherein the second semiconductor wires are made of $Si_{1-x}Ge_x$, where $0.45 \leq x \leq 0.55$, and wherein the first semiconductor wires are made of Si.

13. The semiconductor device of claim 10, wherein a width of the second semiconductor wires is smaller than a width of the first semiconductor wires.

14. The semiconductor device of claim 10, wherein a width of the second semiconductor wires is smaller than a thickness of the first semiconductor wires and a thickness of the second semiconductor wires.

15. The semiconductor device of claim 10, wherein the first source/drain epitaxial layer wraps around source/drain regions of the first semiconductor wires.

16. The semiconductor device of claim 10, wherein the second source/drain epitaxial layer wraps around source/drain regions of the second semiconductor wires.

17. The semiconductor device of claim 10, wherein the first source/drain epitaxial layer is formed on end faces of the first semiconductor wires.

18. A semiconductor device, comprising:
a first p-channel field effect transistor (FET) comprising:
first semiconductor wires vertically arranged each having a channel region;
a first source/drain epitaxial layer connected to the first semiconductor wires;
a first gate structure formed around the first semiconductor wires; and
a first dielectric inner spacer disposed between the first gate structure and the first source/drain epitaxial layer; and
a first gate sidewall spacer made of a different material than a material of the first dielectric inner spacer; and
a second p-channel FET comprising:
second and third semiconductor wires alternately stacked each having a channel region;
a second source/drain epitaxial layer connected to the second and the third semiconductor wires;
a second gate structure formed around the second and the third semiconductor wires;
a second dielectric inner spacer disposed between the second gate structure and the second source/drain epitaxial layer; and
a second gate sidewall spacer made of a different material than a material of the second dielectric inner spacer,
wherein a cross section of the third semiconductor wires has a dog-bone shape or a thread-spool shape.

19. The semiconductor device of claim 18, wherein the first semiconductor wires are made of $Si_{1-x}Ge_x$, where $0.45 \leq x$, and wherein the second semiconductor wires are made of Si or $Si_{1-y}Ge_y$, where $0 < y \leq 0.2$.

20. The semiconductor device of claim 18, wherein the first and the second dielectric inner spacers are made of silicon nitride.

* * * * *